(12) United States Patent
Hano et al.

(10) Patent No.: US 11,323,042 B2
(45) Date of Patent: May 3, 2022

(54) POWER CONVERSION DEVICE

(71) Applicant: TOSHIBA MITSUBISHI-ELECTRIC INDUSTRIAL SYSTEMS CORPORATION, Chuo-ku (JP)

(72) Inventors: Mitsuru Hano, Tokyo (JP); Kenji Uetani, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 183 days.

(21) Appl. No.: 16/764,298

(22) PCT Filed: Nov. 20, 2017

(86) PCT No.: PCT/JP2017/041627
§ 371 (c)(1),
(2) Date: May 14, 2020

(87) PCT Pub. No.: WO2019/097712
PCT Pub. Date: May 23, 2019

(65) Prior Publication Data
US 2020/0350830 A1    Nov. 5, 2020

(51) Int. Cl.
*H02M 7/00* (2006.01)
*H01G 4/38* (2006.01)
(Continued)

(52) U.S. Cl.
CPC .............. *H02M 7/003* (2013.01); *H01G 4/38* (2013.01); *H02M 5/458* (2013.01); *H02M 7/537* (2013.01); *H05K 7/1432* (2013.01); *H05K 7/209* (2013.01)

(58) Field of Classification Search
CPC .... H02M 7/003; H02M 7/537; H02M 7/1432; H02M 5/458; H01G 4/38; H05K 7/209
(Continued)

(56) References Cited

U.S. PATENT DOCUMENTS 11,038,436 B2 *  6/2021  Ahn ..................... H02M 7/483
2011/0261600 A1 * 10/2011  Tachibana ............ H05K 7/1432
                                                          363/131
(Continued)

FOREIGN PATENT DOCUMENTS

JP        8-47268 A     2/1996
JP     2000-69766 A     3/2000
(Continued)

OTHER PUBLICATIONS

International Search Report dated Dec. 12, 2017 in PCT/JP2017/041627 filed on Nov. 20, 2017, 2 pages.

*Primary Examiner* — Yemane Mehari
(74) *Attorney, Agent, or Firm* — Oblon, McClelland, Maier & Neustadt, L.L.P.

(57) ABSTRACT

A power conversion device according to an embodiment includes an element unit and a capacitor unit. The element unit includes a first positive electrode bus, a first negative electrode bus, and a first outer frame member. The capacitor unit includes a second positive electrode bus, a second negative electrode bus, and a second outer frame member. The first outer frame member and the second outer frame member are separable from each other. The first positive electrode bus and the second positive electrode bus are removably connected to each other. The first negative electrode bus and the second negative electrode bus are removably connected to each other.

18 Claims, 27 Drawing Sheets

(51) Int. Cl.
  *H02M 5/458*   (2006.01)
  *H02M 7/537*   (2006.01)
  *H05K 7/14*    (2006.01)
  *H05K 7/20*    (2006.01)
(58) Field of Classification Search
  USPC .......................................................... 363/141
  See application file for complete search history.

(56) References Cited

U.S. PATENT DOCUMENTS

| | | | | |
|---|---|---|---|---|
| 2018/0183349 | A1* | 6/2018 | Kadota | H02M 7/003 |
| 2020/0350830 | A1* | 11/2020 | Hano | H02M 7/487 |
| 2020/0382014 | A1* | 12/2020 | Abe | H02M 7/5387 |
| 2021/0135598 | A1* | 5/2021 | Nakashima | H02M 7/5387 |

FOREIGN PATENT DOCUMENTS

| | | |
|---|---|---|
| JP | 2007-11 6861 A | 5/2007 |
| JP | 2010-74903 A | 4/2010 |
| JP | 2013-196893 A | 9/2013 |
| JP | 2015-133875 A | 7/2015 |
| JP | 2016-10185 A | 1/2016 |
| JP | 2016-100988 A | 5/2016 |
| WO | WO 2010/052788 A1 | 5/2010 |
| WO | WO 2016/027557 A1 | 2/2016 |

* cited by examiner

POWER CONVERSION DEVICE

TECHNICAL FIELD

Embodiments of the present invention relates to a power conversion device.

BACKGROUND ART

A power conversion device such as a converter or an inverter includes a plurality of switching elements, a plurality of diodes electrically connected in inverse parallel to the plurality of switching elements, and a plurality of capacitors. The plurality of switching elements, the plurality of diodes, and the plurality of capacitors are integrated as one unit and cannot be easily separated.

Incidentally, for example, when a power conversion device is continuously used in an environment with a large load, a switching element may break down. On the other hand, a capacitor is less likely to break down than a switching element. However, in a constitution in which a plurality of switching elements and a plurality of capacitors are integrated, when a switching element breaks down, replacement may be necessary for each unit including a capacitor.

CITATION LIST

Patent Literature

[Patent Literature 1]
Japanese Unexamined Patent Application, First Publication No. 2016-100988

SUMMARY OF INVENTION

Technical Problem

An object of the present invention is to provide a power conversion device which is able to reduce a repair burden.

Solution to Problem

A power conversion device of an embodiment includes an element unit and a capacitor unit. The element unit includes a plurality of switching elements electrically connected to each other in series, a plurality of diodes electrically connected in inverse parallel to the plurality of switching elements, respectively, a first positive electrode bus electrically connected to a switching element located at a first end in an electrical connection relationship among the plurality of switching elements, a first negative electrode bus electrically connected to a switching element located at a second end on a side opposite to the first end in the electrical connection relationship among the plurality of switching elements, and a first outer frame member which accommodates the plurality of switching elements, the plurality of diodes, the first positive electrode bus, and the first negative electrode bus. The capacitor unit includes a plurality of capacitors, a second positive electrode bus electrically connected to at least one capacitor included in the plurality of capacitors, a second negative electrode bus electrically connected to at least one capacitor included in the plurality of capacitors, and a second outer frame member which accommodates the plurality of capacitors, the second positive electrode bus, and the second negative electrode bus. The first outer frame member and the second outer frame member are separable from each other. The first positive electrode bus and the second positive electrode bus are removably connected. The first negative electrode bus and the second negative electrode bus are removably connected.

DESCRIPTION OF EMBODIMENTS

Figure 1:
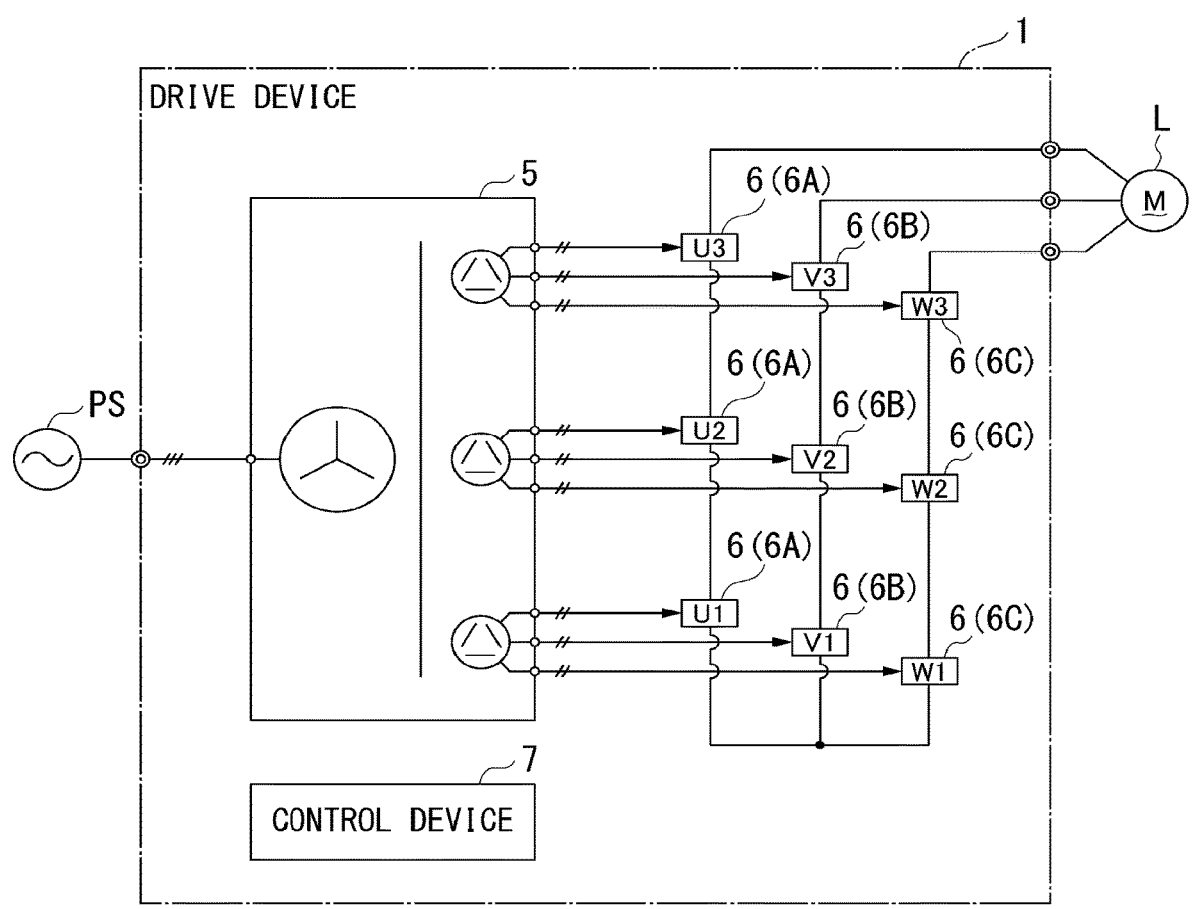
FIG. 1 is a diagram showing an example of a drive device according to an embodiment.

Hereinafter, a power conversion device of an embodiment is described with reference to drawings. In the following description, constituents having the same or similar functions are designated by the same reference numerals. Additionally, redundant description of such constituents may be omitted. In the drawings referred to below, illustration of a gate wiring for control, or the like may be omitted for convenience of explanation.

Here, a "positive electrode P", a "negative electrode N", and a "neutral point C" are defined first. The "positive electrode P" means a portion which reaches a positive potential when a drive device 1 is operated. The "negative electrode N" means a portion which reaches negative potential when the drive device 1 is operated. The "neutral point C" means a portion which reaches an intermediate potential (a neutral point potential) between the positive electrode P and the negative electrode N in the neutral point clamp type (NPC type) drive device 1 when the drive device 1 is operated.

The drive device (an electric motor drive device) 1 according to an embodiment will be described with reference to FIGS. 1 to 28. The drive device 1 is an example of the "power conversion device." However, the "power conversion device" may mean a single-phase cell unit 6 included in the drive device 1 or may be a power conversion device having only one function of a converter or an inverter.

For example, the drive device 1 converts AC power supplied from an AC power source PS into DC power, converts the converted DC power into AC power having a desired frequency and voltage and then supplies the AC power to a load L. The load L is, for example, an electric motor but is not limited thereto. In the embodiment, an example in which the drive device 1 includes a plurality of single-phase cell units 6 will be described. Also, the drive device 1 may include a three-phase converter and a three-phase inverter instead of the plurality of single-phase cell units 6.

<1. Electrical Constitution>

<1.1 Overall Constitution>

First, an overall electrical constitution of the drive device 1 will be described. FIG. 1 is a diagram illustrating an example of the drive device 1. In FIG. 1, an electric circuit system is indicated by a single line, and illustration of switches and the like is omitted. The drive device 1 includes, for example, an input transformer 5, a plurality of single-phase cell units 6, and a control device 7.

AC power is supplied from the AC power source PS to the input transformer 5. The input transformer 5 transforms the AC power supplied from the AC power source PS to a desired voltage and supplies the transformed AC power to each of the plurality of single-phase cell units 6. A secondary side of the input transformer 5 is an open delta connection.

Each of the single-phase cell units 6 converts AC power of two phases supplied from a secondary winding of the input transformer 5 into DC power, converts the converted DC power into AC power having a desired frequency and voltage and then outputs the AC power. In the embodiment, the plurality of single-phase cell units 6 include a plurality of first cell units 6A, a plurality of second cell units 6B, and a plurality of third cell units 6C.

A first phase (for example, an R phase) and a second phase (for example, an S phase) of AC power are input from the input transformer 5 to the first cell units 6A. The first cell units 6A output the first phase (for example, a U phase) and the second phase (for example, a V phase) of the AC power to the load L as AC power after conversion. The second phase (for example, the S phase) and a third phase (for example, a T phase) of AC power are input from the input transformer 5 to the second cell units 6B. The second cell units 6B output the second phase (for example, the V phase) and the third phase (for example, a W phase) of the AC power to the load L as the AC power after conversion. The third phase (for example, the T phase) and the first phase (for example, the R phase) of AC power are input from the input transformer 5 to the third cell units 6C. The third cell units 6C output the third phase (for example, the W phase) and the first phase (for example, the U phase) of the AC power to the load L as the AC power after conversion.

In the embodiment, the plurality of first cell units 6A are electrically connected to each other in series. The plurality of second cell units 6B are electrically connected to each other in series. The plurality of third cell units 6C are electrically connected to each other in series. Thus, the drive device 1 can supply a large amount of AC power to the load L.

The control device 7 controls the plurality of single-phase cell units 6. For example, the control device 7 controls each of the single-phase cell units 6 by transmitting signals for controlling switching elements included in each of the single-phase cell units 6 based on information indicating a phase voltage of the AC power detected by a voltage detector (not shown).

<1.2 Single-Phase Cell Unit>

<1.2.1 Overall Constitution of Single-Phase Cell Unit>

Next, the single-phase cell unit 6 will be described. Here, the first cell unit 6A, the second cell unit 6B, and the third cell unit 6C are substantially the same except that the phases of the AC power are different. Therefore, hereinafter, the first cell unit 6A will be described representatively.

Figure 2:
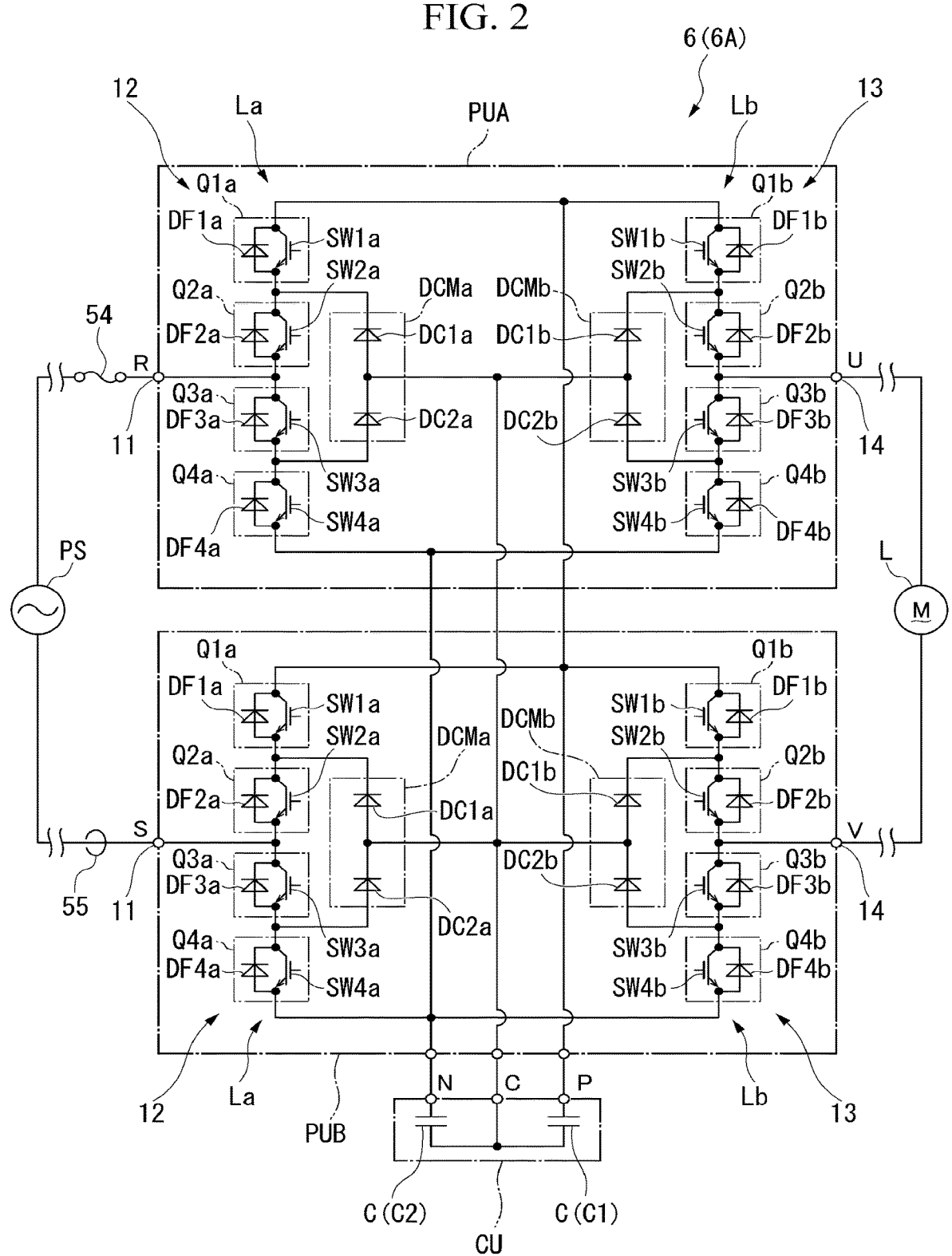
FIG. 2 is a diagram showing a first cell unit of the embodiment.

FIG. 2 is a diagram showing the first cell unit 6A. The first cell unit GA includes, for example, a first power conversion unit PUA, a second power conversion unit PUB, a capacitor unit CU, a fuse 54, and a Hall current detector 55 (hereinafter, referred to as an HCT 55). The fuse 54 and the HCT 55 will be described later.

<1.2.2 Power Conversion Unit>

The first power conversion unit PUA converts the first phase (for example, the R phase) of AC power input from the input transformer 5 and outputs the first phase (for example, U phase) of the AC power after conversion. The first power conversion unit PUA includes, for example, a first terminal 11, a converter 12, an inverter 13, and a second terminal 14. The converter 12 of the first power conversion unit PUA is an example of a "first power conversion module." The inverter 13 of the first power conversion unit PUA is an example of a "second power conversion module."

On the other hand, the second power conversion unit PUB converts the second phase (for example, the S phase) of AC power input from the input transformer 5 and outputs the second phase (for example, V phase) of the AC power after conversion. The second power conversion unit PUB includes, for example, a first terminal 11, a converter 12, an inverter 13, and a second terminal 14. The converter 12 of the second power conversion unit PUB is an example of a "third power conversion module." The inverter 13 of the second power conversion unit PUB is an example of a "fourth power conversion module."

Here, the first power conversion unit PUA and the second power conversion unit PUB are substantially the same except that the phases of the AC power are different. Therefore, hereinafter, the first power conversion unit PUA is described representatively. Further, hereinafter, the first terminal 11 and the second terminal 14 will be described first, and then the converter 12 and the inverter 13 will be described.

The first terminal 11 is electrically connected to the input transformer 5. For example, the first terminal 11 receives the first phase of the AC power from the input transformer 5.

The second terminal 14 is electrically connected to the load L or another single-phase cell unit 6. For example, the second terminal 14 outputs the first phase of the AC power after conversion to the load L.

The converter 12 is, for example, an NPC type three-level converter. The converter 12 has a leg La and converts AC power into DC power. The leg La includes first to fourth switching elements SW1a, SW2a, SW3a, and SW4a, first to fourth free-wheeling diodes DF1a, DF2a, DF3a, and DF4a, first and second clamp diodes DC1a and DC2a. The leg La is an example of a "first leg."

Each of the first to fourth switching elements SW1a, SW2a, SW3a, and SW4a is, for example, a transistor type switching element having a self-extinguishing capability. Each of the first to fourth switching elements SW1a, SW2a, SW3a, and SW4a is, for example, a bipolar transistor type switching element. In the embodiment, each of the first to fourth switching elements SW1a, SW2a, SW3a, and SW4a is an insulated gate bipolar transistor (IGBT). However, each of the first to fourth switching elements SW1a, SW2a, SW3a, and SW4a is not limited to the above example.

The first to fourth switching elements SW1a, SW2a, SW3a, and SW4a are electrically connected in series from the positive electrode P toward the negative electrode N in this order. In the embodiment, a collector of the first switching element SW1a is electrically connected to the positive electrode P. The first switching element SW1a is a switching element located at a first end in an electrical connection relationship among the first to fourth switching elements SW1a, SW2a, SW3a, and SW4a. A collector of the second switching element SW2a is electrically connected to an emitter of the first switching element SW1a. A collector of the third switching element SW3a is electrically connected to an emitter of the second switching element SW2a. A collector of the fourth switching element SW4a is electrically connected to an emitter of the third switching element SW3a. An emitter of the fourth switching element SW4a is electrically connected to the negative electrode N. The fourth switching element SW4a is a switching element located at a second end opposite to the first end in the electrical connection relationship among the first to fourth switching elements SW1a, SW2a, SW3a, and SW4a.

In the embodiment, the first terminal 11 is electrically connected to a connection portion which electrically connects the emitter of the second switching element SW2a to the collector of the third switching element SW3a. Thus, the emitter of the second switching element SW2a and the collector of the third switching element SW3a are electrically connected to the first terminal 11.

The first to fourth free-wheeling diodes DF1a, DF2a, DF3a, and DF4a are electrically connected in inverse parallel to the first to fourth switching elements SW1a, SW2a, SW3a, and SW4a, respectively. That is, the first free-wheeling diode DF1a is electrically connected in inverse parallel to the first switching element SW1a. The second free-wheeling diode DF2a is electrically connected in inverse parallel to the second switching element SW2a. The third free-wheeling diode DF3a is electrically connected in inverse parallel to the third switching element SW3a. The fourth free-wheeling diode DF4a is electrically connected in inverse parallel to the fourth switching element SW4a. The expression "connected in inverse parallel" means that the switching element and the free-wheeling diode are electrically connected in parallel, and a direction in which a current flows in the forward direction in the switching element and a direction in which a current flows in the forward direction in the free-wheeling diode are opposite to each other.

An anode of the first clamp diode DC1a is electrically connected to a neutral point C. A cathode of the first clamp diode DC1a is electrically connected to a connection portion which electrically connects the emitter of the first switching element SW1a to the collector of the second switching element SW2a. A cathode of the second clamp diode DC2a is electrically connected to the neutral point C. An anode of the second clamp diode DC2a is electrically connected to a connection portion which electrically connects the emitter of the third switching element SW3a to the collector of the fourth switching element SW4a.

Here, a portion related to the leg La of the converter 12 in the physical constitution of the drive device 1 will be described first. The converter 12 includes a first outer element module Q1a, a first inner element module Q2a, a second inner element module Q3a, a second outer element module Q4a, and a clamp diode module DCMa as a constitution of the leg La. These names are just used for convenience of explanation. That is, the terms "outside" and "inside" do not specify a physical position.

The first outer element module Q1a is a semiconductor module (a module type semiconductor) into which the first switching element SW1a and the first free-wheeling diode DF1a are built. The first inner element module Q2a is a semiconductor module into which the second switching element SW2a and the second free-wheeling diode DF2a are built. The second inner element module Q3a is a semiconductor module into which the third switching element SW3a and the third free-wheeling diode DF3a are built. The second outer element module Q4a is a semiconductor module into which the fourth switching element SW4a and the fourth free-wheeling diode DF4a are built. The clamp diode module DCMa is a semiconductor module into which the first and second clamp diodes DC1a and DC2a are built.

The inverter 13 is, for example, an NPC type three-level inverter. The inverter 13 has a leg Lb and converts DC power converted by the converter 12 into AC power. The leg Lb includes first to fourth switching elements SW1b, SW2b, SW3b, and SW4b, first to fourth free-wheeling diodes DF1b, DF2b, DF3b, and DF4b, and first and second clamp diodes DC1b, DC2b. Further, the inverter 13 includes, for example, a first outer element module Q1b, a first inner element module Q2b, a second inner element module Q3b, a second outer element module Q4b, and a clamp diode module DCMb as physical constitutions. The leg Lb is an example of a "third leg".

Here, the constitution and function of the leg Lb of the inverter 13 are substantially the same as those of the leg La of the converter 12. For explanation regarding the leg Lb, in the above explanation regarding the leg La, the first to fourth switching elements SW1a, SW2a, SW3a, and SW4a may be replaced with the first to fourth switching elements SW1b, SW2b, SW3b, and SW4b, respectively, the first to fourth free-wheeling diodes DF1a, DF2a, DF3a, and DF4a may be replaced with the first to fourth free-wheeling diodes DF1b, DF2b, DF3b, and DF4b, respectively, the first and second clamp diodes DC1a and DC2a may be replaced with the first and second clamp diodes DC1b and DC2h, respectively, and the first outer element module Q1a, the first inner element module Q2a, the second inner element module Q3a, the second outer element module Q4a, and the clamp diode module DCMa may be replaced with the first outer element module Q1b, the first inner element module Q2b, the second inner element module Q3b, the second outer element module Q4b, and the clamp diode module DCMb, respectively. The leg La of the second power conversion unit PUB is an example of a "second leg."

<1.2.3 Capacitor Unit>

The capacitor unit CU includes a plurality of capacitors C. In FIG. 2, only two capacitors C are shown as representatives. In the embodiment, the capacitor unit CU includes, for example, 24 capacitors C. However, the number of capacitors C is not limited to the above example. The capacitor C is, for example, a film capacitor but may be an electrolytic capacitor, or the like.

The plurality of capacitors C include a plurality of first capacitors C1 (only one is shown in FIG. 2) and a plurality of second capacitors C2 (only one is shown in FIG. 2). The first capacitors C1 are electrically connected between the positive electrode P and the neutral point C between the converter 12 and the inverter 13. The second capacitors C2 are electrically connected between the negative electrode N and the neutral point C between the converter 12 and the inverter 13. The capacitor C smoothes a voltage of DC power converted from AC power by the converter 12, for example.

<2. Physical Constitution>
<2.1 Overall Constitution>

Figure 3:
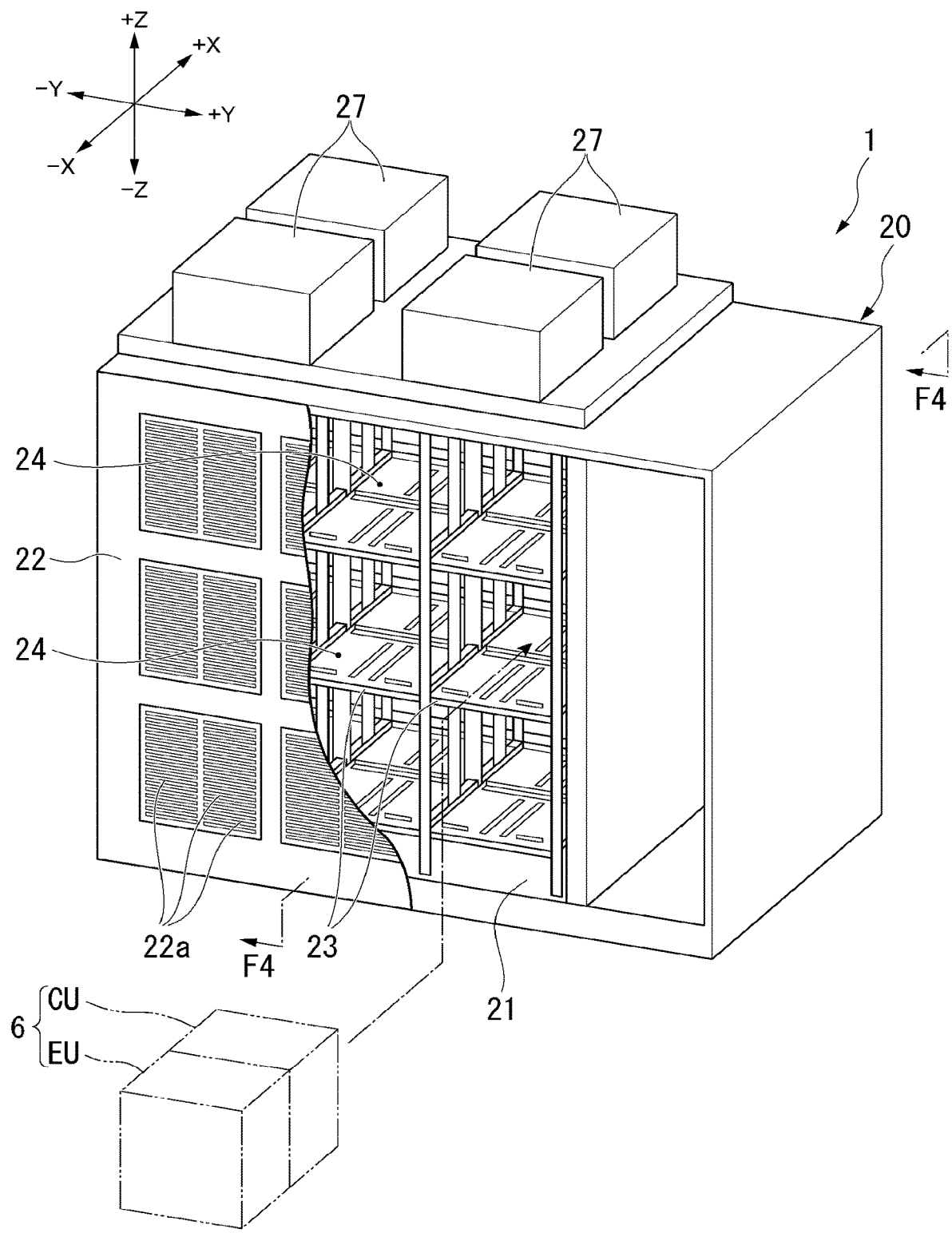
FIG. 3 is a perspective view showing an example of the drive device according to the embodiment.

Next, a physical constitution of the drive device 1 will be described. FIG. 3 is a perspective view showing an example of the drive device 1. Here, the +X direction, −X direction, +Y direction, −Y direction, +Z direction, and −Z direction are defined. The +X direction, the −X direction, the +Y direction, and the −Y direction are directions along a substantially horizontal plane. The +X direction is a direction from a front surface of the drive device 1 toward a rear surface thereof. The −X direction is a direction opposite to the +X direction. When the +X direction and the −X direction are not distinguished, they are simply referred to as "X direction." The +Y direction and the −Y direction are directions different from (for example, substantially orthogonal to) the X direction. The +Y direction is a direction which proceeds to the right side when seen in a front view of the front surface of the drive device 1. The −Y direction is a direction opposite to the +Y direction. When the +Y direction and the −Y direction are not distinguished, they are simply referred to as "Y direction". The +Z direction and the −Z direction are directions different from (for example, substantially orthogonal to) the X direction and the Y direction and are substantially vertical directions. The +Z direction is a direction which proceeds upward. The −Z direction is a direction opposite to the +Z direction. When the +Z direction and the −Z direction are not distinguished, they are simply referred to as "Z direction." The +X direction is an example of a "first direction". The +Y direction is an example of a "second direction." The −Y direction is an example of a "third direction."

Here, an installation structure of the single-phase cell unit 6 will be mainly described. The drive device 1 includes, for example, a housing 20, a plurality of single-phase cell units 6 (only one is shown in FIG. 3), and a plurality of fans 27.

The housing 20 is formed in a box shape. The housing 20 integrally accommodates the plurality of single-phase cell units 6. The housing 20 includes, for example, an opening 21, a front surface cover 22, and a plurality of shelf plates 23.

The opening 21 opens in the −X direction. Here, the single-phase cell unit 6 includes an element unit EU and the capacitor unit CU. The element unit EU and the capacitor unit CU can be connected to and separated from each other. Each of the element unit EU and the capacitor unit CU is inserted into the housing 20 from the outside of the housing 20 through the opening 21. The element unit EU is disposed closer to the opening 21 than the capacitor unit CU is in a state in which the element unit EU and the capacitor unit CU are accommodated in the housing 20.

The front surface cover 22 closes the opening 21 so that it can be opened and closed. The front surface cover 22 has a plurality of ventilation portions 22a which face each of the single-phase cell units 6. Air outside the housing 20 can flow into the housing 20 through the ventilation portions 22a.

The plurality of shelf plates 23 are provided in the housing 20. The plurality of shelf plates 23 are disposed separately in a plurality of stages (for example, three stages) in the Z direction. Further, the plurality of shelf plates 23 are disposed separately in a plurality of rows (for example, three rows) in the Y direction at each of the stages in the Z direction. Therefore, a plurality of (for example, a total of nine) accommodation portions 24 are formed in the housing 20.

The plurality of single-phase cell units 6 are accommodated separately in the plurality of accommodation portions 24 in the housing 20. The single-phase cell unit 6 is placed on the shelf plate 23 and supported from below by the shelf plate 23. In the embodiment, the element unit EU and the capacitor unit CU are sequentially inserted from the outside of the housing 20 into the accommodation portion 24 in a state in which they are separated from each other and are connected to each other after they are inserted into the accommodation portion 24. Each of the element unit EU and the capacitor unit CU is lifted up to the same height as that of the accommodation portion 24 by a device such as a lifter and is then inserted into the accommodation portion 24 in the +X direction.

The plurality of fans 27 are provided, for example, at an upper portion of the housing 20. The plurality of fans 27 is an example of an "air blower." The fan 27 generates a flow of air in gaps between a plurality of fins 82 of a first heat sink 80A and in gaps between a plurality of fins 82 of a second heat sink 80B which will be described later.

Figure 4:
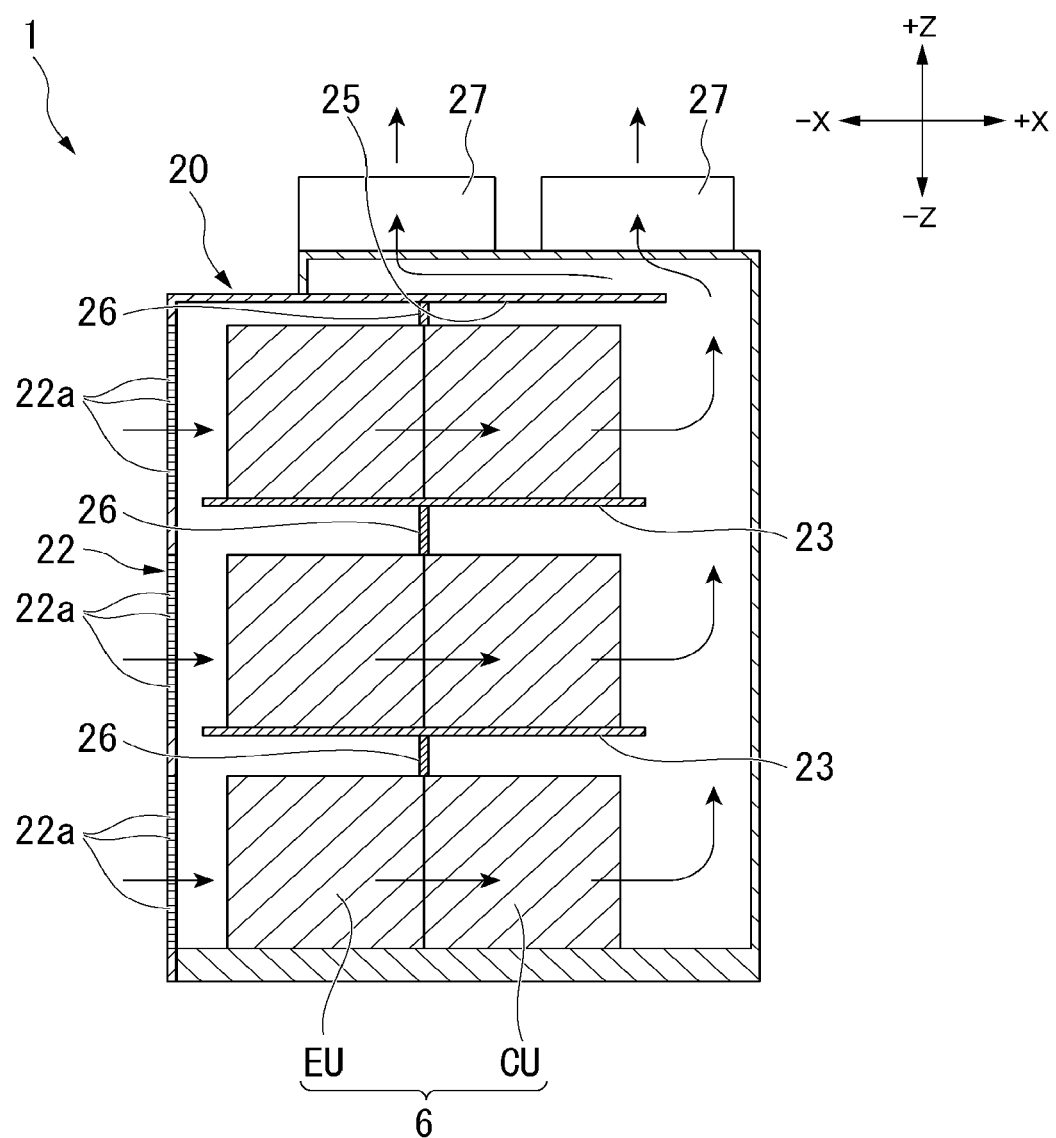
FIG. 4 is a cross-sectional view taken along line F4-F4 of the drive device shown in FIG. 3.

FIG. 4 is a cross-sectional view of the drive device 1 shown in FIG. 3 taken along line F4-F4. A first partition member 25 and a plurality of second partition members 26 which define the flow of air are provided in the housing 20. The first partition member 25 is located above the single-phase cell unit 6 disposed at the uppermost stage. The first partition member 25 is formed in a plate shape in the X direction and the Y direction. The second partition members 26 are provided between the single-phase cell unit 6 and the shelf plate 23 located above the single-phase cell unit 6 or between the single-phase cell unit 6 and the first partition member 25 located above the single-phase cell unit 6. Each of the second partition members 26 is formed in a plate shape in the Y direction and the Z direction. The second partition members 26 block a passage of cooling air between the single-phase cell unit 6 and the shelf plate 23 located above the single-phase cell unit 6 or between the single-phase cell unit 6 and the first partition member 25 located above the single-phase cell unit 6. For example, although the second partition members 25 are provided above the connection portion (a boundary portion) of the element unit EU and the capacitor unit CU, the present invention is not limited thereto. The second partition members 25 may be provided above an end portion of the single-phase cell unit 6 on the −X direction side, may be provided above an end portion of the single-phase cell unit 6 on the +X direction side, and may be provided in other places.

In the embodiment, the plurality of fans 27 suctions air into an inner portion (an end portion on the +X direction side) of the housing 20 and exhausts the suctioned air to the outside of the housing 20. Thus, the air outside the housing 20 flows into the housing 20 through the ventilation portion 22a of the front surface cover 22 of the housing 20. The air which has flowed into the housing 20 passes through the inside of the single-phase cell unit 6 and thus promotes heat dissipation of the single-phase cell unit 6. The air heated by passing through the inside of the single-phase cell unit 6 is exhausted to the outside of the housing 20 as the fan 27 is driven. However, a position of the fan 27 is not limited to the above example. The fan 27 may be an air intake fan disposed between the front surface cover 22 and the single-phase cell unit 6.

<2.2 Single-Phase Cell Unit>

<2.2.1 Overall Constitution of Single-Phase Cell Unit>

Next, a physical constitution of the single-phase cell unit 6 will be described. As described above, the first cell unit 6A, the second cell unit 6B, and the third cell unit 6C are substantially the same except that the phases of the AC power are different. Therefore, hereinafter, the first cell unit 6A will be described representatively.

Figure 5:
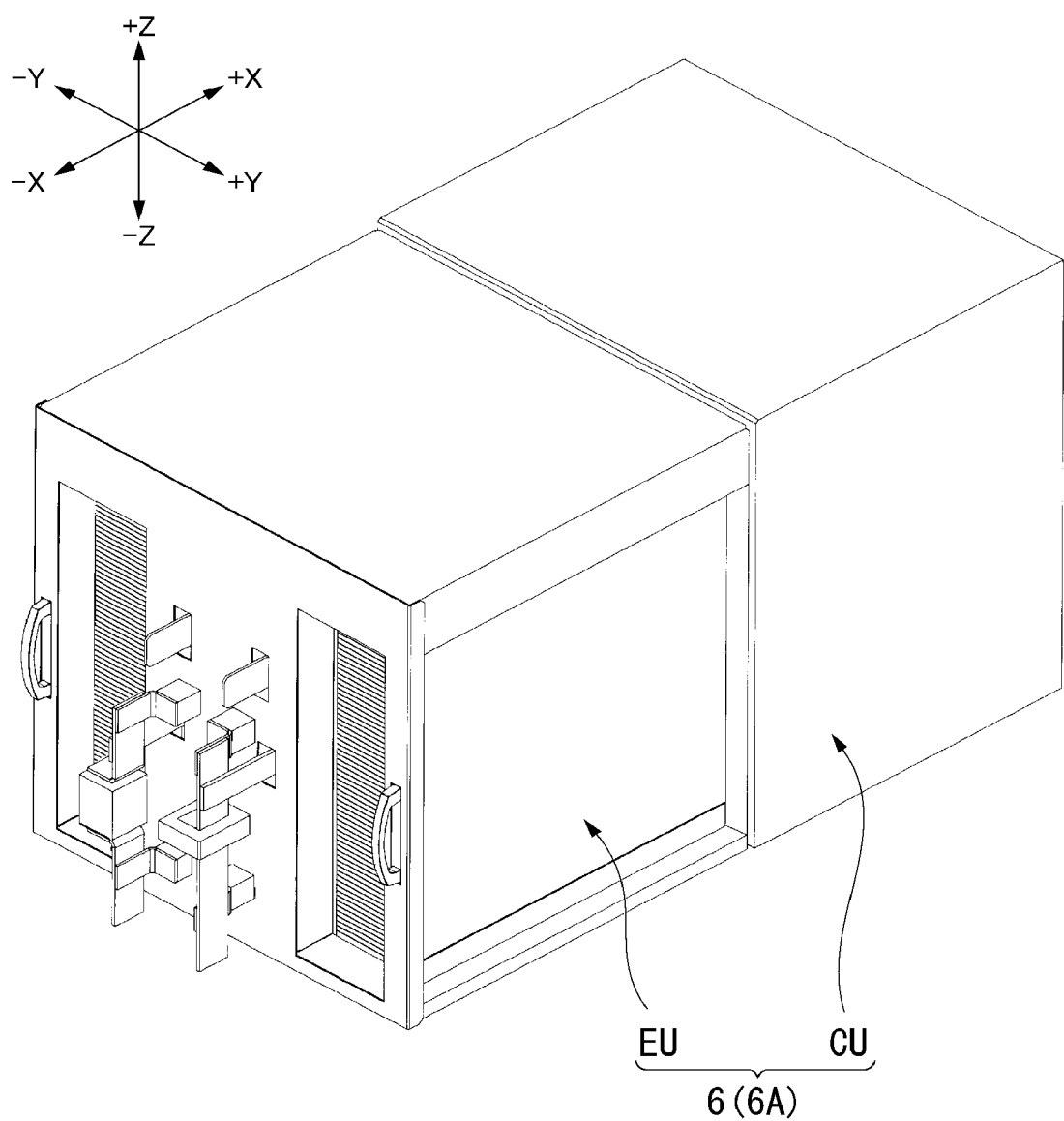
FIG. 5 is a perspective view showing the first cell unit according to the embodiment.

FIG. 5 is a perspective view showing the first cell unit 6A. The first cell unit 6A includes the element unit EU and the capacitor unit CU. Here, a main constitution of the element unit EU and the capacitor unit CU and a connection structure between the element unit EU and the capacitor unit CU will be described first, and then details of some parts of the element unit EU will be described.

<2.2.2 Main Constitution of Element Unit>

Figure 6:
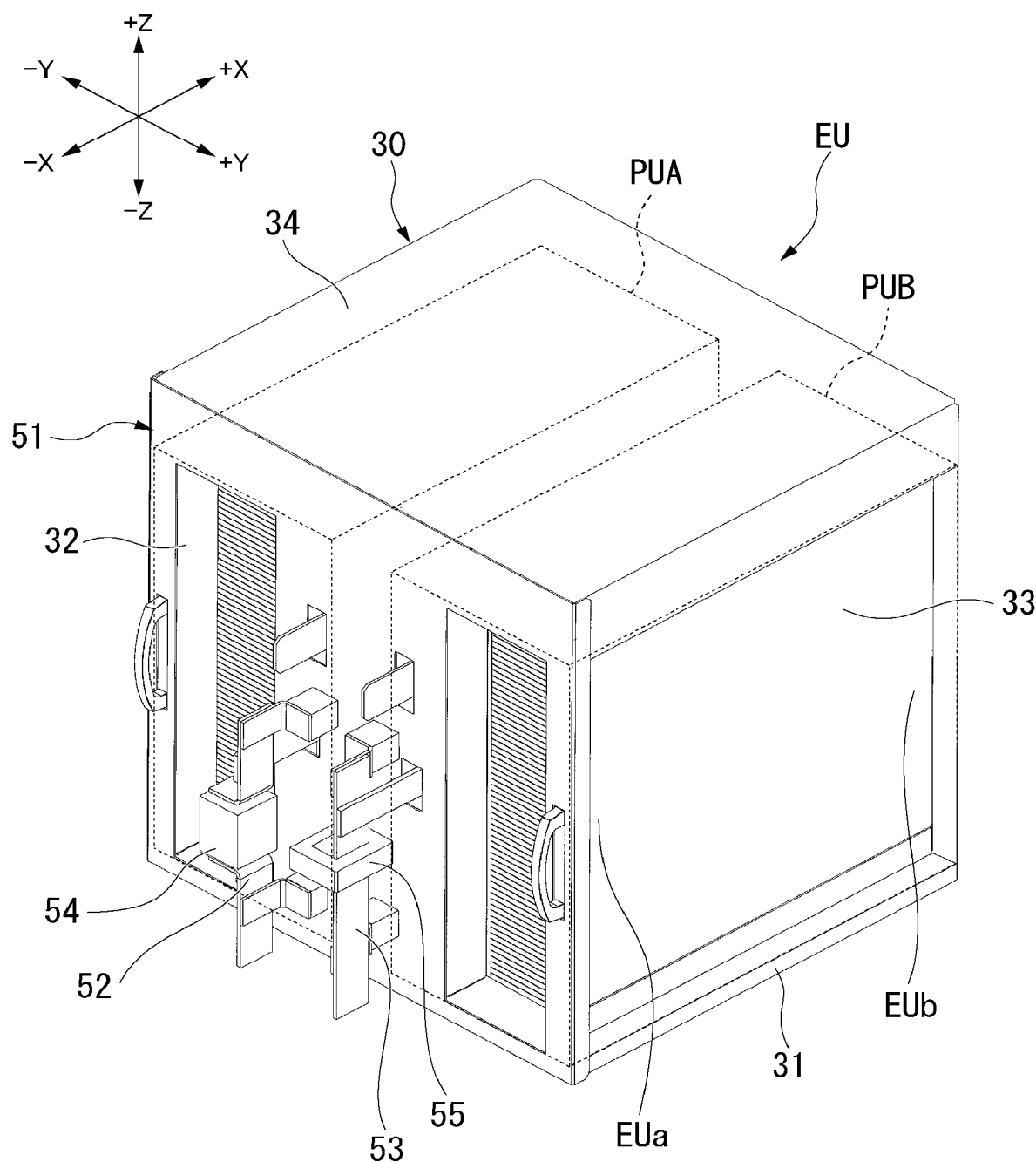
FIG. 6 is a perspective view showing an element unit according to the embodiment.

FIG. 6 is a perspective view showing the element unit EU. The element unit EU includes, for example, a first outer frame member 30, a first power conversion unit PUA, a second power conversion unit PUB, a first connection plate 41 (refer to FIG. 12), a second connection plate 42 (refer to FIG. 12), a control board 44 (refer to FIG. 12), a guide member 45 (refer to FIG. 12), a front surface cover 51, a first connection bus 52, a second connection bus 53, a fuse 54, and an HCT 55. Further, the element unit EU has a first end portion EUa and a second end portion EUb. The first end portion EUa is an end portion on the −X direction side. The second end portion EUb is an end portion on the +X direction side and is located on the side opposite to the first end portion EUa. The second end portion EUb faces the capacitor unit CU.

The first outer frame member 30 forms an outline of the element unit EU. The first outer frame member 30 is formed in a frame shape which surrounds the first power conversion unit PUA, the second power conversion unit PUB, the first connection plate 41, the second connection plate 42, the control board 44, and the guide member 45, and these components are accommodated in the first outer frame member 30. Here, in the embodiment, the "frame" broadly means a "thing surrounding an object" and is not limited to a specific shape. Further, "surrounding" is not limited to a case of surrounding an object from four directions (surrounding an entire circumference thereof), and an object may be faced from at least three directions.

The first outer frame member 30 may be formed of, for example, a single tubular or box-shaped member. Further, the first outer frame member 30 may be formed by connecting and assembling a plurality of members to each other. In the embodiment, the first outer frame member 30 includes a base 31, a first support chassis 32, a second support chassis 33, and a top plate member 34 and is formed by connecting and assembling these members to each other.

The base 31 is formed in a plate shape along the X direction and the Y direction. The base 31 is located below the first power conversion unit PUA and the second power conversion unit PUB. Each of the first support chassis 32 and the second support chassis 33 is formed in a plate shape along the X direction and the Z direction. The first support chassis 32 is mounted on an end portion of the base 31 on the −Y direction side and stands up in the +Z direction from the base 31. The second support chassis 33 is mounted on an end portion of the base 31 on the +Y direction side and stands up in the +Z direction from the base 31. The top plate member 34 is formed in a plate shape along the X direction and the Y direction. The top plate member 34 is mounted on an end portion of the first support chassis 32 on the +Z direction side and an end portion of the second support chassis 33 on the +Z direction side.

Figure 7:
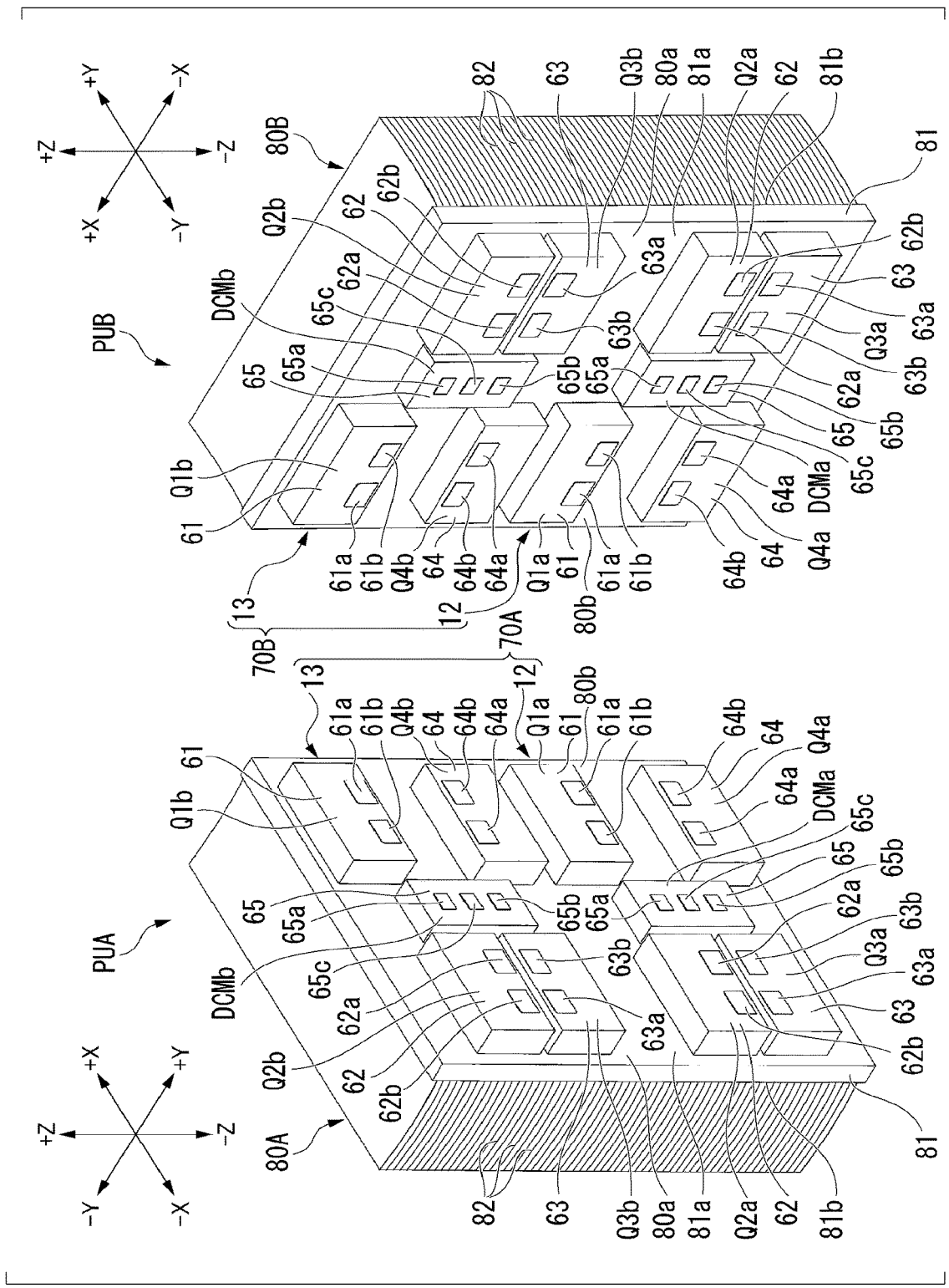
FIG. 7 is a perspective view showing a constitution of a part of the element unit according to the embodiment.

Next, the first power conversion unit PUA will be described. FIG. 7 is a perspective view showing a partial constitution of the element unit EU. In FIG. 7 and other drawings showing the element unit EU, a gate terminal of each of the modules is not shown. The first power conversion unit PUA includes, for example, a first module set 70A and a first heat sink 80A.

Figure 8:
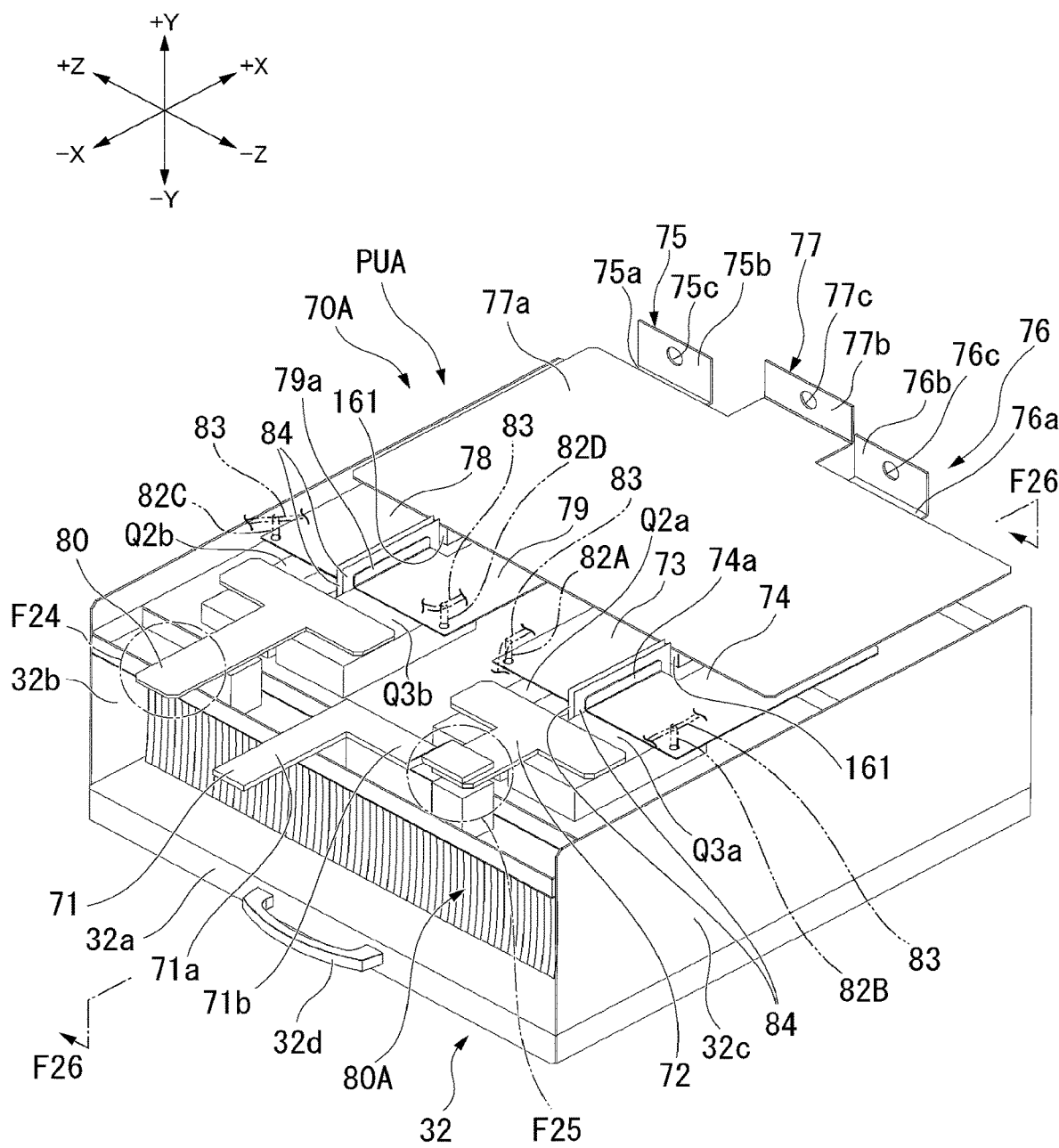
FIG. 8 is a perspective view showing a first module set and a first support chassis according to the embodiment.

The first module set 70A includes the converter 12 and the inverter 13 of the first power conversion unit PUA, and a plurality of buses 71, 72, 73, 74, 75, 76, 77, 78, 79, and 80 (refer to FIG. 8). That is, the first module set 70A includes the first outer element module Q1a, the first inner element module Q2a, the second inner element module Q3a, the second outer element module Q4a, and the clamp diode module DCMa which constitute the leg La of the converter 12. Further, the first module set 70A includes the first outer element module Q1b, the first inner element module Q2b, the second inner element module Q3b, the second outer element module Q4b, and the clamp diode module DCMb which constitute the leg Lb of the inverter 13. The first module set 70A will be described later in detail.

The first heat sink 80A includes a base 81 and a plurality of fins 82. The base 81 is formed in a plate shape along the X direction and the Z direction. The base 81 has a first surface 81a which faces in the +Y direction and a second surface 81b located on the side opposite to the first surface 81a. The first surface 81a is an example of a "first support surface." The first outer element modules Q1a and Q1b, the first inner element modules Q2a and Q2b, the second inner element modules Q3a and Q3b, the second outer element modules Q4a and Q4b, and the clamp diode modules DCMa and DCMb included in the first module set 70A are mounted on the first surface 81a. At least some (for example, most) of the heat generated by the first module set 70A is transmitted to the first heat sink 80A.

The plurality of fins 82 are disposed in the first heat sink 80A on the side opposite to the first surface 81a. The plurality of fins 82 are provided on the second surface 81b of the base 81 and protrude from the base 81 in the −Y direction. The plurality of fins 82 are arranged in the Z direction with a gap therebetween. In the embodiment, when the fan 27 is driven, the air which has flowed into the housing 20 from the ventilation portion 22a of the front surface cover 22 of the housing 20 flows in the gap between the plurality of fins 82 in the +X direction. Thus, cooling of the first module set 70A is promoted.

Next, the converter 12 of the first module set 70A will be described in detail. The description of the gate terminal of each of the modules will be omitted. The first outer element module Q1a includes a package (an outer member) 61 which accommodates the first switching element SW1a and the first free-wheeling diode DF1a. The package 61 is an example of a "first package". The package 61 has a base plate formed of a metal and a cover formed of a synthetic resin. The base plate is in contact with the first surface 81a of the first heat sink 80A. The cover is combined with the base plate and forms an accommodation portion which accommodates the first switching element SW1a and the first free-wheeling diode DF1a between the base plate and the cover. In addition, packages 62, 63, 64, and 65 of other element modules Q2a, Q3a, Q4a, and DCMa which will be described later have substantially the same constitution as that of the package 61 of the first outer element module Q1a.

Two terminals 61a and 61b are provided on a surface of the package 61 of the first outer element module Q1a. The terminal 61a is electrically connected to the collector of the first switching element SW1a and the cathode of the first free-wheeling diode DF1a inside the first outer element module Q1a. The terminal 61b is electrically connected to the emitter of the first switching element SW1a and the anode of the first free-wheeling diode DF1a inside the first outer element module Q1a. The two terminals 61a and 61b are arranged in the +X direction in the order of the terminal 61b and the terminal 61a. For example, the first outer element module Q1a is formed in a rectangular parallelepiped shape having a longitudinal direction in a direction (the X direction) in which the two terminals 61a and 61b are arranged. Further, the terminals 61a and 61b are disposed to be biased toward the −Z direction side with respect to a center portion of the first outer element module Q1a in the Z direction.

The first inner element module Q2a includes the package 62 which accommodates the second switching element SW2a and the second free-wheeling diode DF2a. The package 62 is an example of a "second package." Two terminals 62a and 62b are provided on a surface of the package 62. The terminal 62a is electrically connected to the collector of the second switching element SW2a and the cathode of the second free-wheeling diode DF2a inside the first inner element module Q2a. The terminal 62b is electrically connected to the emitter of the second switching element SW2a and the anode of the second free-wheeling diode DF2a inside the first inner element module Q2a. The two terminals 62a and 62b are arranged in the +X direction in the order of the terminal 62b and the terminal 62a. For example, the first inner element module Q2a is formed in a rectangular parallelepiped shape having a longitudinal direction in a direction (the X direction) in which the two terminals 62a and 62b are arranged. Further, the terminals 62a and 62b are disposed to be biased toward the −Z direction side with respect to a center portion of the first inner element module Q2a in the Z direction.

The second inner element module Q3a includes the package 63 which accommodates the third switching element SW3a and the third free-wheeling diode DF3a. The package 63 is an example of a "third package." Two terminals 63a and 63b are provided on a surface of the package 63. The terminal 63a is electrically connected to the collector of the third switching element SW3a and the cathode of the third free-wheeling diode DF3a inside the second inner element module Q3a. The terminal 63b is electrically connected to the emitter of the third switching element SW3a and the anode of the third free-wheeling diode DF3a inside the second inner element module Q3a. The two terminals 63a and 63b are arranged in the +X direction in the order of the terminal 63a and the terminal 63b. For example, the second inner element module Q3a is formed in a rectangular parallelepiped shape having a longitudinal direction in a direction (the X direction) in which the two terminals 63a and 63b are arranged. Further, the terminals 63a and 63b are disposed to be biased toward the +Z direction side with respect to a center portion of the second inner element module Q3a in the Z direction.

The second outer element module Q4a has the package 64 which accommodates the fourth switching element SW4a and the fourth free-wheeling diode DF4a. The package 64 is an example of a "fourth package." Terminals 64a and 64b are provided on a surface of the package 64. The terminal 64a is electrically connected to the collector of the fourth switching element SW4a and the cathode of the fourth free-wheeling diode DF4a inside the second outer element module Q4a. The terminal 64b is electrically connected to the emitter of the fourth switching element SW4a and the anode of the fourth free-wheeling diode DF4a inside the second outer element module Q4a. The two terminals 64a and 64b are arranged in the +X direction in the order of the terminal 64a and the terminal 64b. For example, the second outer element module Q4a is formed in a rectangular parallelepiped shape having a longitudinal direction in a direction (the X direction) in which the two terminals 64a and 64b are arranged. Further, the terminals 64a and 64b are disposed to be biased toward the +Z direction side with respect to a center portion of the second outer element module Q4a in the Z direction.

The clamp diode module DCMa includes the package 65 which accommodates the first and second clamp diodes DC1a and DC2a. The package 65 is an example of a "fifth package." Three terminals 65a, 65b, and 65c are provided on a surface of the package 65. The terminal 65a is electrically connected to the cathode of the first clamp diode DC1a inside the clamp diode module DCMa. The terminal 65b is electrically connected to the anode of the second clamp diode DC2a inside the clamp diode module DCMa. The terminal 65c is electrically connected to the anode of the first clamp diode DC1a and the cathode of the second clamp diode DC2a inside the clamp diode module DCMa. The three terminals 65a, 65b, and 65c are arranged in the −Z direction in the order of the terminal 65a, the terminal 65c, and the terminal 65b. For example, the clamp diode module DCMa is formed in a rectangular parallelepiped shape having a longitudinal direction in a direction (the Z direction) in which the three terminals 65a, 65b, and 65c are arranged. The terminals 65a, 65b, and 65c are disposed at a substantially center portion of the clamp diode module DCMa in the X direction.

Here, the first heat sink 80A has a first end portion 80a and a second end portion 80b. The first end portion 80a is an end portion which is the windward side in a flow of the cooling air due to the fan 27. The second end portion 80b is an end portion which is located on the side opposite to the first end portion 80a and is on the leeward side in the flow of the cooling air due to the fan 27. The second end portion 80b faces the capacitor unit CU.

In the embodiment, the first inner element module Q2a and the second inner element module Q3a are disposed closer to the first end portion 80a than to the second end portion 80b in the first heat sink 80A. The first inner element module Q2a and the second inner element module Q3a are arranged in the Z direction. On the other hand, the first outer element module Q1a and the second outer element module Q4a are disposed closer to the second end portion 80b than to the first end portion 80a in the first heat sink 80A. The first outer element module Q1a and the second outer element module Q4a are arranged in the Z direction. The clamp diode module DCMa is disposed between a pair of the first inner element module Q2a and the second inner element module Q3a and a pair of the first outer element module Q1a and the second outer element module Q4a in the X direction. An arrangement layout of the element modules Q1a, Q2a, Q3a, Q4a, and DCMa will be described later in detail.

Next, the inverter 13 of the first module set 70A will be described. The inverter 13 is disposed on the +Z direction side of converter 12 in substantially the same arrangement layout as that of the converter 12. For explanation regarding the inverter 13, in the above explanation regarding the converter 12, the first outer element module Q1a, the first inner element module Q2a, the second inner element module Q3a, the second outer element module Q4a, and the clamp diode module DCMa may be replaced with the first outer element module Q1b, the first inner element module Q2b, the second inner element module Q3b, the second outer element module Q4b, and the clamp diode module DCMb, respectively.

Next, the second power conversion unit PUB will be described. The second power conversion unit PUB includes, for example, a second module set 70B and a second heat sink 80B. In addition, components having the same or similar function as those of the first power conversion unit PUA are designated by the same reference numerals, and the description thereof will be omitted.

Figure 10:
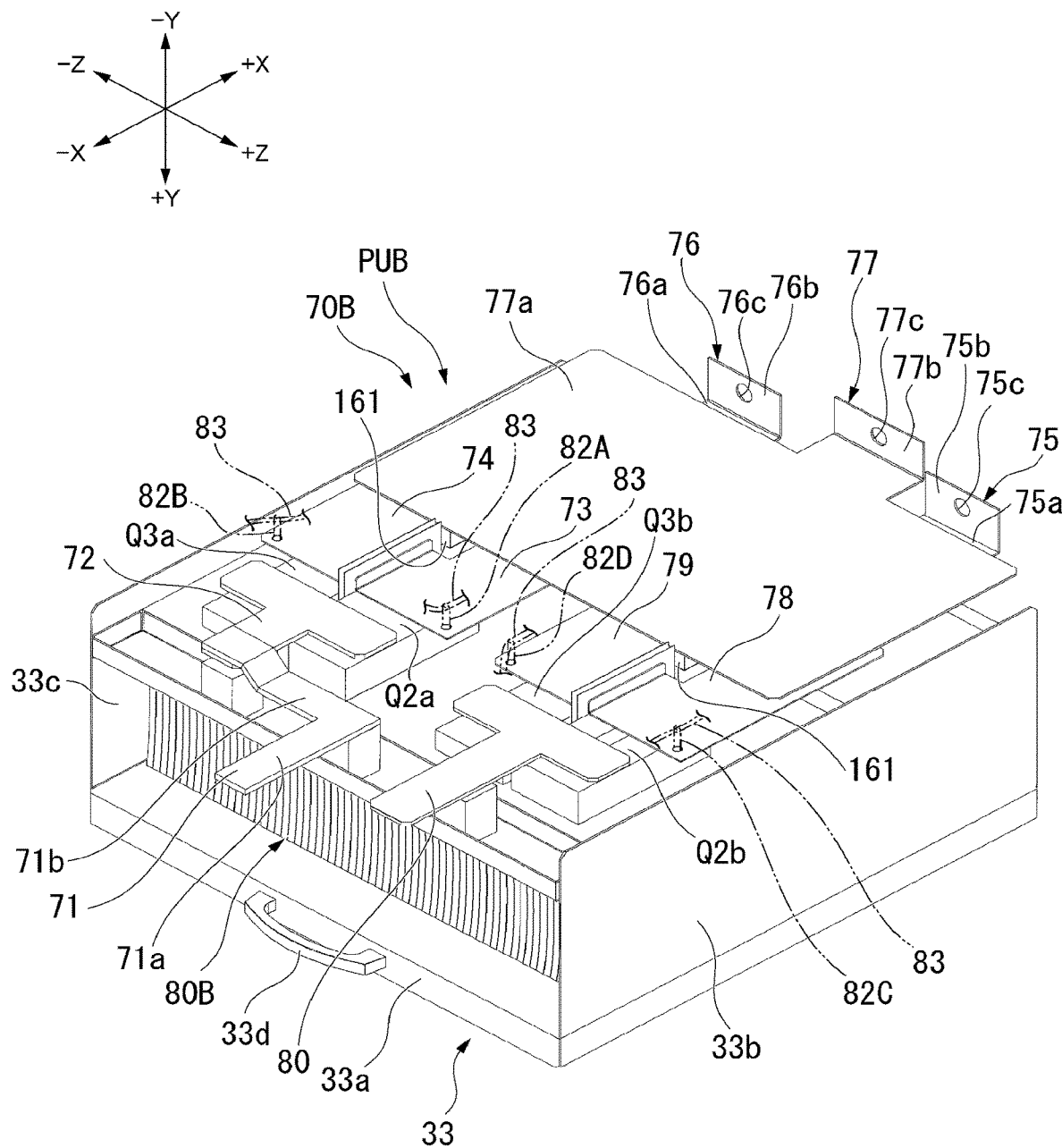
FIG. 10 is a perspective view showing a second module set and a second support chassis according to the embodiment.

The second module set 70B includes the converter 12 and the inverter 13 of the second power conversion unit PUB, and a plurality of buses 71, 72, 73, 74, 75, 76, 77, 78, 79, and 80 (refer to FIG. 10). That is, the second module set 70B includes the first outer element module Q1a, the first inner element module Q2a, the second inner element module Q3a, the second outer element module Q4a, and the clamp diode module DCMa which constitute the leg La of the converter 12. Further, the second module set 70B includes the first outer element module Q1b, the first inner element module Q2b, the second inner element module Q3b, the second outer element module Q4b, and the clamp diode module DCMb which constitute the leg Lb of the inverter 13.

The second heat sink 80B includes a base 81 and a plurality of fins 82. The base 81 is formed in a plate shape along the X direction and the Z direction. The base 81 has a first surface 81a which faces in the −Y direction and a second surface 81b located on the side opposite to the first surface 81a. The first surface 81a is an example of a "second support surface." The first outer element modules Q1a and Q1b, the first inner element modules Q2a and Q2b, the second inner element modules Q3a and Q3b, the second outer element modules Q4a and Q4b, and the clamp diode modules DCMa and DCMb included in the second module set 70B are mounted on the first surface 81a. At least some (for example, most) of the heat generated by the second module set 70B is transmitted to the second heat sink 80B.

The plurality of fins 82 are disposed on the side opposite to the first surface 81a of the base 81. The plurality of fins 82 are provided on the second surface 81b of the base 81 and protrude from the base 81 in the +Y direction. The plurality of fins 82 are arranged in the Z direction with a gap therebetween. In the embodiment, when the fan 27 is driven, the air which has flowed into the housing 20 from the ventilation portion 22a of the front surface cover 22 of the housing 20 flows in the gap between the plurality of fins 82 in the +X direction. Thus, cooling of the second module set 70B is promoted.

The first heat sink 80A and the second heat sink 80B are disposed so that the first surface 81a of the first heat sink 80A and the first surface 81a of the second heat sink 80B face each other. A space S1 (hereinafter, referred to as access space S1) is provided between the first surface 81a of the first heat sink 80A and the first surface 81a of the second heat sink 80B (refer to FIG. 12). The access space S1 passes through the element unit EU in the X direction except for the front surface cover 51.

Figure 9:
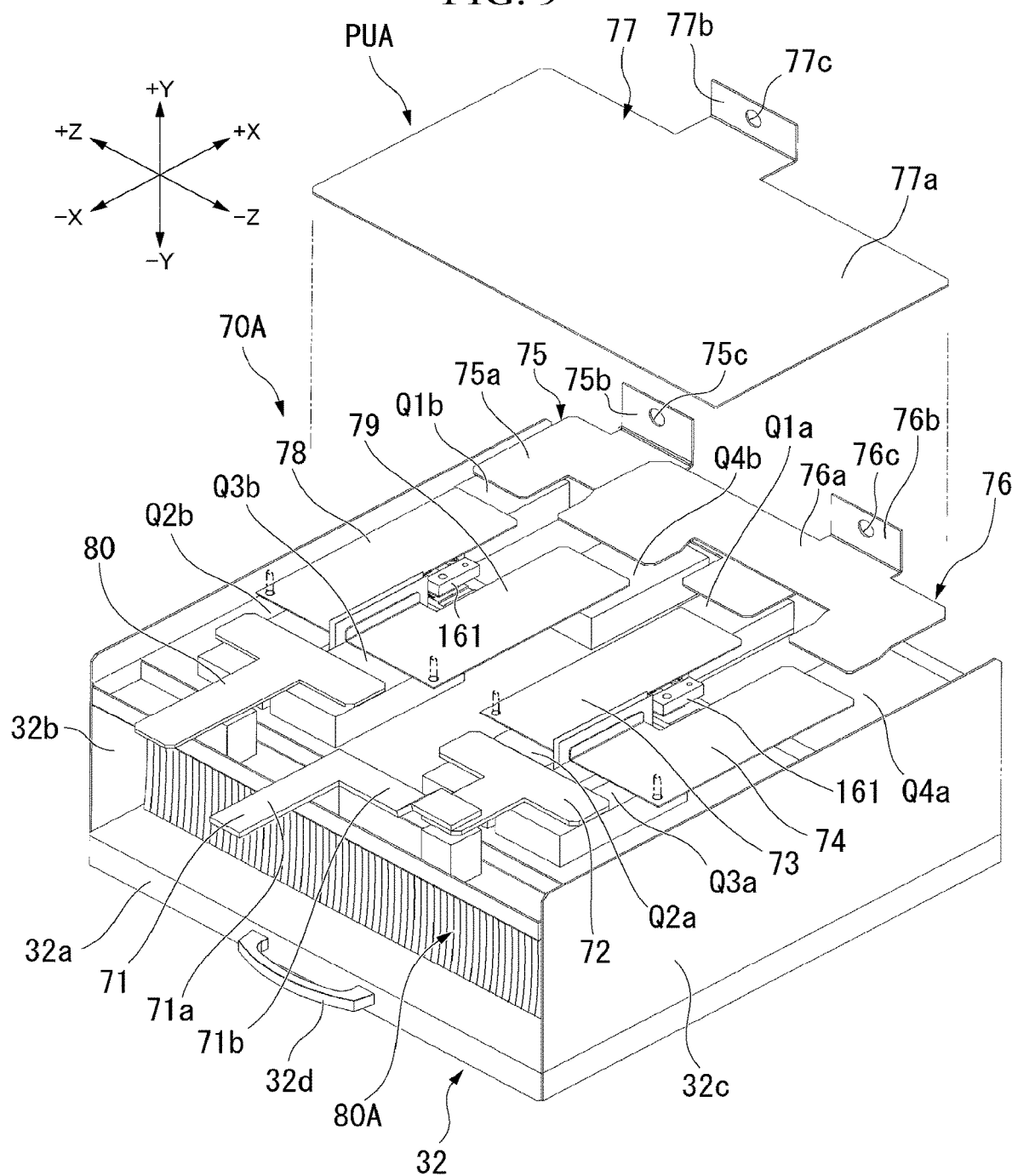
FIG. 9 is a perspective view showing a state in which a neutral point bus is removed from the first module set shown in FIG. 8.

Next, the buses 71, 72, 73, 74, 75, 76, 77, 78, 79, and 80 included in the first module set 70A will be described. FIG. 8 is a perspective view showing the first module set 70A and the first support chassis 32. FIG. 9 is a perspective view showing a state in which the neutral point bus 77 is removed from the first module set 70A shown in FIG. 8.

The first module set 70A includes a relay bus 71, a first terminal bus 72, a first connection bus 73, a second connection bus 74, a positive electrode bus 75, a negative electrode bus 76, a neutral point bus 77, a third connection bus 78, a fourth connection bus 79, and a second terminal bus 80. The relay bus 71, the first terminal bus 72, the first connection bus 73, the second connection bus 74, the positive electrode bus 75, the negative electrode bus 76, the neutral point bus 77, the third connection bus 78, the fourth connection bus 79, and the second terminal bus 80 are disposed on the +Y direction side with respect to the element modules Q1a, Q1b, Q2a, Q2b, Q3a, Q3b, Q4a, Q4b, DCMa, and DCMb.

The relay bus 71 is electrically connected to the input transformer 5 via the fuse 54 provided on the front surface cover 51 and the first connection bus 52 (a first member 52a and a second member 52b of the first connection bus 52 which will be described later). The relay bus 71 has a first portion 71a and a second portion 71b. The first portion 71a extends linearly in the −X direction. The first portion 71a protrudes in the −X direction from the first heat sink 80A and the first support chassis 32. On the other hand, the second portion 71b extends in the −Z direction from an end portion of the first portion 71a on the +X direction side.

The first terminal bus 72 is connected to the second portion 71b of the relay bus 71. The first terminal bus 72 is formed in a plate shape along the X direction and the Z direction. The first terminal bus 72 is connected to the terminal 62b of the first inner element module Q2a and the terminal 63a of the second inner element module Q3a.

The first connection bus 73 is formed in a plate shape along the X direction and the Z direction except for a bent portion (not shown) which will be described later. The first connection bus 73 is connected to the terminal 62a of the first inner element module Q2a, the terminal 65a of the clamp diode module DCMa, and the terminal 61b of the first outer element module Q1a and electrically connects the terminals 62a, 65a, and 61b to each other.

In the embodiment, the first connection bus 73 has a relatively large width in the Z direction. Thus, for example, a continuous maximum allowable current capacity of the first connection bus 73 can be increased, and an inductance can be reduced. A support body 82A is attached to an end portion of the first connection bus 73 on the +Z direction side. The support body 82A stands up in the +Y direction from the first connection bus 73 and protrudes into the access space S1. The support body 82A supports a gate wiring 83 in the access space S1. The gate wiring 83 is a cable which is electrically connected between a gate of at least one of the first to fourth switching elements SW1a, SW2a, SW3a, and SW4a and the control board 44.

The second connection bus 74 is formed in a plate shape along the X direction and the Z direction except for a bent portion 74a which will be described later. The second connection bus 74 is connected to the terminal 63b of the second inner element module Q3a, the terminal 65b of the clamp diode module DCMa, and the terminal 64a of the second outer element module Q4a, and electrically connects the terminals 63b, 65b and 64a to each other. The second connection bus 74 has the bent portion 74a bent in the +Y direction in the vicinity of the terminal 63b of the second inner element module Q3a. Here, the first connection bus 73 has substantially the same bent portion as the bent portion 74a. An insulating member (for example, an insulating paper) 84 is attached (fixed by a fixing member (not shown)) to the bent portion of the first connection bus 73 and the bent portion 74a of the second connection bus 74. According to such a constitution, for example, workability can be improved as compared with a case in which one insulating member is interposed between the bent portion of the first connection bus 73 and the bent portion 74a of the second connection bus 74. The insulating member 84 may be provided at only one of the bent portion of the first connection bus 73 and the bent portion 74a of the second connection bus 74 as long as insulation can be secured. Further, one insulating member 84 may be interposed between the bent portion of the first connection bus 73 and the bent portion 74a of the second connection bus 74.

In the embodiment, the second connection bus 74 has a relatively large width in the Z direction. Thus, for example, a continuous allowable current capacity of the second connection bus 74 can be increased, and an inductance is reduced. Furthermore, since the bent portion of the first connection bus 73 and the bent portion 74a of the second connection bus 74 face each other, a surge voltage generated when the second switching element SW2a or the third switching element SW3a cuts off a current can be suppressed due to mutual inductance. A support body 82B is attached to an end portion of the second connection bus 74 on the −Z direction side. The support body 82B stands up in the +Y direction from the second connection bus 74 and protrudes into the access space S1. The support body 82R supports the gate wiring 83 in the access space S1.

The positive electrode bus 75 includes a positive electrode main body portion 75a and a positive electrode connection portion 75b. The positive electrode main body portion 75a is formed in a plate shape along the X direction and the Z direction (refer to FIG. 9). The positive electrode main body portion 75a is connected to the terminal 61a of the first outer element module Q1a of the converter 12 and the terminal 61a of the first outer element module Q1b of the inverter 13 and electrically connects the terminals 61a and 61a. The positive electrode connection portion 75b is bent in the +Y direction from an end portion of the positive electrode main body portion 75a on the +X direction side. The positive electrode connection portion 75b is formed in a plate shape along the Y direction and the Z direction. The positive electrode connection portion 75b is located at the second end portion EUb of the element unit EU and faces the capacitor unit CU. The positive electrode connection portion 75b has a first insertion hole 75c through which a fastening member 121 (FIG. 17) described later is passed. The positive electrode bus 75 is an example of a "first positive electrode bus." The positive electrode main body portion 75a is an example of a "first positive electrode main body portion." The positive electrode connection portion 75b is an example of a "first positive electrode connection portion."

The negative electrode bus 76 includes a negative electrode main body portion 76a and a negative electrode connection portion 76b. The negative electrode main body portion 76a is formed in a plate shape along the X direction and the Z direction (refer to FIG. 9). A part of the negative electrode main body portion 76a is bent in the +Y direction not to interfere with the positive electrode main body portion 75a. Therefore, a part of the negative electrode main body portion 76a overlaps the positive electrode main body portion 75a in the Y direction with a gap for securing an insulation distance between the negative electrode main body portion 76a and the positive electrode main body portion 75a. However, a space between the positive electrode main body portion 75a and the negative electrode main body portion 76a is not limited to space insulation but may be barrier insulation. The negative electrode main body portion 76a is connected to the terminal 64b of the second outer element module Q4a of the converter 12 and the terminal 64b of the second outer element module Q4b of the inverter 13 and electrically connects the terminals 64b and 64b. The negative electrode connection portion 76b is bent in the +Y direction from an end portion of the negative electrode main body portion 76a on the +X direction side. The negative electrode connection portion 76b is formed in a plate shape along the Y direction and the Z direction. The negative electrode connection portion 76b is located at the second end portion EUb of the element unit EU and faces the capacitor unit CU. The negative electrode connection portion 76b has a second insertion hole 76c through which a fastening member 122 (refer to FIG. 17) described later is passed. The negative electrode bus 76 is an example of a "first negative electrode bus." The negative electrode main body portion 76a is an example of a "first negative electrode main body portion." The negative electrode connection portion 76b is an example of a "first negative electrode connection portion."

The neutral point bus 77 has a neutral point main body portion 77a and a neutral point connection portion 77b. The neutral point main body portion 77a is formed in a plate shape along the X direction and the Z direction. The neutral point main body portion 77a is disposed on the +Y direction side with respect to the positive electrode main body portion 75a and the negative electrode main body portion 76a, and overlaps the positive electrode main body portion 75a and the negative electrode main body portion 76a in the Y direction with a gap for securing an insulation distance between the positive electrode main body portion 75a and the negative electrode main body portion 76a. However, a space between the positive electrode main body portion 75a and the negative electrode main body portion 76a and the neutral point main body portion 77a is not limited to space insulation but may be barrier insulation. The neutral point main body portion 77a is electrically connected to the terminal 65c of the clamp diode module DCMa of the converter 12 and the terminal 65c of the clamp diode module DCMb of the inverter 13 and electrically connects the terminals 65c and 65c. The neutral point main body portion 77a is electrically connected to the terminals 65c and 65c through, for example, a conductive spacer 161. A connection structure between the neutral point main body portion 77a and the terminals 65c and 65c will be described later in detail. The neutral point connection portion 77b is bent in the +Y direction from an end portion of the neutral point main body portion 77a on the +X direction side. The neutral point connection portion 77b is formed in a plate shape along the Y direction and the Z direction. The neutral point connection portion 77b is located at the second end portion EUb of the element unit EU and faces the capacitor unit CU. The neutral point connection portion 77b has a third insertion hole 77c through which a fastening member 123 (FIG. 17) described later is passed. The neutral point bus 77 is an example of a "first neutral point bus." The neutral point main body portion 77a is an example of a "first neutral point main body portion." The neutral point connection portion 77b is an example of a "first neutral point connection portion."

The third connection bus 78 is formed in a plate shape along the X direction and the Z direction except for a bent portion (not shown) which will be described later. The third connection bus 78 is connected to the terminal 62a of the first inner element module Q2b, the terminal 65a of the clamp diode module DCMb, and the terminal 61b of the first outer element module Q1b and electrically connects the terminals 62a, 65a and 61b.

In the embodiment, the third connection bus 78 has a relatively large width in the Z direction. Thus, for example, a continuous maximum allowable current capacity of the third connection bus 78 can be increased, and an inductance can be reduced. A support body 82C is attached to an end portion of the third connection bus 78 on the +Z direction side. The support body 82C stands up in the +Y direction from the third connection bus 78 and protrudes into the access space S1. The support body 82C supports the gate wiring 83 in the access space S1.

The fourth connection bus 79 is formed in a plate shape along the X direction and the Z direction except for a bent portion 79a which will be described later. The fourth connection bus 79 is connected to the terminal 63b of the second inner element module Q3b, the terminal 65b of the clamp diode module DCMb, and the terminal 64a of the second outer element module Q4b and electrically connects the terminals 63b, 65b and 64a. The fourth connection bus 79 has a bent portion 79a bent in the +Y direction in the vicinity of the terminal 63b of the second inner element module Q3b. Here, the third connection bus 78 has substantially the same bent portion as the bent portion 79a. An insulating member (for example, an insulating paper) 84 is attached (fixed by fixing means (not shown)) to the bent portion of the third connection bus 78 and the bent portion 79a of the fourth connection bus 79. According to such a constitution, workability can be improved as compared with a case in which one insulating member is interposed between the bent portion of the third connection bus 78 and the bent portion 79a of the fourth connection bus 79, for example. The insulating member 84 may be provided at only one of the bent portion of the third connection bus 78 and the bent portion 79a of the fourth connection bus 79 as long as insulation can be secured. Further, one insulating member 84 may be interposed between the bent portion of the third connection bus 78 and the bent portion 79a of the fourth connection bus 79.

In the embodiment, the fourth connection bus 79 has a relatively large width in the Z direction. Thus, for example, a continuous allowable current capacity of the fourth connection bus 79 can be increased and an inductance can be reduced. Furthermore, since the bent portion of the third connection bus 78 and the bent portion 79a of the fourth connection bus 79 face each other, a surge voltage generated when the second switching element SW2b or the third switching element SW3b cuts off the current can be suppressed due to mutual inductance. A support body 82D is attached to an end portion of the fourth connection bus 79 on the −Z direction side. The support body 82D stands up in the +Y direction from the fourth connection bus 79 and protrudes into the access space S1. The support body 82D supports the gate wiring 83 in the access space S1.

The second terminal bus 80 is formed in a plate shape along the X direction and the Z direction. The second terminal bus 80 is connected to the terminal 62b of the first inner element module Q2b and the terminal 63a of the second inner element module Q3b. The second terminal bus 80 extends linearly in the −X direction. The second terminal bus 80 protrudes in the −X direction from the first heat sink 80A and the first support chassis 32. The second terminal bus 80 is electrically connected to the load L or another single-phase cell unit 6.

Here, the first support chassis 32 will be described. The first support chassis 32 has a first portion 32a, a second portion 32b, and a third portion 32c and is formed in a concave shape in which the +X direction, the −X direction, and the +Y direction are open. More specifically, the first portion 32a is formed in a plate shape along the X direction and the Z direction. A handle 32d is provided at the first portion 32a. The second portion 32b is formed in a plate shape along the X direction and the Y direction and extends in the +Y direction from an end portion of the first portion 32a on the +Z direction side. The third portion 32c is formed in a plate shape along the X direction and the Y direction and extends in the +Y direction from an end portion of the first portion 32a on the −Z direction side.

In the embodiment, the first power conversion unit PUA is mounted on the first support chassis 32. For example, the first heat sink 80A is accommodated between the second portion 32b and the third portion 32c of the first support chassis 32.

FIG. 10 is a perspective view showing the second module set 70B and the second support chassis 33. For explanation regarding the second module set 70B, in the above explanation regarding the first module set 70A, the "+Y direction" may be replaced with the "−Y direction." However, the relay bus 71 of the second module set 70B is electrically connected to the input transformer 5 via the second connection bus 53 which passes through the HCT 55, instead of being electrically connected to the input transformer 5 via the fuse 54 and the first connection bus 52.

The positive electrode bus 75 of the second module set 70B is an example of a "third positive electrode bus." The positive electrode main body portion 75a of the second module set 70B is an example of a "third positive electrode main body portion." The positive electrode connection portion 75b of the second module set 70B is an example of a "third positive electrode connection portion." In the second module set 70B, the positive electrode connection portion 75b is bent in the −Y direction from the positive electrode main body portion 75a.

The negative electrode bus 76 of the second module set 70B is an example of a "third negative electrode bus." The negative electrode main body portion 76a of the second module set 70B is an example of a "third negative electrode main body portion." The negative electrode connection portion 76b of the second module set 70B is an example of a "third negative electrode connection portion." In the second module set 70B, the negative electrode connection portion 76b is bent in the −Y direction from the negative electrode main body portion 76a.

The neutral point bus 77 of the second module set 70B is an example of a "third neutral point bus." The neutral point main body portion 77a of the second module set 70B is an example of a "third neutral point main body portion." The neutral point connection portion 77b of the second module set 70B is an example of a "third neutral point connection portion." In the second module set 70B, the neutral point connection portion 77b is bent in the −Y direction from the neutral point main body portion 77a.

Here, the second support chassis 33 will be described. The second support chassis 33 includes a first portion 33a, a second portion 33b, and a third portion 33c, and is formed in a concave shape in which the +X direction, the −X direction, and the −Y direction are open. Specifically, the first portion 33a is formed in a plate shape along the X direction and the Z direction. A handle 33d is provided at the first portion 33a. The second portion 33b is formed in a plate shape along the X direction and the Y direction and extends in the −Y direction from an end portion of the first portion 33a on the +Z direction side. The third portion 33c is formed in a plate shape along the X direction and the Y direction and extends in the −Y direction from an end portion of the first portion 33a on the −Z direction side.

In the embodiment, the second power conversion unit PUB is mounted on the second support chassis 33. For example, the second heat sink 80B is accommodated between the second portion 33b and the third portion 33c of the first support chassis 33.

Figure 11:
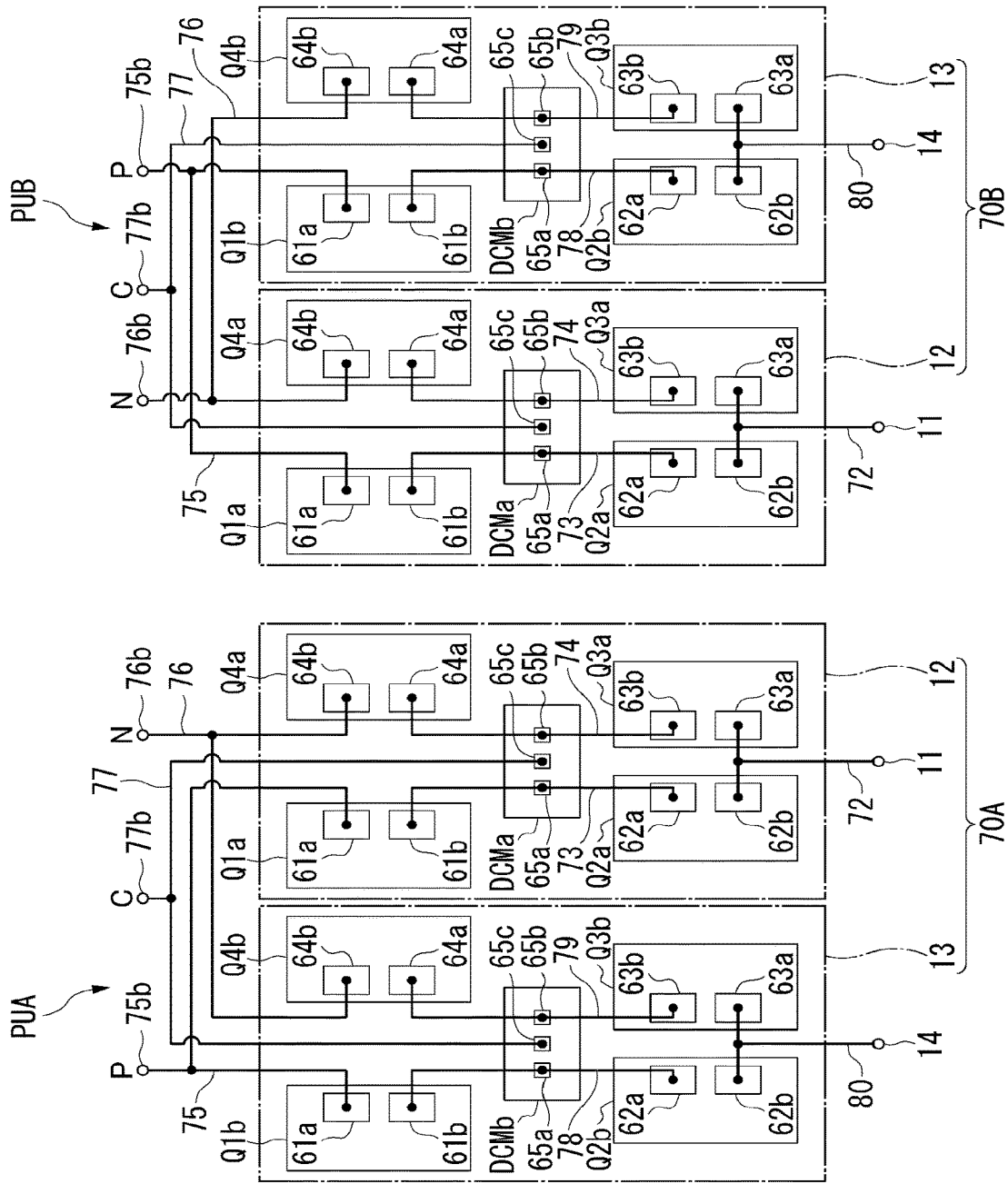
FIG. 11 is a diagram showing an electrical connection relationship of components included in the element unit according to the embodiment.

FIG. 11 is a diagram showing an electrical connection relationship of components included in the element unit EU. Since the electrical connection relationship shown in FIG. 11 is as described above in the description of the buses 71, 72, 73, 74, 75, 76, 77, 78, 79, and 80, and thus, redundant description thereof will be omitted here.

Figure 12:
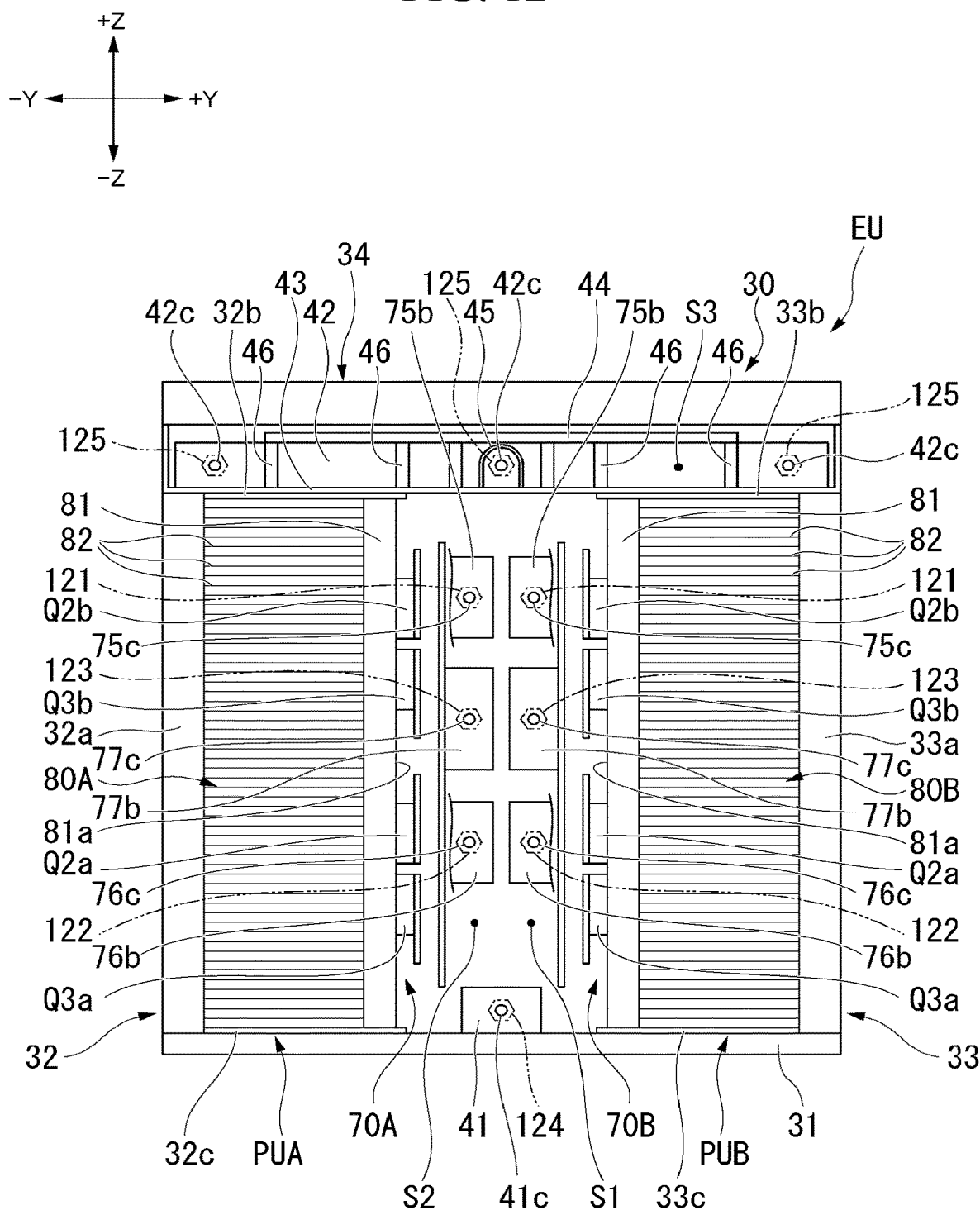
FIG. 12 is a front view showing the element unit according to the embodiment.

FIG. 12 is a front view showing the element unit EU. In FIG. 12, illustration of the relay bus 71, the first terminal bus 72, and the second terminal bus 80 is omitted for convenience of explanation, and the inner element modules Q2a, Q2b, Q3a, and Q3b, the positive electrode bus 75, the negative electrode bus 76, and the neutral point bus 77 are illustrated. In the embodiment, the access space S1 is formed between the first heat sink 80A and the second heat sink 80B. In the embodiment, when seen in the +X direction, the positive electrode connection portion 75b of the positive electrode bus 75, the negative electrode connection portion 76b of the negative electrode bus 76, and the neutral point connection portion 77b of the neutral point bus 77 of the first and second module sets 70A and 70B are exposed to the access space S1 (that is, face the access space S1).

In the embodiment, the first insertion hole 75c of the positive electrode connection portion 75b, the second insertion hole 76c of the negative electrode connection portion 76b, and the third insertion hole 77c of the neutral point connection portion 77b are exposed to the access space S1 in a state in which the fastening members 121, 122, and 123 are respectively removed from the positive electrode connection portion 75b, the negative electrode connection portion 76b, and the neutral point connection portion 77b. In other words, the first insertion hole 75c, the second insertion hole 76c, and the third insertion hole 77c are exposed to a space S2 between the neutral point main body portion 77a of the first module set 70A and the neutral point main body portion 77a of the second module set 70B in a state in which the fastening members 121, 122, and 123 are respectively removed from the positive electrode connection portion 75b, the negative electrode connection portion 76b, and the neutral point connection portion 77b when seen in the +X direction.

Next, the first connection plate 41, the second connection plate 42, and the support plate 43 will be described. The first connection plate 41 is attached to an inner surface of the first outer frame member 30 at an end portion of the first outer frame member 30 on the −Z direction side. The first connection plate 41 is located at the second end portion EUb of the element unit EU. The first connection plate 41 has a fourth insertion hole 41c through which a fastening member 124 described later is passed. When seen in the +X direction, the fourth insertion hole 41c is exposed to the access space S1 in a state in which the fastening member 124 is removed.

The second connection plate 42 is attached to the first outer frame member 30 at an end portion of the first outer frame member 30 on the +Z direction side. The second connection plate 42 is located at the second end portion EUb of the element unit EU. The second connection plate 42 has a fifth insertion hole 42c through which a fastening member 125 described later is passed. When seen in the +X direction, the fifth insertion hole 42c is exposed to a space (a storage space S3 which will be described later) inside the first outer frame member 30 in a state in which the fastening member 125 is removed.

Here, in the embodiment, the top plate member 34 of the first outer frame member 30 is formed in a tubular shape which penetrates in the X direction. An accommodation space S3 in which the control board 44 and the guide member 45 are accommodated is formed inside the top plate member 34. A lower wall of the top plate member 34 is formed in a plate shape along the X direction and the Y direction. The lower wall of the top plate member 34 forms the support plate 43 which supports the control board 44 and the guide member 45. The control board 44 is floated from the support plate 43 and is supported by a support member 46 attached to an upper surface of the support plate 43.

Figure 13:
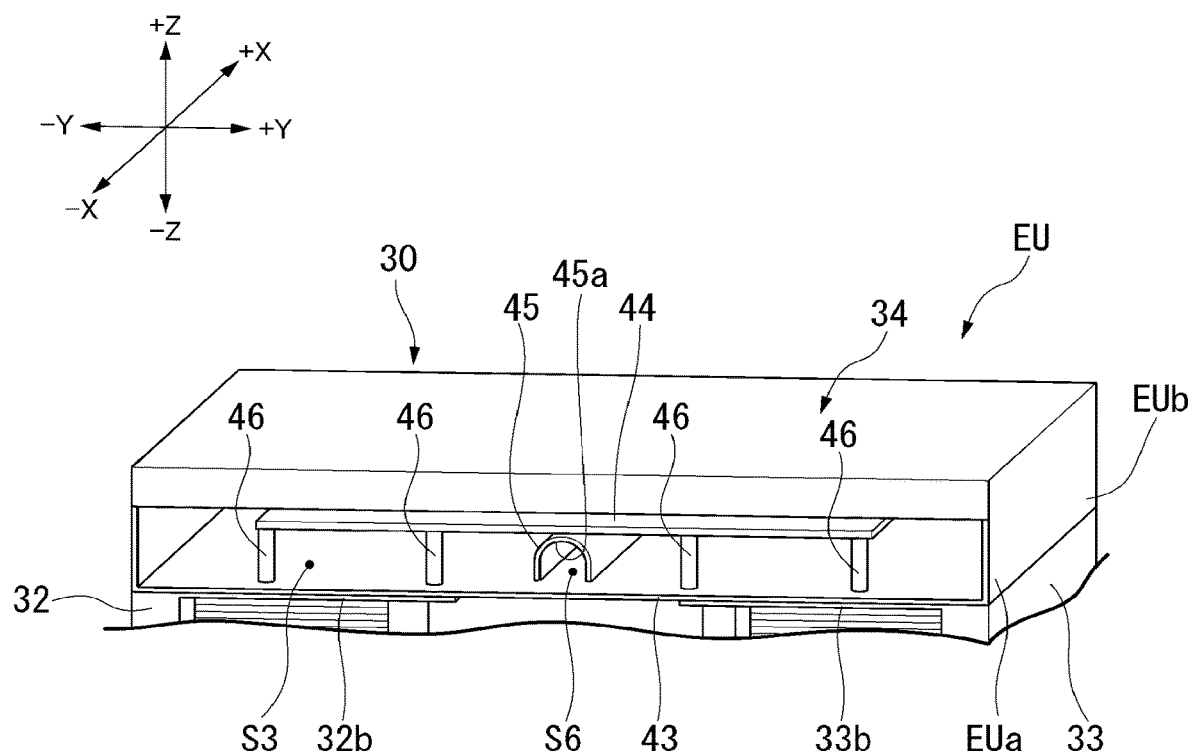
FIG. 13 is a perspective view showing a part of the element unit according to the embodiment.

FIG. 13 is a perspective view showing a part of the element unit EU. The control board 44 is, for example, a control board which gives gate signals to the switching elements SW1a to SW4a and SW1b to SW4b of the first and second module sets 70A and 70B.

The guide member 45 is provided between the support plate 43 and the control board 44. That is, the guide member 45 is disposed inside the element unit EU. For example, the guide member 45 is fixed to the support plate 43 by a fixing member (not shown) and is supported in a posture substantially parallel to the X direction. For example, the guide member 45 continuously extends from the vicinity of the first end portion EUa of the element unit EU to the second end portion EUb. However, the guide member 45 may be provided only in a partial section between the first end portion EUa and the second end portion EUb. A distance between an end portion of the guide member 45 on the +X direction side and the second connection plate 42 is, for example, equal to or less than (for example, smaller than a larger dimension of a diameter of a screw shaft and a thickness of a head portion of the fastening member 125) a distance at which the fastening member 125 does not fall off. The guide member 45 is formed of an insulating material, for example. An example of the guide member 45 is the insulating paper but is not limited thereto, and may be a synthetic resin member having rigidity (for example, a plastic member), a synthetic resin member having flexibility (for example, a film-shaped sheet), or the like. The same is applied to guide members 45A, 45B, 45C, and 45D which will be described in a second modified example. The guide member 45 is formed in, for example, a U shape (or an arc shape) which is open in the −Z direction. However, the guide member 45 may be formed in a tubular shape (a cylindrical shape or a rectangular tube shape) or may have another shape. The guide member 45 has an inner surface 45a (a guide surface) which extends in the X direction. A space S6 between the guide member 45 and the support plate 43 faces one fifth insertion hole 42c in the X direction. The guide member 45 is an example of a guide which is capable of guiding the fastening member 125 or a tool T (refer to FIG. 17) which holds the fastening member 125 toward the capacitor unit CU (in other words, toward the fifth insertion hole 42c) inside the element unit EU.

When the guide member 45 is provided, the fastening member 125 and the tool T can be stably and accurately guided toward a target position (for example, the fifth insertion hole 42c) by locating at least one of the fastening member 125 and the tool T for attaching the fastening member 125 along the inner surface 45a of the guide member 45 when the fastening member 125 is inserted into the fifth insertion hole 42c. Also, when the guide member 45 is provided, contact of the fastening member 125 and the tool T for attaching the fastening member 125 with components in the element unit EU such as the control board 44 can be suppressed when the fastening member 125 is inserted into the fifth insertion hole 42c. Therefore, protection (damage suppression) of components in the element unit EU such as the control board 44 can be achieved when the element unit EU and the capacitor unit CU are connected and disassembled. Furthermore, when the guide member 45 is provided, the falling-off of the fastening member 125 can be suppressed when the element unit EU and the capacitor unit CU are connected and disassembled. Here, when the guide member 45 is not provided, if the fastening member 125 falls off at the inner side (for example, the second end portion EUb) of the element unit EU, it may be difficult to take out the fastening member 125 to the outside of the element unit EU. On the other hand, when guide member 45 is provided, even if the fastening member 125 falls off, the fastening member 125 does not escape to the outside of the guide member 45, and it becomes easy to hold the fastening member 125 again with the tool T or to collect the fallen fastening member 125 outside the element unit EU as compared with a case in which the guide member 45 is not present. Accordingly, assemblability of the single-phase cell unit 6 can be improved.

<2.2.2 Main Constitution of Capacitor Unit>

Figure 14:
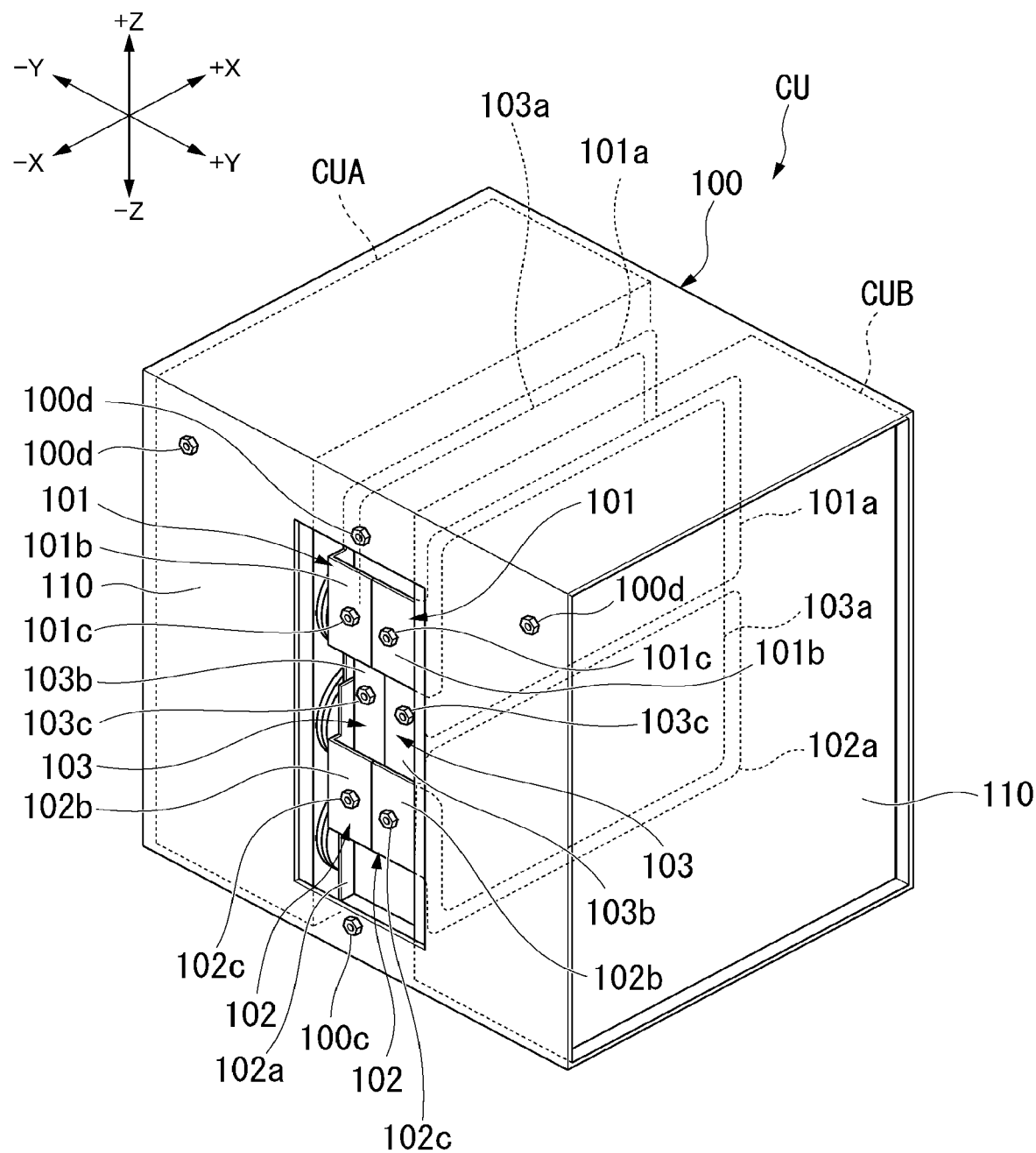
FIG. 14 is a perspective view showing a capacitor unit according to the embodiment.

Next, the capacitor unit CU will be described. FIG. 14 is a perspective view showing the capacitor unit CU. In practice, a second outer frame member 100 which will be described later has an opening which allows the air flowing between the fins 82 of the heat sinks 80A and 80B of the element unit EU to pass through the inside of the capacitor unit CU. Illustration of the opening is omitted in FIG. 14 and the drawings described later.

The capacitor unit CU includes the second outer frame member 100, a first capacitor unit CUA, a second capacitor unit CUB, and a plurality of buses 101, 102, and 103.

The second outer frame member 100 forms an outline of the capacitor unit CU. The second outer frame member 100 is formed in, for example, a rectangular tube shape which penetrates in the Y direction. The second outer frame member 100 is formed in a frame shape which surrounds the first capacitor unit CUA, the second capacitor unit CUB, and the plurality of buses 101, 102, and 103 and accommodates the components inside the second outer frame member 100. In the embodiment, the second outer frame member 100 is formed separately from the first outer frame member 30 of the element unit EU. The first outer frame member 30 and the second outer frame member 100 are separable from each other.

Figure 15:
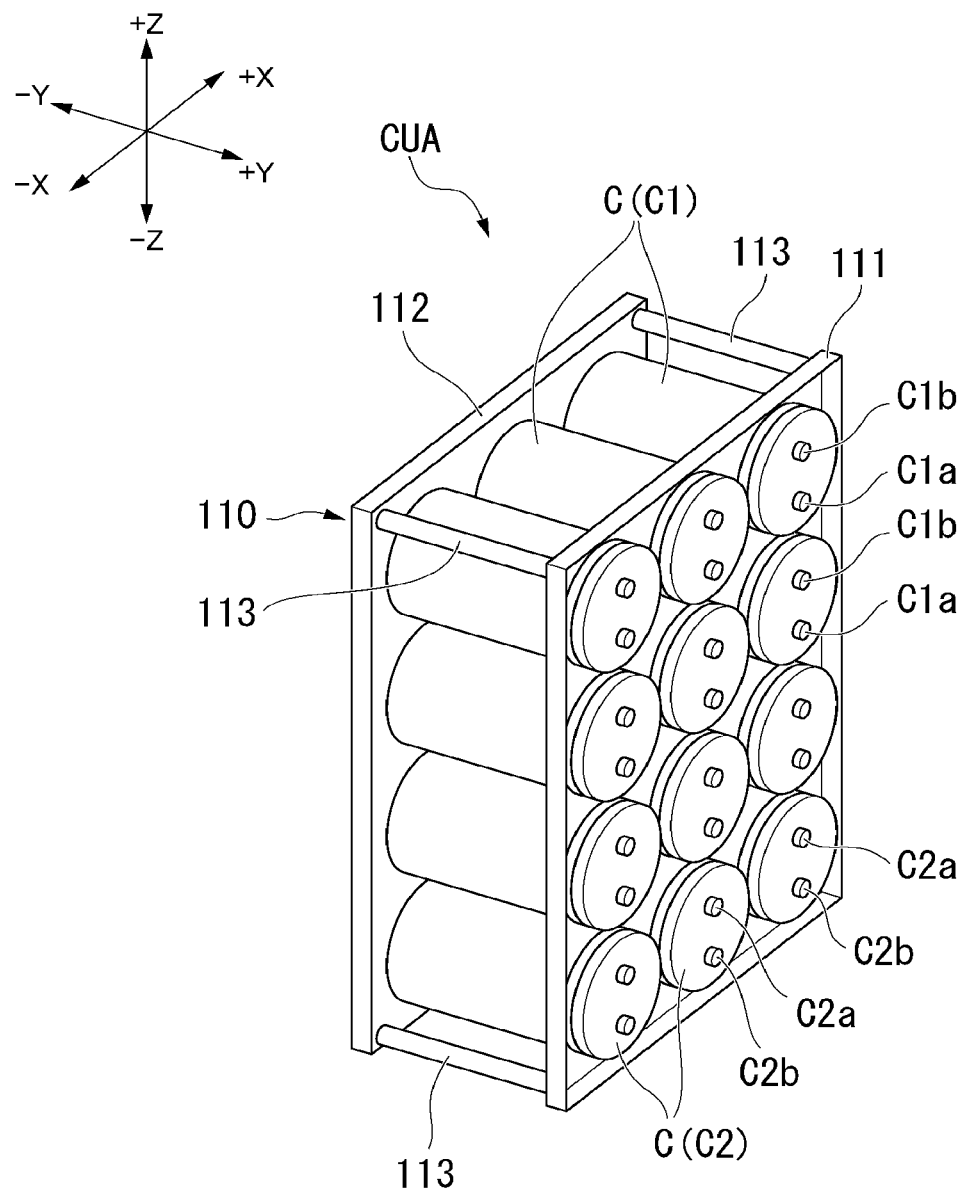
FIG. 15 is a perspective view showing a first capacitor unit according to the embodiment.

The first capacitor unit CUA includes a plurality of (for example, twelve) capacitors C and a support chassis 110 (refer to FIG. 15).

Each of the capacitors C is formed in, for example, a pillar shape (for example, a columnar shape, an elliptical columnar shape, or a prismatic shape) and is disposed with its axis line along the Y direction. The plurality of capacitors C are separately disposed in a plurality of stages (for example, four stages) in the Z direction. Further, the plurality (for example, three) of capacitors C are disposed in the X direction at each of the stages in the Z direction. The plurality of capacitors C include a plurality (for example, six) first capacitors C1 and a plurality (for example, six) second capacitors C2. Each of the first capacitor C1 includes a terminal C1a electrically connected to the positive electrode P and a terminal C1b connected to the neutral point C (refer to FIG. 15). Each of the second capacitor C2 has a terminal C2a electrically connected to the negative electrode N and a terminal C2b connected to the neutral point C (refer to FIG. 15).

The second capacitor unit CUB includes a plurality of (for example, twelve) capacitors C and a support chassis 110. The first capacitor unit CUA and the second capacitor unit CUB are disposed in the Y direction with a space therebetween. The second capacitor unit CUB has substantially the same constitution as that of the first capacitor unit CUA.

Next, the positive electrode bus 101, the negative electrode bus 102, and the neutral point bus 103 provided corresponding to the first capacitor unit CUA will be described. The positive electrode bus 101 includes a positive electrode main body portion 101a and a positive electrode connection portion 101b. The positive electrode main body portion 101a is formed in a plate shape along the X direction and the Z direction. The positive electrode main body portion 101a is connected to the terminals C1a of the plurality of first capacitors C1 included in the first capacitor unit CUA. The positive electrode connection portion 101b is bent in the +Y direction from an end portion of the positive electrode main body portion 101a on the −X direction side. That is, the positive electrode connection portion 101b is bent substantially parallel to the positive electrode connection portion 75b of the element unit EU. The positive electrode connection portion 101b is formed in a plate shape along the Y direction and the Z direction. The positive electrode connection portion 101b faces the positive electrode connection portion 75b of the element unit EU. The positive electrode connection portion 101b has a first fixing portion 101c to which the fastening member 121 is fixed. The first fixing portion 101c is, for example, a nut mounted on the positive electrode connection portion 101b. Further, the first fixing portion 101c may be a screw hole provided in the positive electrode connection portion 101b. In this case, the screw hole can be obtained by providing a hole in a plate forming the positive electrode connection portion 101b and forming a female screw on an inner peripheral surface of the hole. In addition, fixing portions 102c, 103c, 100c, and 100d which will be described later are substantially the same as the first fixing portion 101c, for example. That is, the fixing portions 102c, 103c, 100c, and 100d may be nuts mounted on the buses or may be screw holes provided in the buses. The first fixing portion 101c faces the first insertion hole 75c of the positive electrode connection portion 75b of the element unit EU. The positive electrode bus 101 is an example of a "second positive electrode bus." The positive electrode main body portion 101a is an example of a "second positive electrode main body portion." The positive electrode connection portion 101b is an example of a "second positive electrode connection portion."

The negative electrode bus 102 includes a negative electrode main body portion 102a and a negative electrode connection portion 102b. The negative electrode main body portion 102a is formed in a plate shape along the X direction and the Z direction. The negative electrode main body portion 102a is connected to the terminals C2a of the plurality of second capacitors C2 included in the first capacitor unit CUA. The negative electrode connection portion 102b is bent in the +Y direction from an end portion of the negative electrode main body portion 102a on the −X direction side. That is, the negative electrode connection portion 102b is bent substantially parallel to the negative electrode connection portion 76b of the element unit EU. The negative electrode connection portion 102b is formed in a plate shape along the Y direction and the Z direction. The negative electrode connection portion 102b faces the negative electrode connection portion 76b of the element unit EU. The negative electrode connection portion 102b has a second fixing portion 102c to which the fastening member 122 is fixed. The second fixing portion 102c faces the second insertion hole 76c of the negative electrode connection portion 76b of the element unit EU. The negative electrode bus 102 is an example of a "second negative electrode bus." The negative electrode main body portion 102a is an example of a "second negative electrode main body portion." The negative electrode connection portion 102b is an example of a "second negative electrode connection portion,"

The neutral point bus 103 has a neutral point main body portion 103a and a neutral point connection portion 103b. The neutral point main body portion 103a is formed in a plate shape along the X direction and the Z direction. In the embodiment, the neutral point main body portion 103a is disposed on the +Y direction side with respect to the positive electrode main body portion 101a and the negative electrode main body portion 102a and overlaps the positive electrode main body portion 101a and the negative electrode main body portion 102a in the Y direction with a gap for ensuring an insulation distance between the positive electrode main body portion 101a and the negative electrode main body portion 102a. However, a space between the positive electrode main body portion 101a and the negative electrode main body portion 102a and the neutral point main body portion 103a is not limited to space insulation but may be barrier insulation. The neutral point main body portion 103a is electrically connected to the terminals C1b of the plurality of first capacitors C1 and the terminals C2b of the plurality of second capacitors C2 included in the first capacitor unit CUA. The neutral point connection portion 103b is bent in the +Y direction from an end portion of the neutral point main body portion 103a on the −X direction side. That is, the neutral point connection portion 103b is bent substantially parallel to the neutral point connection portion 77b of the element unit EU. The neutral point connection portion 103b is formed in a plate shape along the Y direction and the Z direction. The neutral point connection portion 103b faces the neutral point connection portion 77b of the element unit EU. The neutral point connection portion 103b has the third fixing portion 103c to which the fastening member 123 is fixed. The third fixing portion 103c faces the third insertion hole 77c of the neutral point connection portion 77b of the element unit EU. The neutral point bus 103 is an example of a "second neutral point bus." The neutral point main body portion 103a is an example of a "second neutral point main body portion." The neutral point connection portion 103b is an example of a "second neutral point connection portion".

Next, the positive electrode bus 101, the negative electrode bus 102, and the neutral point bus 103 provided corresponding to the second capacitor unit CUB will be described. The positive electrode bus 101, the negative electrode bus 102, and the neutral point bus 103 provided corresponding to the second capacitor unit CUB are substantially the same as the positive electrode bus 101, the negative electrode bus 102, and the neutral point bus 103 provided corresponding to the first capacitor unit CUA. Therefore, for explanation regarding the positive electrode bus 101, the negative electrode bus 102, and the neutral point bus 103 provided corresponding to the second capacitor unit CUB, in the above explanation regarding the positive electrode bus 101, the negative electrode bus 102, and the neutral point bus 103 provided corresponding to the first capacitor unit CUA, the "+Y direction" and the "−Y direction" may be replaced with each other.

The positive electrode bus 101 provided corresponding to the second capacitor unit CUB is an example of a "fourth positive electrode bus." The positive electrode main body portion 101a provided corresponding to the second capacitor unit CUB is an example of a "fourth positive electrode main body portion." The positive electrode connection portion 101b provided corresponding to the second capacitor unit CUB is an example of a "fourth positive electrode connection portion." The positive electrode connection portion 101b is bent in the −Y direction from the positive electrode main body portion 101a.

The negative electrode bus 102 provided corresponding to the second capacitor unit CUB is an example of a "fourth negative electrode bus." The negative electrode main body portion 102a provided corresponding to the second capacitor unit CUB is an example of a "fourth negative electrode main body portion." The negative electrode connection portion 102b provided corresponding to the second capacitor unit CUB is an example of a "fourth negative electrode connection portion." The negative electrode connection portion 102b is bent in the −Y direction from the negative electrode main body portion 102a.

The neutral point bus 103 provided corresponding to the second capacitor unit CUB is an example of a "fourth neutral point bus." The neutral point main body portion 103a provided corresponding to the second capacitor unit CUB is an example of a "fourth neutral point main body portion." The neutral point connection portion 103b provided corresponding to the second capacitor unit CUB is an example of a "fourth neutral point connection portion." The neutral point connection portion 103b is bent in the −Y direction from the neutral point main body portion 103a.

The fourth fixing portion 100c and a plurality of fifth fixing portions 100d are provided on a front surface (a surface on the −X direction side) of the second outer frame member 100. The fourth fixing portion 100c faces the fourth insertion hole 41c of the first connection plate 41 of the element unit EU. The fastening member 124 which has passed through the fourth insertion hole 41c is fixed to the fourth fixing portion 100c. The fifth fixing portion 100d faces the fifth insertion hole 42c of the second connection plate 42 of the element unit EU. The fastening member 125 which has passed through the fifth insertion hole 42c is fixed to the fifth fixing portion 100d.

Next, the support chassis 110 will be described. FIG. 15 is a perspective view showing the first capacitor unit CUA. The support chassis 110 includes a first support plate 111, a second support plate 112, and a plurality of connection rods 113. Each of the first support plate 111 and the second support plate 112 is formed in a plate shape along the X direction and the Z direction. The first support plate 111 is attached to end portions of the plurality of capacitors C on the +Y direction side and supports the plurality of capacitors C. The second support plate 112 is attached to end portions of the plurality of capacitors C on the −Y direction side and supports the plurality of capacitors C. The plurality of connection rods 113 connect the first support plate 111 to the second support plate 112. However, one of the first support plate 111 and the second support plate 112 and the connection rod 113 may be omitted.

In the embodiment, the support chassis 110 is formed separately from the first support chassis 32 and the second support chassis 33 of the element unit EU. The support chassis 110 can be separated from the first support chassis 32 and the second support chassis 33. The support chassis 110 of the second capacitor unit CUB is substantially the same as the support chassis 110 of the first capacitor unit CUA.

Figure 16:
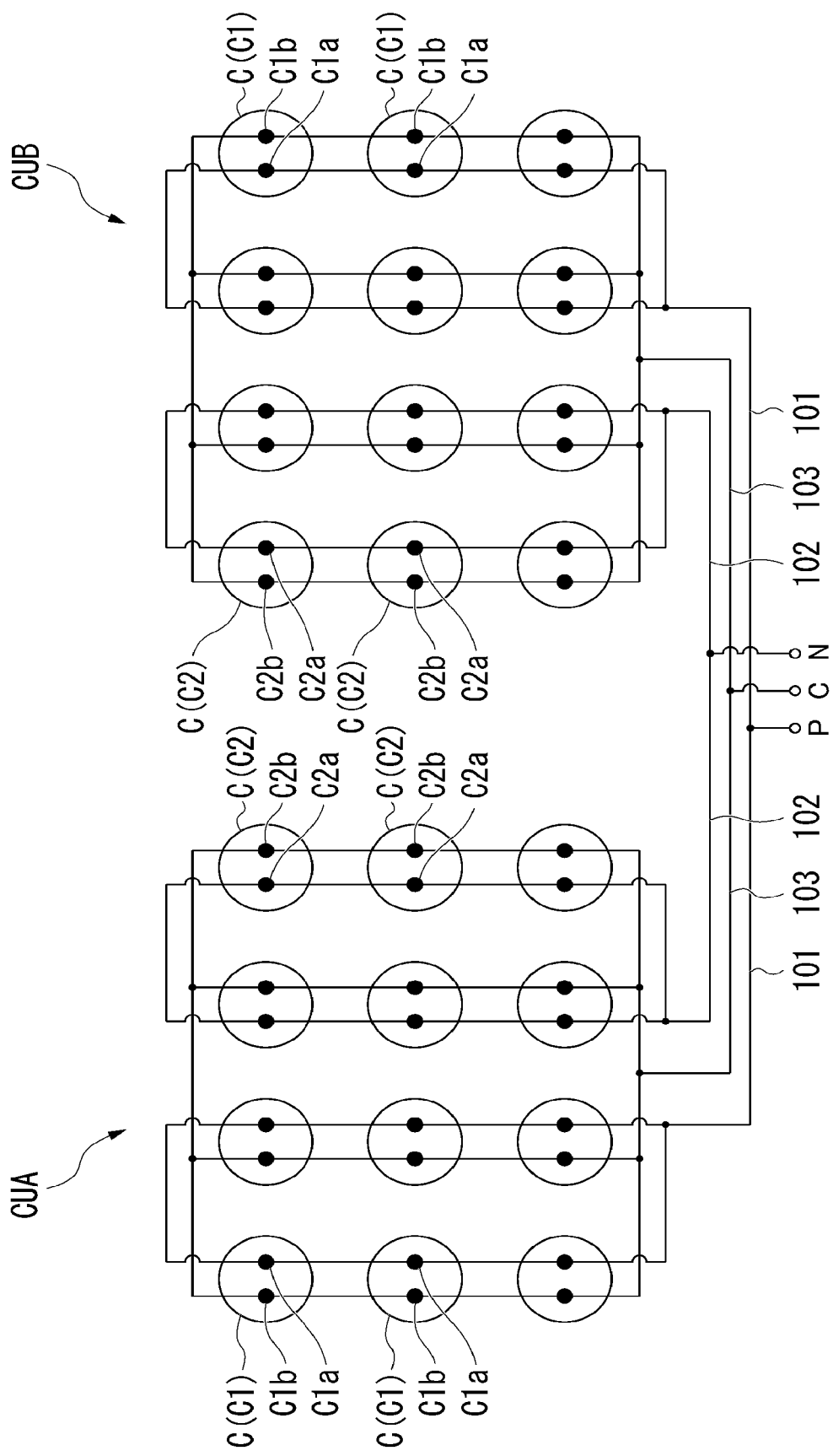
FIG. 16 is a diagram showing an electrical connection relationship of components included in the capacitor unit according to the embodiment.

FIG. 16 is a diagram showing an electrical connection relationship of components included in the capacitor unit CU. The plurality of first capacitors C1 are electrically connected to each other in series or in parallel. The plurality of second capacitors C2 are electrically connected to each other in series or in parallel.

<2.2.3 Connection Structure Between Element Unit and Capacitor Unit>

Figure 17:
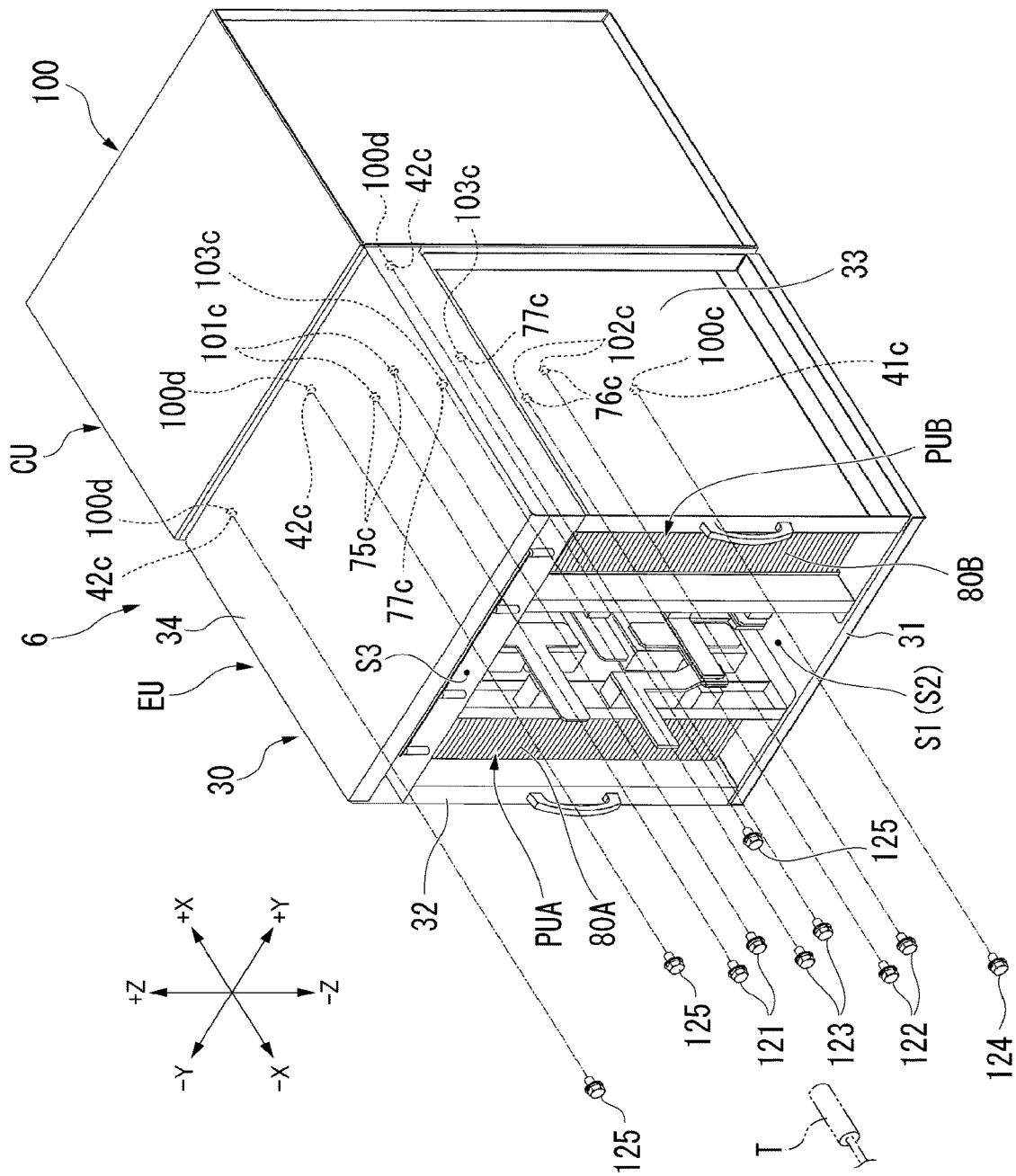
FIG. 17 is a perspective view showing the element unit, the capacitor unit, and a fastening member which connects them according to the embodiment.

FIG. 17 is a perspective view showing the element unit EU, the capacitor unit CU, and the fastening members 121, 122, 123, 124, and 125 which connect them. FIG. 17 shows a state in which the front surface cover 51 of the element unit EU is removed from the first outer frame member 30. The fastening members 121, 122, 123, 124, and 125 are provided in the X direction. The fastening members 121, 122, 123, 124, and 125 are, for example, screws or bolts but are not limited thereto. The fastening members 121, 122, 123, 124, and 125 are inserted into the access space S1 with a long socket wrench, for example.

The fastening member 121 is inserted into the access space S1 from the outside of the element unit EU in a state in which the element unit EU and the capacitor unit CU are arranged in the X direction and the front surface cover 51 is not attached to the first outer frame member 30. Additionally, the fastening member 121 passes through the first insertion hole 75c of the positive electrode connection portion 75b through the access space S1 in the +X direction. The fastening member 121 which has passed through the first insertion hole 75c is engaged with and fixed to the first fixing portion 101c of the positive electrode connection portion 101b of the capacitor unit CU. Thus, the positive electrode connection portion 75b of the element unit EU and the positive electrode connection portion 101b of the capacitor unit CU are removably connected by the fastening member 121, and the positive electrode bus 75 of the element unit EU and the positive electrode bus 101 of the capacitor unit CU are physically and electrically connected. The fastening member 121 attached to the positive electrode bus 75 of the first module set 70A is an example of each of a "first fastening member" and a "first fastening element." The fastening member 121 attached to the positive electrode bus 75 of the second module set 70B is an example of each of a "third fastening member" and a "third fastening element."

The fastening member 122 is inserted into the access space S1 from the outside of the element unit EU in the state in which the element unit EU and the capacitor unit CU are arranged in the X direction and the front surface cover 51 is not attached to the first outer frame member 30. Additionally, the fastening member 122 passes through the second insertion hole 76c of the negative electrode connection portion 76b through the access space S1 in the +X direction. The fastening member 122 which has passed through the second insertion hole 76c of the negative electrode connection portion 76b is engaged with and fixed to the second fixing portion 102c of the negative electrode connection portion 102b of the capacitor unit CU. Thus, the negative electrode connection portion 76b of the element unit EU and the negative electrode connection portion 102b of the capacitor unit CU are removably connected by the fastening member 122, and the negative electrode bus 76 of the element unit EU and the negative electrode bus 102 of the capacitor unit CU are physically and electrically connected. The fastening member 122 attached to the negative electrode bus 76 of the first module set 70A is an example of each of a "second fastening member" and a "second fastening element." The fastening member 122 attached to the negative electrode bus 76 of the second module set 70B is an example of each of a "fourth fastening member" and a "fourth fastening element."

The fastening member 123 is inserted into the access space S1 from the outside of the element unit EU in the state in which the element unit EU and the capacitor unit CU are arranged in the X direction and the front surface cover 51 is not attached to the first outer frame member 30. Additionally, the fastening member 123 passes through the third insertion hole 77c of the neutral point connection portion 77b through the access space S1 in the +X direction. The fastening member 123 which has passed through the third insertion hole 77c of the neutral point connection portion 77b is engaged with and fixed to the third fixing portion 103c of the neutral point connection portion 103b of the capacitor unit CU. Thus, the neutral point connection portion 77h of the element unit EU and the neutral point connection portion 103b of the capacitor unit CU are removably connected by the fastening member 123, and the neutral point bus 77 of the element unit EU and the neutral point bus 103 of the capacitor unit CU are physically and electrically connected. The fastening member 123 attached to the neutral point bus 77 of the first module set 70A is an example of each of a "fifth fastening member" and a "fifth fastening element." The fastening member 123 attached to the neutral point bus 77 of the second module set 70B is an example of each of a "sixth fastening member" and a "sixth fastening element."

The fastening member 124 is inserted into the access space S1 from the outside of the element unit EU in the state in which the element unit EU and the capacitor unit CU are arranged in the X direction and the front surface cover 51 is not attached to the first outer frame member 30. Additionally, the fastening member 124 passes through the fourth insertion hole 41c of the first connection plate 41 through the access space S1 in the +X direction. The fastening member 124 which has passed through the fourth insertion hole 41c of the first connection plate 41 is engaged with and fixed to the fourth fixing portion 100c of the capacitor unit CU. Thus, the first outer frame member 30 and the second outer frame member 100 are removably connected by the fastening member 124.

The fastening member 125 is inserted into the accommodation space S3 from the outside of the element unit EU in the state in which the element unit EU and the capacitor unit CU are arranged in the X direction and the front surface cover 51 is not attached to the first outer frame member 30. Additionally, the fastening member 125 passes through the fifth insertion hole 42c of the second connection plate 42 through the accommodation space S3 in the +X direction. The fastening member 125 which has passed through the fifth insertion hole 42c of the second connection plate 42 is engaged with and fixed to the fifth fixing portion 100d of the capacitor unit CU. Thus, the first outer frame member 30 and the second outer frame member 100 are removably connected by the fastening member 125.

<2.2.4 Front Surface Cover>

Figure 18:
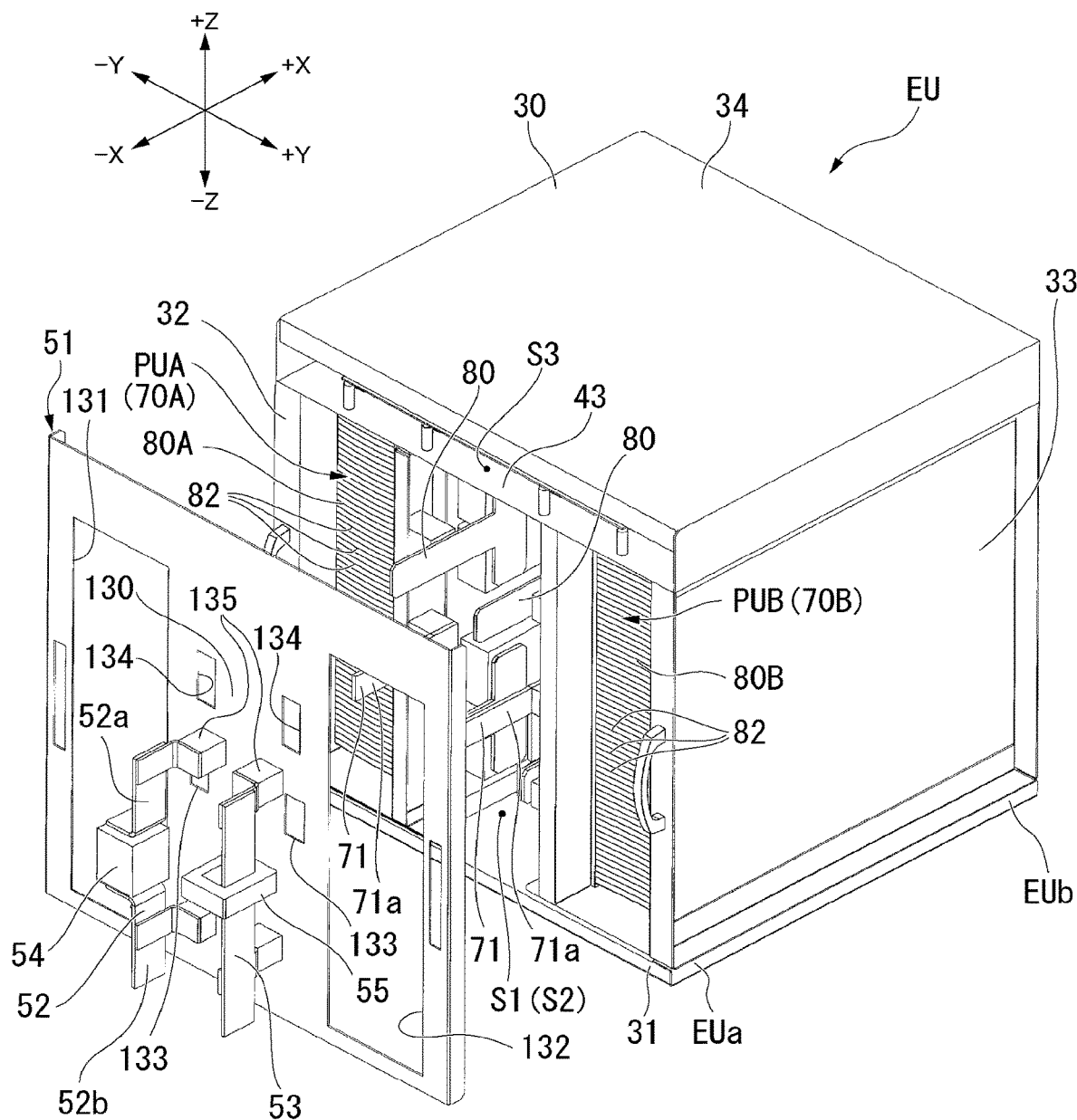
FIG. 18 is a partially exploded perspective view showing the element unit according to the embodiment.

Next, the front surface cover 51 of the element unit EU will be described. FIG. 18 is a partially exploded perspective view showing the element unit EU. The front surface cover 51 is attached to the first outer frame member 30 after the element unit EU and the capacitor unit CU are connected by the fastening members 121, 122, 123, 124, and 125. The front surface cover 51 is removably attached to the first outer frame member 30 by a fastening member (not shown). The front surface cover 51 has a size which covers substantially the entire front surface of the first outer frame member 30. The front surface cover 51 includes a wind shielding portion (a cover portion) 130, a first opening 131, a second opening 132, a third opening 133, and a fourth opening 134.

The wind shielding portion 130 covers at least a part of the access space S1 in the X direction. That is, the wind shielding portion 130 closes the access space S1 by attaching the front surface cover 51 to the first outer frame member 30. In the embodiment, the wind shielding portion 130 covers substantially the entire access space S1. However, the wind shielding portion 130 may cover only a part of the access space S1. It is difficult for the cooling air flowing in the housing 20 toward the element unit EU to flow into the access space S1 due to the wind shielding portion 130. As a result, more cooling air is guided to the gaps between the plurality of fins 82 of the first heat sink 80A and the gaps between the plurality of fins 82 of the second heat sink 80B.

The first opening 131 faces the plurality of fins 82 of the first heat sink 80A in the X direction. The second opening 132 faces the plurality of fins 82 of the second heat sink 80B in the X direction. Therefore, the cooling air flowing in the housing 20 toward the element unit EU is supplied to the gaps between the plurality of fins 82 of the first heat sink 80A and the gaps between the plurality of fins 82 of the second heat sink 80B through the first opening 131 and the second opening 132. That is, more wind and more cooling air passes through the gaps between the plurality of fins 82 of the first heat sink 80A and the gaps between the plurality of fins 82 of the second heat sink 80B by covering at least a part of the access space S1 with the wind shielding portion 130.

The third opening 133 is provided at a position corresponding to the first portion 71a of the relay bus 71. When the front surface cover 51 is attached to the first outer frame member 30, the first portion 71a of the relay bus 71 passes through the third opening 133 and protrudes toward the −X direction side from the front surface cover 51. In the embodiment, the first portion 71a of the relay bus 71 extends in the −X direction. According to such a constitution, the relay bus 71 can easily pass through the third opening 133.

The fourth opening 134 is provided at a position corresponding to the second terminal bus 80. When the front surface cover 51 is attached to the first outer frame member 30, the second terminal bus 80 passes through the fourth opening 134 and protrudes toward the −X direction side from the front surface cover 51. In the embodiment, the second terminal bus 80 extends in the −X direction. According to such a constitution, the second terminal bus 80 can easily pass through the fourth opening 134.

The first connection bus 52 is attached to an outer surface of the front surface cover 51 via a support tool 135. The first connection bus 52 is located outside (the −X direction side) of the first outer frame member 30 in a state in which the front surface cover 51 is attached to the first outer frame member 30. The first connection bus 52 is connected to the relay bus 71 of the first module set 70A which protrudes toward the −X direction side from the front surface cover 51 through the third opening 133. In the embodiment, the first connection bus 52 is constituted by the first member 52a and the second member 52b which are separate components. The fuse 54 which will be described later is sandwiched between the first member 52a and the second member 52b.

The second connection bus 53 is attached to the outer surface of the front surface cover 51 via the support tool 135. The second connection bus 53 is located outside (the −X direction side) of the first outer frame member 30 in the state in which the front surface cover 51 is attached to the first outer frame member 30. The second connection bus 53 is connected to the relay bus 71 of the second module set 70B which protrudes toward the −X direction side from the front surface cover 51 through the third opening 133.

The fuse 54 is provided between the first member 52a and the second member 52b of the first connection bus 52 and is electrically connected in series between the first member 52a and the second member 52b. Thus, the fuse 54 is provided integrally with the front surface cover 51. When an overcurrent flows through the element unit EU, the fuse 54 blocks a path through which the current flows and protects the element unit EU. The fuse 54 is disposed outside the first outer frame member 30 in the state in which the front surface cover 51 is attached to the first outer frame member 30.

Here, the fuse 54 becomes easy to operate when a temperature increases. Therefore, it is preferable that the fuse 54 does not reach a high temperature. In the embodiment, since the fuse 54 is located outside the first outer frame member 30, the fuse 54 is exposed to the cooling air flowing in the housing 20 and is directly cooled by the cooling air. Thus, the temperature of the fuse 54 hardly increase. As a result, unintended operation or deterioration of the fuse 54 can be suppressed.

The HCT 55 is attached to the outer surface of the front surface cover 51 directly or via a support tool. Thus, the HCT 55 is provided integrally with the front surface cover 51. The second connection bus 53 passes through the HCT 55. The HCT 55 detects a current value flowing through the second connection bus 53. The HCT 55 is disposed outside the first outer frame member 30 in the state in which the front surface cover 51 is attached to the first outer frame member 30.

Here, the current value detected by the HCT 55 needs to be corrected according to a temperature of the HCT 55. Therefore, it is preferable that the temperature of the HCT 55 does not change as much as possible. In the embodiment, since the HCT 55 is located outside the first outer frame member 30, the HCT 55 is exposed to the cooling air flowing in the housing 20 and is directly cooled by the cooling air. Thus, the temperature of the HCT 55 hardly changes. As a result, detection accuracy of the current value by the HCT 55 can be increased. In addition, deterioration of the HCT 55 due to the temperature rise can be suppressed.

<2.2.5 Fixing Structure of Single-Phase Cell Unit to Shelf Plate>

Figure 19:
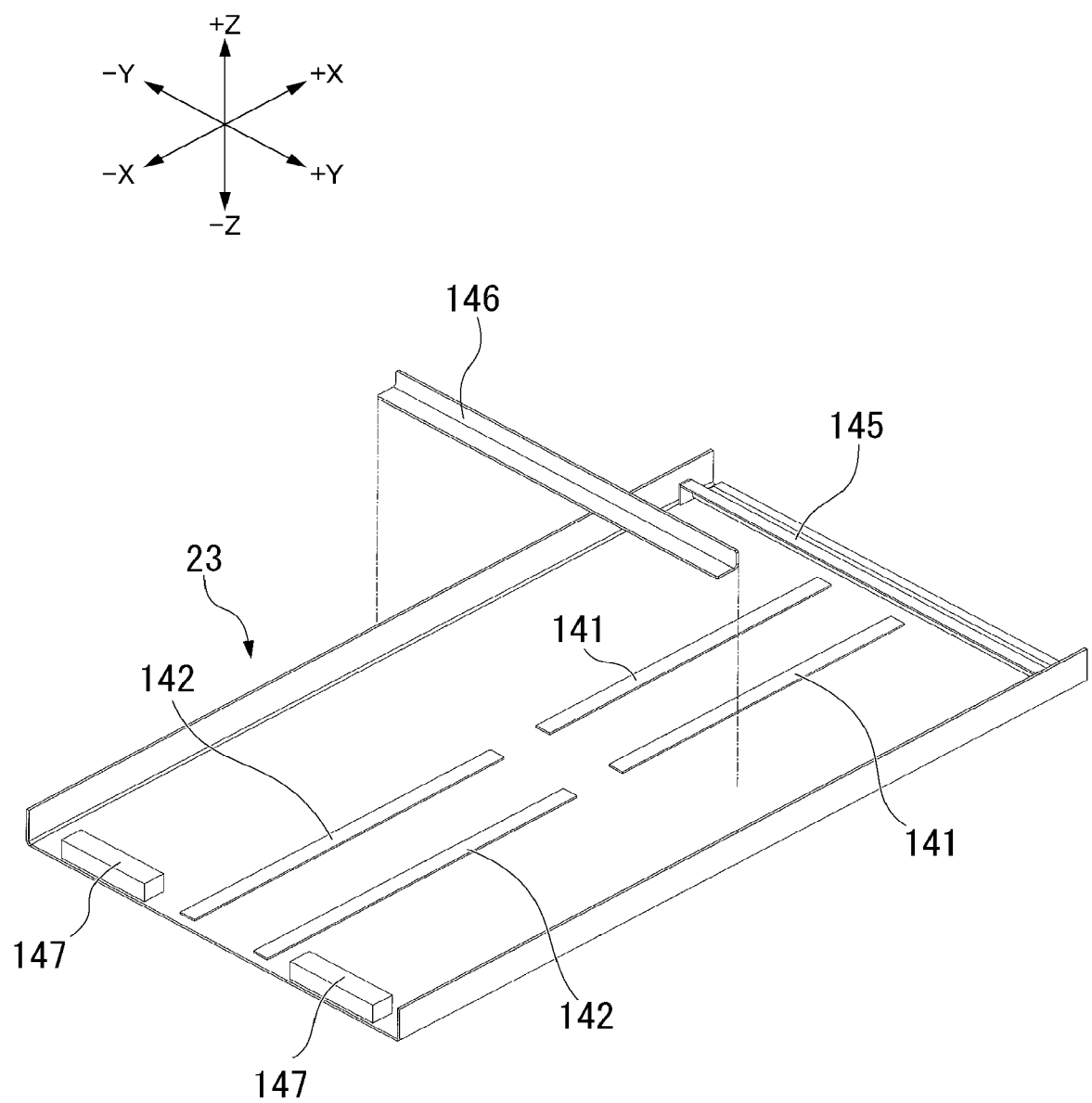
FIG. 19 is a perspective view showing a shelf plate according to the embodiment.

Next, a fixing structure of the single-phase cell unit 6 to the shelf plate 23 will be described. FIG. 19 is a perspective view showing the shelf plate 23. The drive device 1 includes a plurality of first guides 141, a plurality of second guides 142, a plurality of third guides 143 (refer to FIG. 20), a plurality of fourth guides 144 (refer to FIG. 20), a rear fixing member 145, an intermediate fixing member 146, and a front fixing member 147 as the fixing structure of the single-phase cell unit 6 to the shelf plate 23. The front fixing member 147 is fixed to the first end portion EUa of the element unit EU by a fastening member such as a bolt or a screw. Further, the front fixing member 147 is fixed to the shelf plate 23 by a fastening member such as a bolt or a screw. Thus, the front fixing member 147 fixes the first end portion EUa of the element unit EU to the shelf plate 23.

The first guides 141 are attached in a region corresponding to the capacitor unit CU in an upper surface of the shelf plate 23. The first guides 141 extend linearly in the X direction. For example, two first guides 141 are disposed substantially parallel to each other with a gap therebetween in the Y direction.

The second guides 142 are attached in a region corresponding to the element unit EU in the upper surface of the shelf plate 23. The second guides 142 extend linearly in the X direction. For example, two second guides 142 are disposed substantially parallel to each other with a gap therebetween in the Y direction. The first guides 141, the second guides 142, and the third guides 143 and the fourth guides 144 which will be described later are formed of, for example, a nylon resin and have a small friction coefficient.

Figure 20:
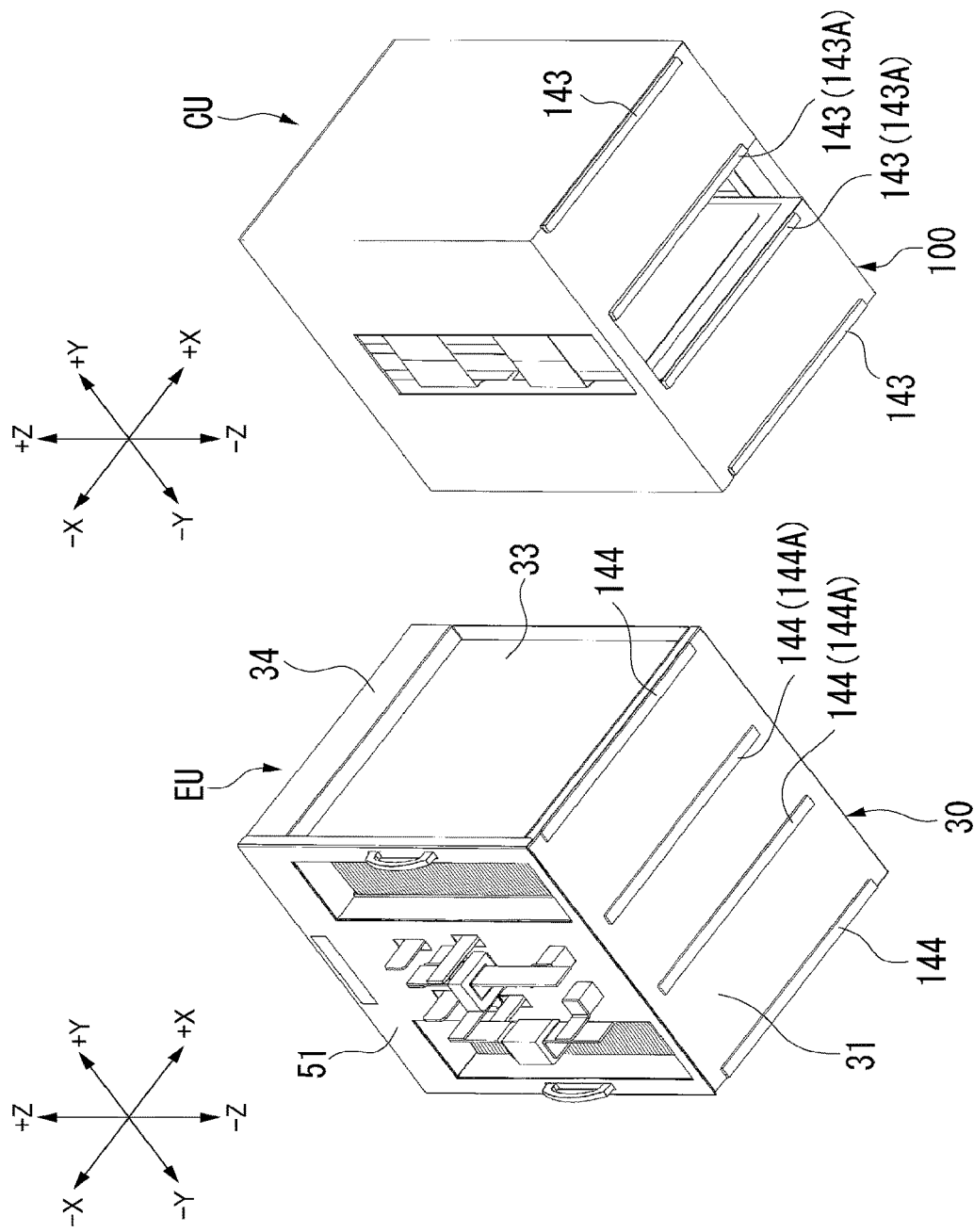
FIG. 20 is a perspective view showing lower surfaces of the element unit and the capacitor unit according to the embodiment.
Figure 21:
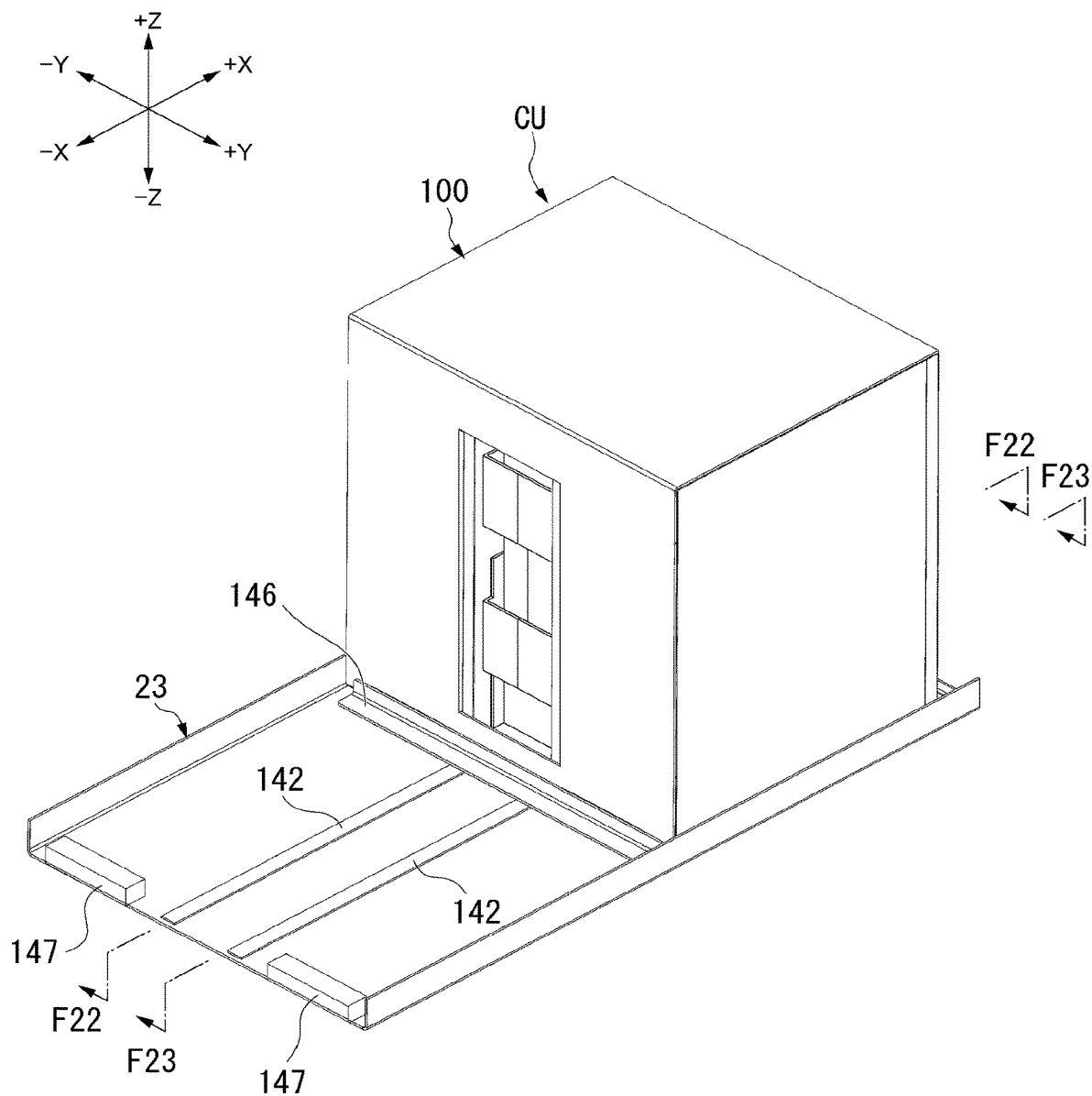
FIG. 21 is a perspective view showing a state in which the capacitor unit is placed on the shelf plate according to the embodiment.

FIG. 20 is a perspective view showing lower surfaces of the element unit EU and the capacitor unit CU. In FIG. 20 and FIG. 21 described later, illustration of the fixing portions 101c, 102c, 103c, 100c, and 100d is omitted. The plurality of third guides 143 are attached to the lower surface of the capacitor unit CU. The third guides 143 extend linearly in the X direction. The plurality of third guides 143 are disposed substantially parallel to each other with a gap therebetween in the Y direction. The plurality of third guides 143 includes two third guides 143A disposed in the vicinity of the first guide 141. Two first guides 141 provided on the shelf plate 23 enter between the two third guides 143A. The two third guides 143A are guided in the +X direction by the two first guides 141 in a state in which positions thereof in the Y direction are restricted. Therefore, a position of the capacitor unit CU in the Y direction is accurately determined on the shelf plate 23, and the position in the Y direction is fixed. Instead of the constitution in which the two first guides 141 enter between the two third guides 143A, a constitution in which the two third guides 143A enter between the two first guides 141 may be adopted.

Similarly, the plurality of fourth guides 144 are attached to the lower surface of the element unit EU. The fourth guides 144 extend linearly in the X direction. The plurality of fourth guides 144 are disposed substantially parallel to each other with a gap therebetween in the Y direction. The plurality of fourth guides 144 include two fourth guides 144A disposed in the vicinity of the second guide 142. Two second guides 142 provided on the shelf plate 23 enter between the two fourth guides 144A. The two fourth guides 144A are guided in the +X direction by the two second guides 142 in a state in which position thereof in the Y direction are restricted. Therefore, a position of the element unit EU in the Y direction is accurately determined on the shelf plate 23, and the position in the Y direction is fixed. As a result, the insertion holes 75c, 76c, 77c, 41c, and 42c of the element unit EU and the fixing portions 101c, 102c, 103c, 100c, and 100d of the capacitor unit CU are aligned with high accuracy. Instead of the constitution in which the two second guides 142 enter between the two fourth guides 144A, a constitution in which the two fourth guides 144A enter between the two second guides 142 may be adopted.

Figure 22:
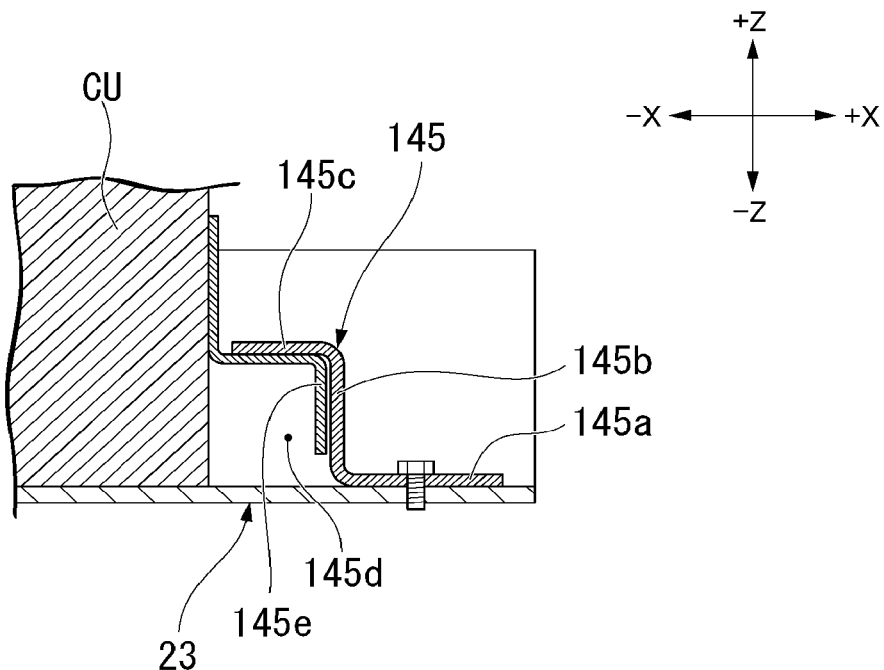
FIG. 22 is a cross-sectional view of the shelf plate shown in FIG. 21 taken along line F22-F22.

FIG. 21 is a perspective view showing a state in which the capacitor unit CU is placed on the shelf plate 23. FIG. 22 is a cross-sectional view of the shelf plate 23 shown in FIG. 21 taken along line F22-F22.

As shown in FIG. 22, the rear fixing member 145 includes a first portion 145a, a second portion 145b, and a third portion 145c. The first portion 145a is formed in a plate shape substantially parallel to the upper surface of the shelf plate 23 and is fixed to the shelf plate 23. The second portion 145b stands up in the +Z direction from an end portion of the first portion 145a on the −X direction side. The third portion 145c extends in the −X direction from an end portion of the second portion 145b on the +Z direction side. A recess 145d into which a part of the capacitor unit CU is inserted is formed between the third portion 145c and the upper surface of the shelf plate 23. An end portion of the capacitor unit CU on the +X direction side has an engagement portion 145e inserted into a recess 145d formed by the rear fixing member 145. For example, the engagement portion 145e is fixed to a surface of the second outer frame member 100 of the capacitor unit CU on the +X direction side by a fastening member such as a screw or a bolt. The engagement portion 145e is inserted into the recess 145d and is supported from above by the third portion 145c of the rear fixing member 145. As a result, the end portion of the capacitor unit CU on the +X direction side is fixed in the Z direction and the +X direction.

Figure 23:
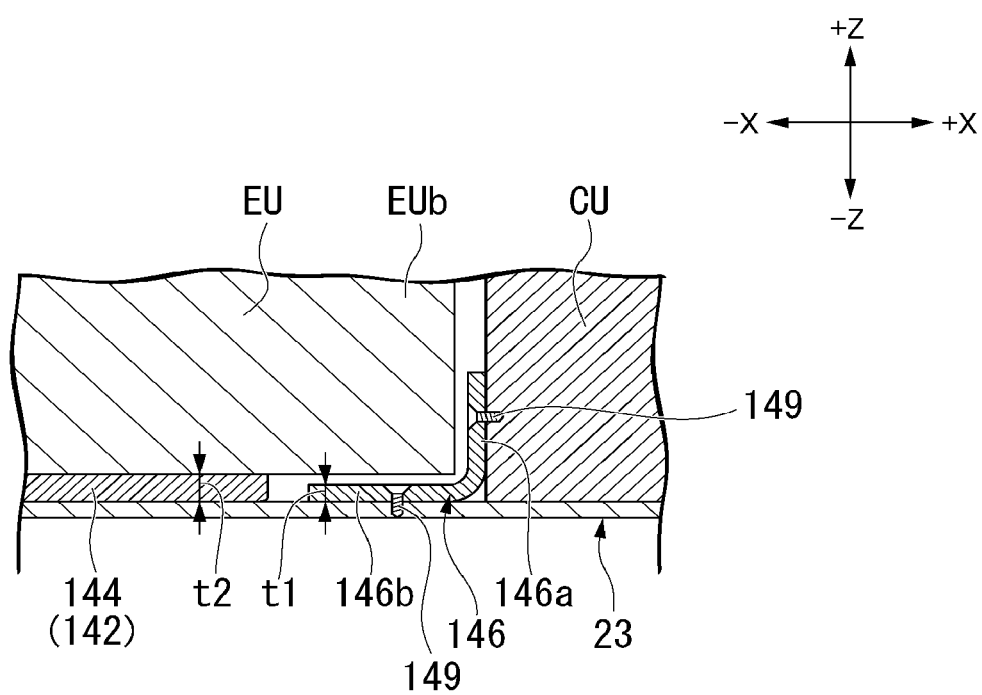
FIG. 23 is a cross-sectional view of the shelf plate shown in FIG. 21 taken along line F23-F23.

FIG. 23 is a cross-sectional view of the shelf plate 23 shown in FIG. 21 taken along line F23-F23. FIG. 23 also shows the element unit EU for convenience of explanation. The intermediate fixing member 146 is fixed to the capacitor unit CU and the shelf plate 23 after the capacitor unit CU is placed on the shelf plate 23 and before the element unit EU is placed on the shelf plate 23.

More specifically, the intermediate fixing member 146 has a first portion 146a and a second portion 146b. The first portion 146a is located between the element unit EU and the capacitor unit CU. The first portion 146a is formed in a plate shape substantially parallel to a front surface of the capacitor unit CU and is fixed to the capacitor unit CU by a fastening member 149 such as a flat head screw. The second portion 146b is formed in a plate shape substantially parallel to the upper surface of the shelf plate 23 and is fixed to the shelf plate 23 by a fastening member 149 such as a flat head screw. An end portion of the capacitor unit CU on the −X direction side is fixed to the shelf plate 23 in the X direction, the Y direction and the Z direction by providing the intermediate fixing member 146. As described above, since the capacitor unit CU and the element unit EU are fixed by the above-described method after the capacitor unit CU is fixed, the entire single-phase cell unit 6 is fixed in the X direction, the Y direction and the Z direction.

Here, a thickness t1 of the second portion 146b of the intermediate fixing member 146 in the Z direction is thinner than a thickness t2 of the fourth guide 144 (or the second guide 142) in the Z direction. Therefore, the intermediate fixing member 146 does not interfere with the element unit EU in a state in which the element unit EU is placed on the shelf plate 23. At least a part of the second portion 146b is located below the element unit EU. That is, at least a part of the second portion 146*b* is disposed in a gap between the lower surface of the element unit EU formed by providing the fourth guide 144 (or the second guide 142) and the upper surface of the shelf plate 23. Further, when a fastening member 149 such as a flat head screw is used, it is possible to avoid interference between the fastening member 149 and the element unit EU.

Next, details of some components of the element unit EU will be described.

<2.2.6 First Terminal Bus and Second Terminal Bus>

Figure 24:
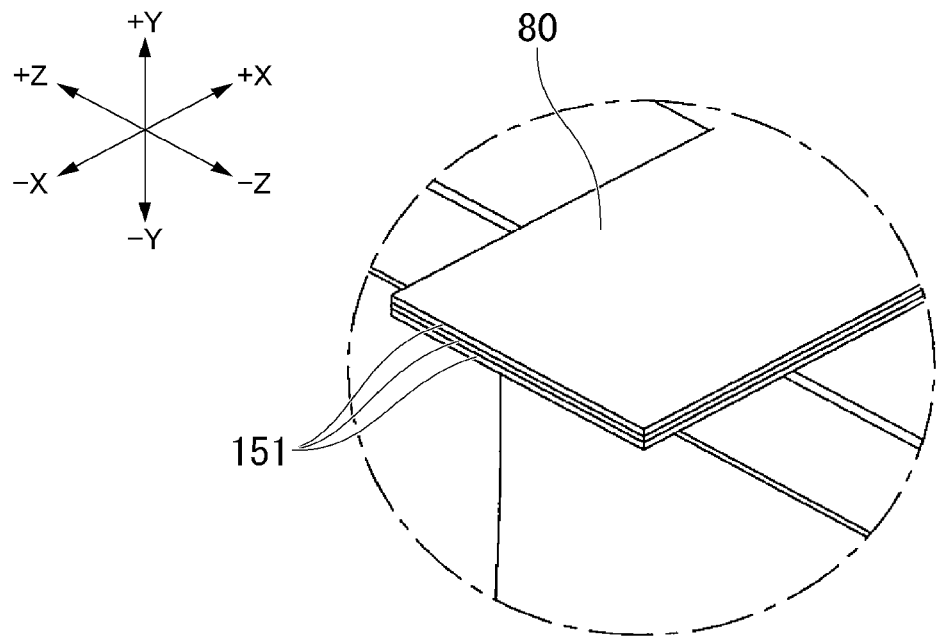
FIG. 24 is an enlarged perspective view showing a region surrounded by line F24 in FIG. 8.

First, the first terminal bus 72 and the second terminal bus 80 will be described. FIG. 24 is an enlarged perspective view showing a region surrounded by line F24 in FIG. 8. The first terminal bus 72 is formed by stacking a plurality of thin plate materials 151 in the Y direction.

Figure 25:
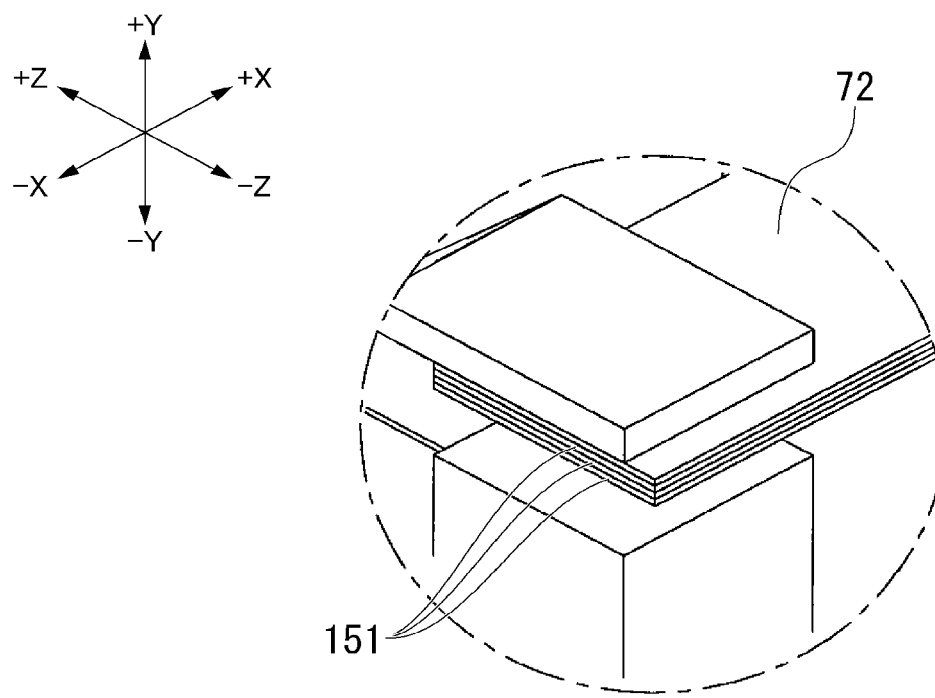
FIG. 25 is an enlarged perspective view showing a region surrounded by line F25 in FIG. 8.

FIG. 25 is an enlarged perspective view showing a region surrounded by line F25 in FIG. 8. The second terminal bus 80 is formed by stacking a plurality of thin plate materials 151 in the Y direction.

According to such a constitution, flexibility of the first terminal bus 72 and the second terminal bus 80 can be enhanced as compared with a case in which each of the first terminal bus 72 and the second terminal bus 80 is formed of one plate materials. When the flexibility of the first terminal bus 72 and the second terminal bus 80 is increased, the first terminal buses 72 and the second terminal buses 80 can be deformed by following component tolerances included in the components of the first module set 70A, or a tolerance between an external connection bus provided outside the single-phase cell unit 6 and the single-phase cell unit 6, and thermal expansion of the components of the first module set 70A and the like. Thus, it is possible to reduce stress caused by the component tolerance inside the single-phase cell unit 6 or the tolerance between the external connection bus provided outside the single-phase cell unit 6 and the single-phase cell unit 6, and contact thermal resistance.

<2.2.7 Conductive Spacer>

Figure 26:
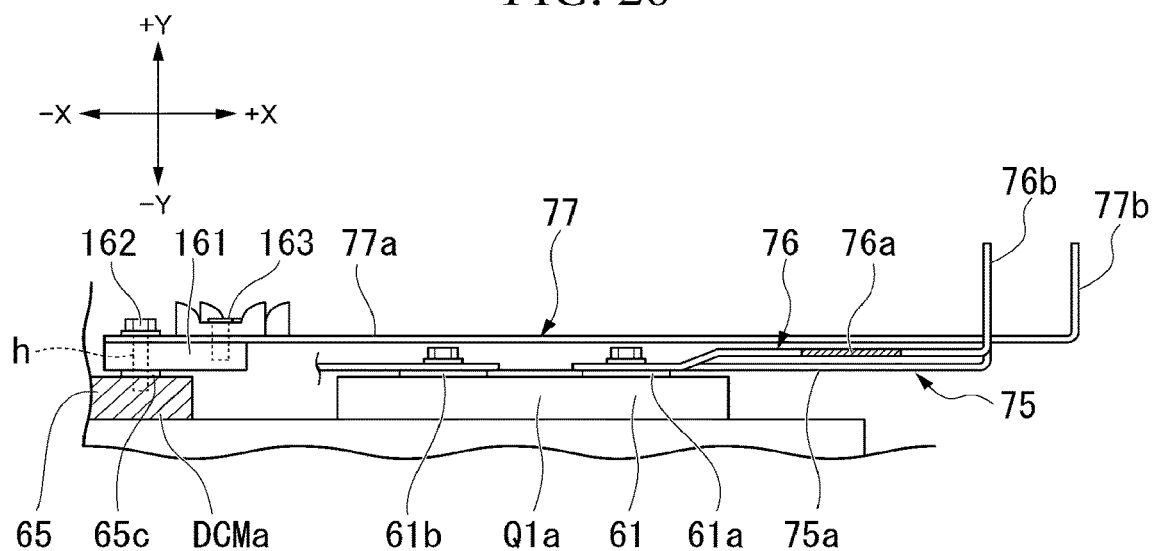
FIG. 26 is a sectional view of the converter shown in FIG. 8 taken along line F26-F26.

Next, the conductive spacer (a conductor component) 161 will be described. FIG. 26 is a cross-sectional view of converter 12 shown in FIG. 8 taken along line F26-F26. The neutral point bus 77 is disposed at a position away from a surface of the clamp diode module DCMa by a predetermined distance in the +Y direction to avoid interference with the positive electrode bus 75 and the negative electrode bus 76 and to secure the insulation distance with respect to the positive electrode bus 75 and the negative electrode bus 76. Therefore, a gap in the Y direction is present between the neutral point main body portion 77*a* of the neutral point bus 77 and a surface of the package 65 of the clamp diode module DCMa. In the embodiment, the conductive spacer 161 is interposed between the neutral point main body portion 77*a* of the neutral point bus 77 and the terminal 65*c* of the clamp diode module DCMa. The conductive spacer 161 is, for example, a rectangular parallelepiped metal block. The conductive spacer 161 has an insertion hole h through which a fastening member 162 for fixing the neutral point bus 77 and the terminal 65*c* of the clamp diode module DCMa passes. The neutral point bus 77 is electrically connected to the terminal 65*c* of the clamp diode module DCMa via the conductive spacer 161. A two-point fastening member 163 which suppresses rotation of the neutral point bus 77 on an X-Z plane may be attached in the conductive spacer 161. For example, the fastening member 163 fixes the neutral point bus 77 and the conductive spacer 161 at a position different from that of the fastening member 162 in the X direction.

A bending shape of the neutral point bus 77 due to press working can be reduced or eliminated by providing such a conductive spacer 161. Thus, manufacturing cost of the drive device 1 can be reduced. The conductive spacer 161 is not limited to the connection of the neutral point bus 77 but may be used for the connection of the positive electrode bus 75 or the negative electrode bus 76. Such a conductive spacer 161 is not limited to the power conversion device in which the element unit EU and the capacitor unit CU are divided and may be widely applied to various power conversion devices.

<2.2.8 Shielding Plate for Protecting Capacitor>

Figure 27:
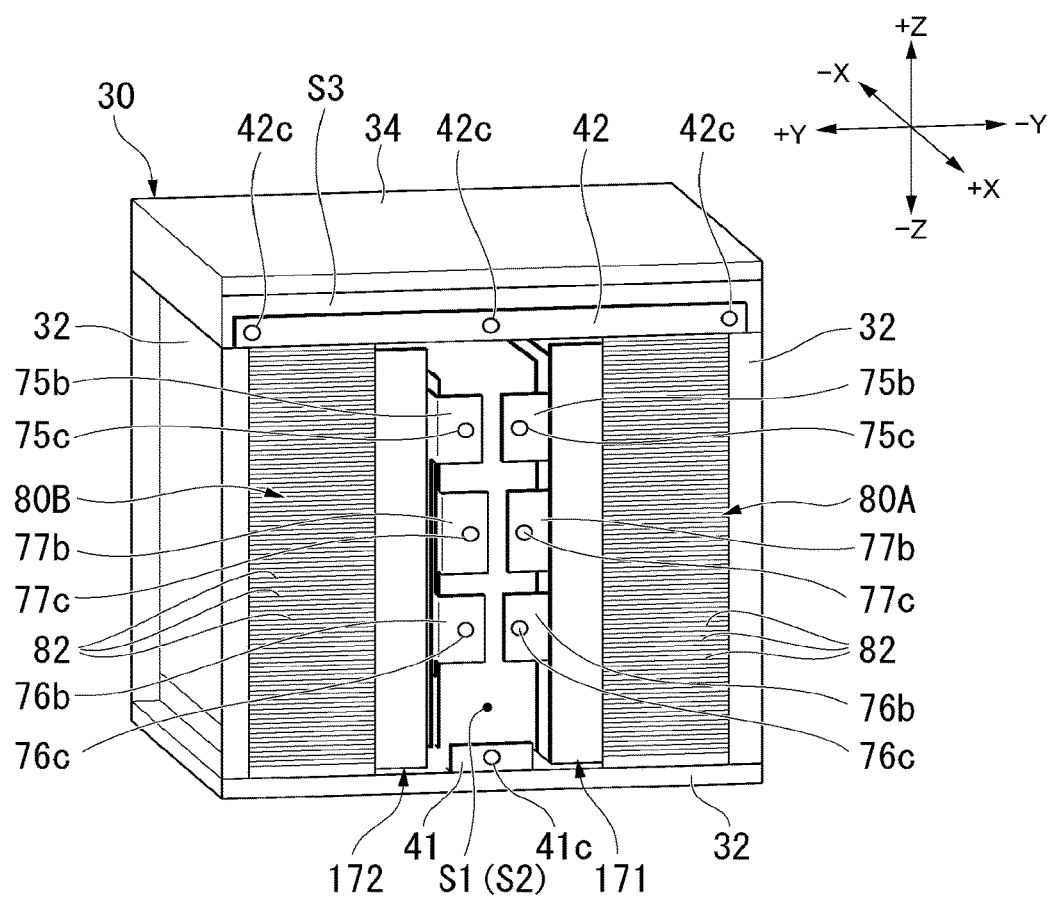
FIG. 27 is a perspective view showing a rear surface of the element module according to the embodiment.

Next, shielding plates 171 and 172 for protecting a capacitor will be described. FIG. 27 is a perspective view showing a rear surface of the element unit EU. The element unit EU includes a first shielding plate 171 and a second shielding plate 172. Each of the first shielding plate 171 and the second shielding plate 172 is formed in a plate shape along the Y direction and the Z direction. The first shielding plate 171 is disposed between the switching elements SW1*a* to SW4*a* and SW1*b* to SW4*b* of the first module set 70A and the capacitor unit CU and covers the switching elements SW1*a* to SW4*a* and SW1*b* to SW4*b* of the first module set 70A from the +X direction side. The second shielding plate 172 is disposed between the switching elements SW1*a* to SW4*a* and SW1*b* to SW4*b* of the second module set 70B and the capacitor unit CU and covers the switching elements SW1*a* to SW4*a* and SW1*b* to SW4*b* of the second module set 70B from the +X direction side.

When such shielding plates 171 and 172 are provided, the capacitor C can be protected from broken pieces even if any of the switching elements SW1*a* to SW4*a* and SW1*b* to SW4*b* is broken and the broken pieces are scattered. Thus, a repair burden of the drive device 1 can be reduced. In addition, it can be expected that the cooling air flowing through the gap (for example, the access space S1) inside the single-phase cell unit 6 is suppressed.

<2.2.9 Arrangement Layout of Element Module>

Figure 28:
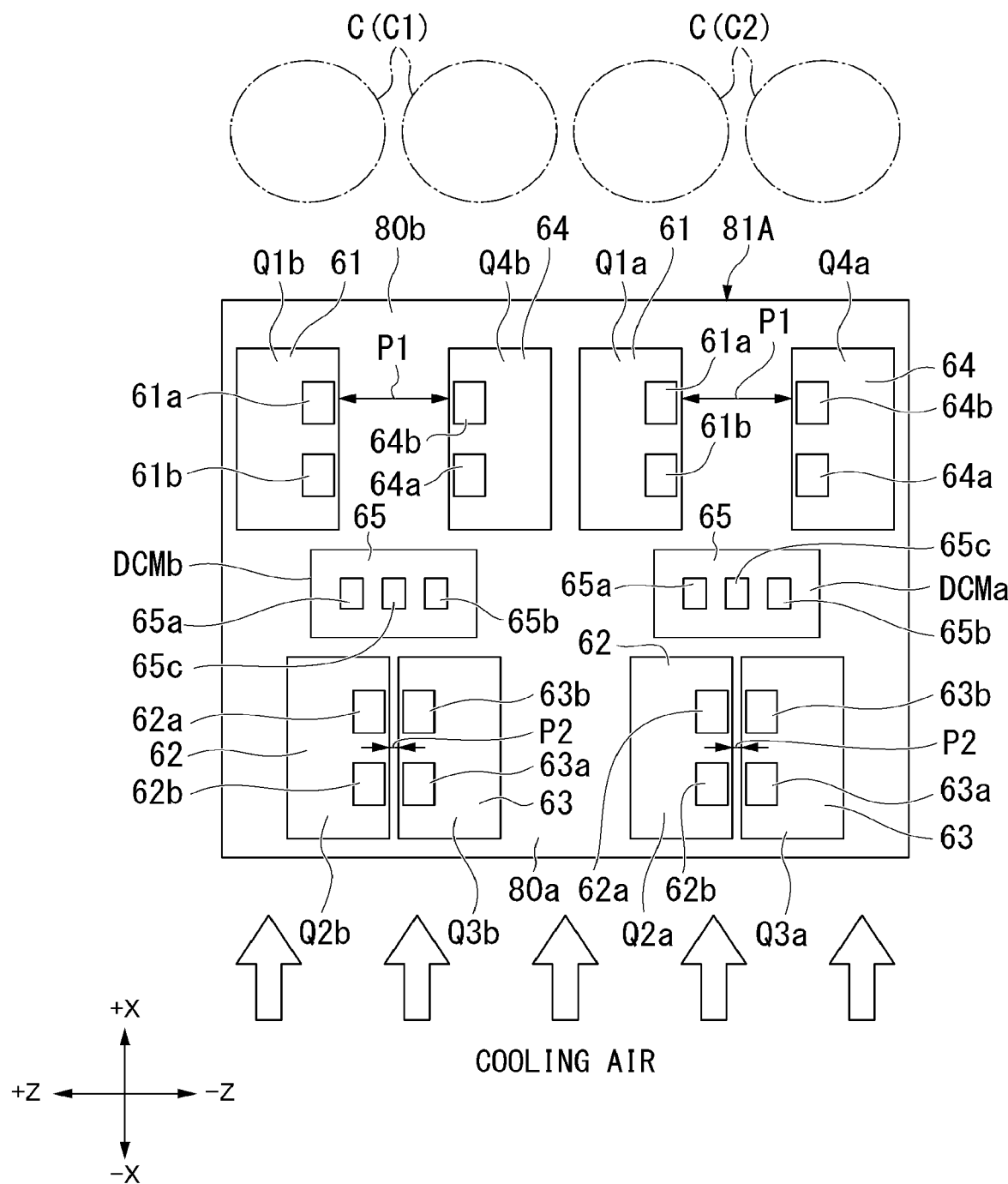
FIG. 28 is a plan view showing an element module and a first heat sink included in the first module set according to the embodiment.

Next, the arrangement layout of the element modules Q1*a*, Q2*a*, Q3*a*, Q4*a*, and DCMa will be described. FIG. 28 is a plan view showing the element modules Q1*a* to Q4*a*, DCMa, Q1*b* to Q4*b*, and DCMb and the first heat sink 80A included in the first module set 70A. The first heat sink 80A has the first end portion 80*a* located on the windward side and the second end portion 80*b* located on the leeward side.

In the embodiment, the drive device 1 is a drive device which can output a relatively large amount of power, for example. In such a device, each of the modules Q1*a*, Q2*a*, Q3*a*, Q4*a*, and DCMa has a relatively large size. In this case, it may be difficult to arrange the element modules Q1*a*, Q2*a*, Q3*a*, and Q4*a* included in one leg La in one direction (for example, the Z direction).

In the embodiment, the first inner element module Q2*a* and the second inner element module Q3*a* are disposed closer to the first end portion 80*b* of the first heat sink 80A than the second end portion 80*a* of the first heat sink 80A. The first inner element module Q2*a* and the second inner element module Q3*a* are arranged in a direction (for example, the Z direction) substantially orthogonal to a flow direction of the cooling air.

On the other hand, the first outer element module Q1*a* and the second outer element module Q4*a* are disposed closer to the second end portion 80*b* of the first heat sink 80A than the first end portion 80*a* of the first heat sink 80A. The first outer element module Q1*a* and the second outer element module Q4a are arranged in a direction (for example, the Z direction) substantially orthogonal to the flow direction of the cooling air.

Here, in the embodiment, an interval P1 between the first outer element module Q1a and the second outer element module Q4a is larger than an interval P2 between the first inner element module Q2a and the second inner element module Q3a. That is, the first outer element module Q1a and the second outer element module Q4a are disposed at positions shifted from the first inner element module Q2a and the second inner element module Q3a in a direction (for example, the Z direction) substantially orthogonal to the flow direction of the cooling air. In the embodiment, the first outer element module Q1a and the second outer element module Q4a are not completely shifted from the first inner element module Q2a and the second inner element module Q3a and partially overlap the first inner element module Q2a and the second inner element module Q3a in the flow direction (for example, the X direction) of the cooling air.

According to such an arrangement layout, it is difficult for at least some of the cooling air flowing through the gaps between the plurality of fins 82 of the first heat sink 80A in the vicinity of the first outer element module Q1a to receive the aftereffect of the heat from the first inner element module Q2a. Therefore, the heat dissipation of the first outer element module Q1a can be improved. Similarly, it is difficult for at least some of the cooling air flowing through the gaps between the plurality of fins 82 of the first heat sink 80A in the vicinity of the second outer element module Q4a to receive the aftereffect of the heat from the second inner element module Q3a. Therefore, the heat dissipation of the second outer element module Q4a can be improved. Such an arrangement layout is not limited to the power conversion device in which the element unit EU and the capacitor unit CU are divided and may be widely applied to various power conversion devices.

According to the drive device 1 constituted as described above, it is possible to reduce the repair burden of the drive device 1 and to reduce an installation burden of the drive device 1. That is, in a constitution in which a plurality of switching elements and a plurality of capacitors are integrated, when the switching element breaks down, replacement may be necessary for each unit including the capacitor. Further, when the device is installed, it is necessary to lift a unit including the plurality of switching elements and the plurality of capacitors and then to insert the unit into the housing 20. According to such an installation method, a work burden increases.

On the other hand, in the embodiment, the single-phase cell unit 6 is divided into the element unit EU and the capacitor unit CU. The first outer frame member 30 of the element unit EU and the second outer frame member 100 of the capacitor unit CU are separable. The positive electrode bus 75 of the element unit EU and the positive electrode bus 101 of the capacitor unit CU are removably connected. The negative electrode bus 76 of the element unit EU and the negative electrode bus 102 of the capacitor unit CU are removably connected. According to such a constitution, the element unit EU and the capacitor unit CU can be easily separated by removing the connection between the positive electrode buses 75 and 101 and the negative electrode buses 76 and 102. As a result, when the switching element breaks down, only the element unit EU can be replaced, and the capacitor unit CU can be used continuously. Thus, the repair burden of the drive device 1 can be reduced. Further, when the element unit EU and the capacitor unit CU are divided, the element unit EU and the capacitor unit CU can be individually lifted and then inserted into the housing 20 when the device is installed. Accordingly, a weight which needs to be lifted by one lifting operation can be reduced, and the work burden can be reduced.

In the embodiment, the housing 20 of the drive device 1 has the opening 21 through which the element unit EU and the capacitor unit CU can be inserted into the housing 20. The element unit EU is disposed closer to the opening 21 than the capacitor unit CU. According to such a constitution, when the element unit EU breaks down, only the element unit EU can be easily taken out from the housing 20 and then can be replaced while the capacitor unit CU remains in the housing 20. Thus, the work burden at the time of repair can be further reduced.

In the embodiment, the positive electrode bus 75 of the element unit EU has the positive electrode connection portion 75b bent in the +Y direction. The positive electrode bus 101 of the capacitor unit CU has a positive electrode connection portion 101b bent in the +Y direction. The positive electrode connection portion 75b of the element unit EU and the positive electrode connection portion 101b of the capacitor unit CU are removably connected by the fastening member 121. According to such a constitution, a attaching operation and a removing operation of the fastening member 121 can be easily performed from the front surface side of the housing 20. Thus, the work burden at the time of installation and repair of the device can be further reduced.

In the embodiment, the element unit EU includes the first end portion EUa and the second end portion EUb located on the side opposite to the first end portion EUa and faces the capacitor unit CU. The positive electrode connection portion 75b and the negative electrode connection portion 76b of the element unit EU are disposed at the second end portion EUb of the element unit EU. According to such a constitution, the element unit EU and the capacitor unit CU can be stably connected at a boundary portion between the element unit EU and the capacitor unit CU.

In the embodiment, the first heat sink 80A and the second heat sink 80B are disposed so that the first surface 81a of the first heat sink 80A and the first surface 81a of the second heat sink 80B face each other and the access space S1 is located therebetween. The positive electrode connection portion 75b and the negative electrode connection portion 76b of the element unit EU are exposed to the access space S1 between the first heat sink 80A and the second heat sink 80B. According to such a constitution, it is possible to more easily attach and remove the fastening members 121 and 122 from the front surface side of the housing 20 using the access space S1 between the first heat sink 80A and the second heat sink 80B. Therefore, the work burden at the time of installation and repair of the device can be further reduced.

In the embodiment, the positive electrode connection portion 75b of the element unit EU has the first insertion hole 75c through which the fastening member 121 passes. The first insertion hole 75c is exposed to the access space S1. The negative electrode connection portion 76b of the element unit EU has the second insertion hole 76c through which the fastening member 122 passes. The second insertion hole 76c is exposed to the access space S1. According to such a constitution, it is possible to more easily attach and remove the fastening members 121 and 122 from the front surface side of the housing 20 using the access space S1 between the first heat sink 80A and the second heat sink 80B. Therefore, the work burden at the time of installation and repair of the device can be further reduced.

In the embodiment, the positive electrode connection portion 75b and the negative electrode connection portion 76b of the first power conversion unit PUA and the positive electrode connection portion 75b and the negative electrode connection portion 76b of the second power conversion unit PUB are disposed to face each other. According to such a constitution, the wide access space S1 between the first heat sink 80A and the second heat sink 80B can be secured as compared to a case in which the positive electrode connection portion 75b and the negative electrode connection portion 76b of the first power conversion unit PUA and the positive electrode connection portion 75b and the negative electrode connection portion 76b of the second power conversion unit PUB are directed in directions away from each other. Thus, the work burden at the time of installation and repair of the device can be further reduced.

Here, a case in which the first power conversion unit and the second power change unit are not divided by a leg unit but are divided into a P pole side module and an N pole side module is considered. In this case, it is difficult to perform a necessary test such as a cutoff test in a single product of the first power conversion unit or a single product of the second power conversion unit. On the other hand, in the embodiment, the first power conversion unit PUA and the second power conversion unit PUB are divided by the leg unit. Therefore, the necessary test such as a cutoff test can be performed in the single product of the first power conversion unit PUA or the single product of the second power conversion unit PUB. Further, according to such a constitution of the embodiment, it is easy to make the constitutions of the first power conversion unit PUA and the second power conversion unit PUB the same. Thus, it is easy to share the buses or other components included in the first power conversion unit PUA and the second power conversion unit PUB.

In the embodiment, the element unit EU has the support body 82A which is attached to the first connection bus 73 and supports the gate wiring 83 in the access space S1. According to such a constitution, the gate wiring 83 is held in place by the support body 82A provided at the connection bus 73. Thus, the gate wiring 83 does not easily get in the way at the time of attaching and removing the fastening members 121, 122, 123 using the access space S1. Therefore, the work burden at the time of installation and repair of the device can be further reduced.

In the embodiment, the element unit EU includes the front surface cover 51 which is removably attached to the first outer frame member 30 and covers at least a part of the access space S1. According to such a constitution, even when the access space S1 is provided, the flow of the cooling air into the access space S1 can be suppressed. Therefore, the cooling air can be intensively supplied to the fins 82 of the first heat sink 80A and the fins 82 of the second heat sink 80B. Thus, the heat dissipation of the element unit EU can be improved.

In the embodiment, the intermediate fixing member 146 which fixes the capacitor unit CU to the shelf plate 23 at the boundary portion between the element unit EU and the capacitor unit CU is provided. According to such a constitution, even when the element unit EU and the capacitor unit CU are divided, the capacitor unit CU can be firmly fixed to the shelf plate 23. In the embodiment, the intermediate fixing member 146 includes the first portion 146a fixed to the capacitor unit CU and the second portion 146b fixed to the shelf plate 23. At least a part of the second portion 147b is disposed below the element unit EU. According to such a constitution, it is difficult for the intermediate fixing member 146 to obstruct the connection between the element unit EU and the capacitor unit CU. Thus, a size of the single phase cell unit 6 can be reduced.

Next, some modified examples will be described.

First Modified Example

Figure 29:
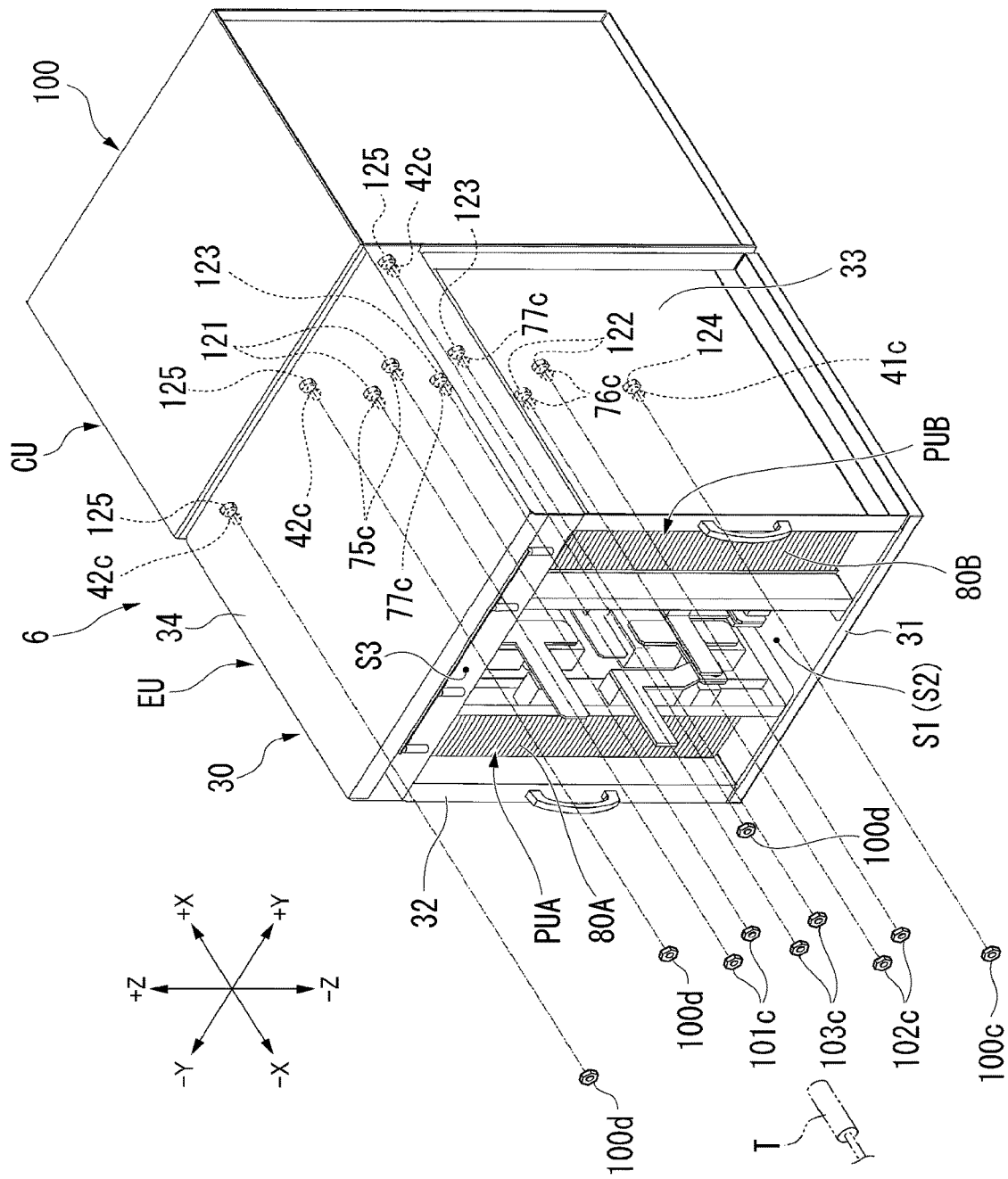
FIG. 29 is a perspective view showing a single-phase cell unit according to a first modified example.

FIG. 29 is a perspective view showing the single-phase cell unit 6 according to a first modified example. The modified example is different from the above-described embodiment in that the fastening members 121, 122, 123, 124, and 125 are provided in the capacitor unit CU and the element unit EU and the capacitor unit CU are fastened by attaching the fixing portions 101c, 102c, 103c, 100c, and 100d, such as nuts, from the +X direction. Constitutions other than those described below are the same as in the above-described embodiment.

More specifically, in the modified example, the fastening members 121, 122, 123, 124, 125 are, for example, screws or bolts and are fixed to the positive electrode connection portion 101b, the negative electrode connection portion 102b, and the neutral point connection portion 103b of the capacitor unit CU, a lower end portion of the second outer frame member 100 and an upper end portion of the second outer frame member 100 by welding or another method with screw shafts directed in the −X direction. The screw shafts of the fastening members 121, 122, 123, 124, and 125 respectively pass through the first insertion hole 75c of the positive electrode connection portion 75b, the second insertion hole 76c of the negative electrode connection portion 76b, and the third insertion holes 77c of the neutral point connection portion 77b, the fourth insertion hole 41c of the first connection plate 41, and the fifth insertion hole 42c of the second connection plate 42 of the element unit EU by placing the element unit EU adjacent to the capacitor unit CU from the −X direction side. In the modified example, the fastening members 121, 122, and 123 are exposed to the access space S1 (more specifically, the above-described space S2 in the space S1) in a state in which fixing portions 101c, 102c, and 103c described later are removed from the fastening members 121, 122, and 123.

For example, the fixing portions 101c, 102c, and 103c are engagement members such as nuts and are inserted into the access space S1 from the outside of the element unit EU in a state in which the element unit EU and the capacitor unit CU are arranged in the X direction and the front surface cover 51 is not attached to the first outer frame member 30. Then, the fixing portions 101c, 102c, and 103c are respectively engaged with and fixed to the fastening members 121, 122, and 123 through the access space S1. Thus, the positive electrode connection portion 75b of the element unit EU and the positive electrode connection portion 101b of the capacitor unit CU are removably connected by the fixing portion 101c, and the positive electrode bus 75 of the element unit EU and the positive electrode bus 101 of the capacitor unit CU are physically and electrically connected. Further, the negative electrode connection portion 76b of the element unit EU and the negative electrode connection portion 102b of the capacitor unit CU are removably connected by the fixing portion 102c, and the negative electrode bus 76 of the element unit EU and the negative electrode bus 102 of the capacitor unit CU are physically and electrically connected. Furthermore, the neutral point connection portion 77b of the element unit EU and the neutral point connection portion 103b of the capacitor unit CU are removably connected by the fixing portion 103c, and the neutral point bus 77 of the element unit EU and the neutral point bus 103 of the capacitor unit CU are physically and electrically connected. In the modified example, the fixing portion 101c which fixes the positive electrode bus 75 of the first module set 70A is an example of a "first fastening element." The fixing portion 101c which fixes the positive electrode bus 75 of the second module set 70B is an example of a "third fastening element." The fixing portion 102c which fixes the negative electrode bus 76 of the first module set 70A is an example of a "second fastening element." The fixing portion 102c which fixes the negative electrode bus 76 of the second module set 70B is an example of a "fourth fastening element."

For example, the fixing portion 100c is an engagement member such as a nut and is inserted into the access space S1 from the outside of the element unit EU in the state in which the element unit EU and the capacitor unit CU are arranged in the X direction and the front surface cover 51 is not attached to the first outer frame member 30. Then, the fixing portion 100c is engaged with and fixed to the fastening member 124 through the access space S1. Accordingly, the first outer frame member 30 and the second outer frame member 100 are removably connected by the fastening member 124.

For example, the fixing portion 100d is an engagement member such as a nut and is inserted into the accommodation space S3 from the outside of the element unit EU in the state in which the element unit EU and the capacitor unit CU are arranged in the X direction and the front surface cover 51 is not attached to the first outer frame member 30. Then, the fixing portion 100c is engaged with and fixed to the fastening member 125 through the accommodation space S3. Accordingly, the first outer frame member 30 and the second outer frame member 100 are removably connected by the fastening member 125.

Also with such a modified example, the same function as in the above-described embodiment can be realized.

Second Modified Example

Figure 30:
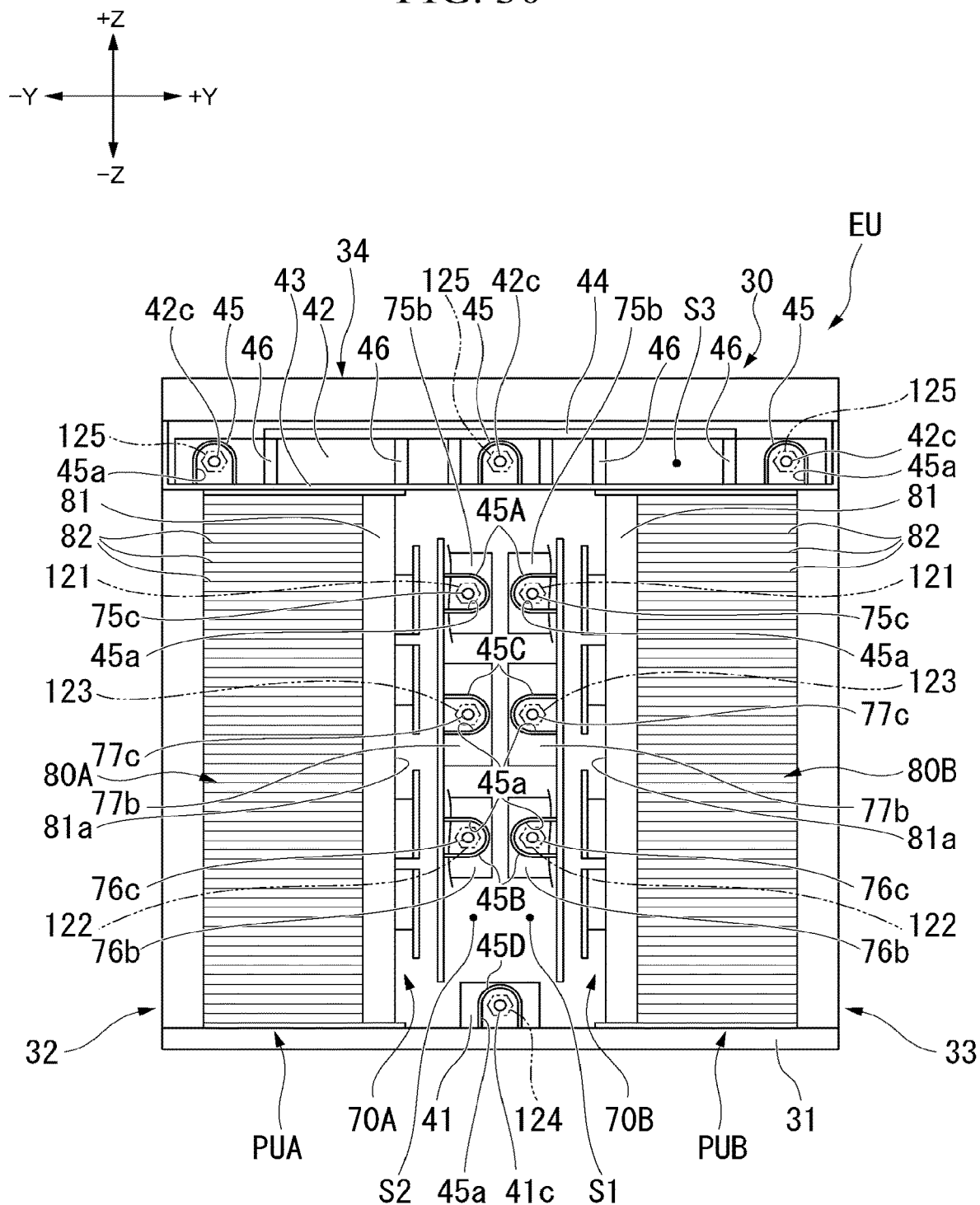
FIG. 30 is a front view showing an element unit according to a second modified example.

FIG. 30 is a front view showing the element unit EU according to a second modified example. The modified example is different from the above-described embodiment in that guide members 45A, 45B, 45C, and 45D respectively corresponding to the fastening members 121, 122, 123, and 124 are provided in addition to the guide member 45 corresponding to the fastening member 125. Constitutions other than those described below are the same as in the above-described embodiment.

More specifically, like the guide member 45, the guide members 45A, 45B, 45C, and 45D are formed of an insulating material and are disposed inside the element unit EU. Each of the guide members 45A, 45B, 45C, and 45D continuously extends from the vicinity of the first end portion EUa to the second end portion EU, for example. However, the guide members 45A, 45B, 45C, and 45D may be provided only in a partial section between the first end portion EUa and the second end portion EUb. For example, each of the guide members 45A, 45B, 45C, and 45D is fixed to the first connection bus 73, the second connection bus 74, the neutral point bus 77, the third connection bus 78, or the fourth connection bus by a fixing member (not shown) and is supported in a posture substantially parallel to the X direction. Each of the guide members 45A, 45B, 45C and 45D has an inner surface 45a (a guide surface) which extends in the X direction. The guide members 45A, 45B, 45C, and 45D may be formed in a U shape (or an arc shape) of which the −Y direction side or the +Y direction side is open or may have a tubular shape (a cylindrical shape or rectangular tube shape) or other shapes.

The guide member 45A is provided corresponding to the fastening member 121 and can guide at least one of the fastening member 121 and the tool T holding the fastening member 121 toward the fixing portion 101c of the capacitor unit CU (in other words, toward the first insertion hole 75c) inside the element unit EU. A distance between an end portion of the guide member 45A on the +X direction side and the positive electrode connection portion 75b is equal to or less than (for example, smaller than a larger dimension of a diameter of a screw shaft and a thickness of a head portion of the fastening member 121), for example, a distance at which the fastening member 121 does not fall off.

The guide member 45B is provided corresponding to the fastening member 122 and can guide at least one of the fastening member 122 and the tool T holding the fastening member 122 toward the fixing portion 102c of the capacitor unit CU (in other words, toward the second insertion hole 76c) inside the element unit EU. A distance between an end portion of the guide member 45B on the +X direction side and the negative electrode connection portion 76b is equal to or less than (for example, smaller than a larger dimension of a diameter of a screw shaft and a thickness of a head portion of the fastening member 122), for example, a distance at which the fastening member 122 does not fall off.

The guide member 45C is provided corresponding to the fastening member 123 and can guide at least one of the fastening member 123 and the tool T holding the fastening member 123 toward the fixing portion 103c of the capacitor unit CU (in other words, toward the third insertion hole 77c) inside the element unit EU. A distance between an end portion of the guide member 45C on the +X direction side and the neutral point connection portion 77b is equal to or less than (for example, smaller than a larger dimension of a diameter of a screw shaft and a thickness of a head portion of the fastening member 123), for example, a distance at which the fastening member 123 does not fall off.

The guide member 45D is provided corresponding to the fastening member 124 and can guide at least one of the fastening member 124 and the tool T holding the fastening member 124 toward the fixing portion 100c of the capacitor unit CU (in other words, toward the fourth insertion hole 41c) inside the element unit EU. A distance between an end portion of the guide member 45D on the +X direction side and the first connection plate 41 is equal to or less than (for example, smaller than a larger dimension of a diameter of a screw shaft and a thickness of a head portion of the fastening member 124), for example, a distance at which the fastening member 124 does not fall off.

According to such a constitution, the effects described regarding the guide member 45 in the above-described embodiment can also be obtained regarding the fastening members 121, 122, 123, and 124.

The power conversion devices according to one embodiment and some modified examples were explained. However, the embodiment and the modified examples are not limited to the above examples. For example, some of the above-described modified examples may be implemented in combination with each other. For example, when the above-described first modified example and second modified example are combined, the guide members 45A, 45B, 45C, 45D, and 45 may guide at least one of the fixing portions 101c, 102c, 103c, 100c, and 100d which are engagement members such as nuts and the tools T which hold the fixing portions 101c, 102c, 103c, 100c, and 100d, instead of the fastening members 121, 122, 123, 124, and 125. Further, the power conversion device is not limited to a three-level power conversion device and may be a two-level power conversion device. Furthermore, the first power conversion unit PUA and the second power conversion unit PUB may not be divided in a leg unit but may be divided into a P pole side unit and an N pole side unit. In addition, the positive electrode bus 101 may be electrically connected to at least one capacitor C1. The negative electrode bus 102 may be electrically connected to at least one capacitor C2.

According to at least one embodiment described above, the power conversion device includes the element unit and the capacitor unit. The element unit includes the first positive electrode bus, the first negative electrode bus, and the first outer frame member. The capacitor unit includes the second positive electrode bus, the second negative electrode bus, and the second outer frame member. The first outer frame member and the second outer frame member are separable from each other. The first positive electrode bus and the second positive electrode bus are removably connected. The first negative electrode bus and the second negative electrode bus are removably connected. According to such a constitution, the repair burden of the power conversion device can be reduced.

Although several embodiments of the present invention have been described, the embodiments are presented as examples and are not intended to limit the scope of the invention. The embodiments can be implemented in various other forms, and various omissions, replacements, and changes can be made without departing from the spirit of the invention. The embodiments and the modified examples thereof are included in the scope and gist of the invention and are also included in the invention described in the claims and the equivalents thereof.

REFERENCE SIGNS LIST

1 Drive device (power conversion device)
6 Single-phase cell unit
12 Converter (first power conversion module)
13 Inverter (second power conversion module)
20 Housing
21 Opening
27 Fan (air blowing portion)
30 First outer frame member
45, 45A, 45B, 45C, 45D Guide member
51 Front surface cover
54 Fuse
55 HCT
70A First module set
70B Second module set
75 Positive electrode bus (first positive electrode bus)
75*a* Positive electrode main body portion (first positive electrode main body portion)
75*b* Positive electrode connection portion (first positive electrode connection portion)
75*c* First insertion hole
76 Negative electrode bus (second negative electrode bus)
76*a* Negative electrode main body portion (first negative electrode main body portion)
76*b* Negative electrode connection portion (first negative electrode connection portion)
76*c* Second insertion hole
80A First heat sink
80B Second heat sink
82A to 82D Support body
83 Gate wiring
100 Second outer frame member
101 Positive electrode bus (second positive electrode bus)
101*a* Positive electrode main body portion (second positive electrode main body portion)
101*b* Positive electrode connection portion (second positive electrode connection portion)
102 Negative electrode bus (second negative electrode bus)
102*a* Negative electrode main body portion (second negative electrode main body portion)
102*b* Negative electrode connection portion (second negative electrode connection portion)
101*c*, 102*c*, 103*c*, 100*c*, 100*d* Fixing portion (fastening element)
121, 122, 123, 124, 125 Fastening member (fastening element)
146 Intermediate fixing member
146*a* First portion
146*b* Second portion
161 Conductive spacer
171, 172 Shielding plate
La, Lb Leg
SW1$a$ to SW4$a$, SW1$b$ to SW4$b$ Switching element
DF1$a$ to DF4$a$, DF1$b$ to DF4$b$ Free-wheeling diode
C Capacitor
S1 Access space

The invention claimed is:

1. A power conversion device comprising:
an element unit including a plurality of switching elements, a plurality of diodes, a first positive electrode bus, a first negative electrode bus, and a first outer frame member, the plurality of switching elements being electrically connected to each other in series, the plurality of diodes being electrically connected in inverse parallel to the plurality of switching elements, respectively, the first positive electrode bus being electrically connected to a switching element located at a first end in an electrical connection relationship among the plurality of switching elements, the first negative electrode bus being electrically connected to a switching element located at a second end on a side opposite to the first end in the electrical connection relationship among the plurality of switching elements, the first outer frame member accommodating the plurality of switching elements, the plurality of diodes, the first positive electrode bus, and the first negative electrode bus; and
a capacitor unit including a plurality of capacitors, a second positive electrode bus, a second negative electrode bus, and a second outer frame member, the second positive electrode bus being electrically connected to at least one capacitor included in the plurality of capacitors, the second negative electrode bus being electrically connected to at least one capacitor included in the plurality of capacitors, the second outer frame member accommodating the plurality of capacitors, the second positive electrode bus, and the second negative electrode bus,
wherein
the first outer frame member and the second outer frame member are separable from each other,
the first positive electrode bus and the second positive electrode bus are removably connected, and
the first negative electrode bus and the second negative electrode bus are removably connected.

2. The power conversion device according to claim 1, further comprising
a housing accommodating the element unit and the capacitor unit, wherein the housing has an opening through which the element unit and the capacitor unit are able to be inserted into the housing from an outside of the housing, and the element unit is disposed closer to the opening than the capacitor unit is.

3. The power conversion device according to claim 1, further comprising a first fastening element; and a second fastening element, wherein the first positive electrode bus includes a first positive electrode main body portion extending in a first direction from the element unit toward the capacitor unit, and a first positive electrode connection portion bent from the first positive electrode main body portion in a second direction substantially orthogonal to the first direction, the second positive electrode bus includes a second positive electrode main body portion extending in the first direction, and a second positive electrode connection portion bent from the second positive electrode main body portion, the second positive electrode connection portion being substantially parallel to the first positive electrode connection portion, and the first positive electrode connection portion and the second positive electrode connection portion are removably connected using the first fastening element, and the first negative electrode bus includes a first negative electrode main body portion extending in the first direction, and a first negative electrode connection portion bent from the first negative electrode main body portion in the second direction, the second negative electrode bus includes a second negative electrode main body portion extending in the first direction, and a second negative electrode connection portion bent from the second negative electrode main body portion, the second negative electrode connection portion being substantially parallel to the first negative electrode connection portion, and the first negative electrode connection portion and the second negative electrode connection portion are removably connected using the second fastening element.

4. The power conversion device according to claim 3, wherein the element unit includes a first end portion, and a second end portion which is located on a side opposite to the first end, the second end portion facing the capacitor unit, and the first positive electrode connection portion and the first negative electrode connection portion are located at the second end portion of the element unit.

5. The power conversion device according to claim 3, wherein the element unit further including:

a first heat sink including a first support surface and a plurality of fins on a side opposite to the first support surface, a second heat sink including a second support surface and a plurality of fins on a side opposite side to the second support surface, a first module set on the first support surface, the first module set including the plurality of switching elements, the plurality of diodes, the first positive electrode bus, and the first negative electrode bus, and a second module set on the second support surface, the first heat sink and the second heat sink are disposed so that the first support surface and the second support surface face each other with a space between the first heat sink and the second heat sink, and the first positive electrode connection portion and the first negative electrode connection portion are exposed in the space between the first heat sink and the second heat sink.

6. The power conversion device according to claim 5, wherein the first fastening element is a first fastening member which is a screw or a bolt, the second fastening element is a second fastening member which is a screw or a bolt, the first positive electrode connection portion has a first insertion hole through which the first fastening member passes, and the first insertion hole is exposed to the space in a state in which the first fastening member is removed from the first positive electrode connection portion, and the first negative electrode connection portion has a second insertion hole through which the second fastening member passes, and the second insertion hole is exposed to the space in a state in which the second fastening member is removed from the first negative electrode connection portion.

7. The power conversion device according to claim 5, wherein the first fastening element is a nut with which a first fastening member that is a screw or a bolt is engaged, the second fastening element is a nut with which a second fastening member that is a screw or a bolt is engaged, the first positive electrode connection portion has a first insertion hole through which the first fastening member passes, and the first fastening member is exposed to the space in a state in which the first fastening element is removed from the first fastening member, and the first negative electrode connection portion has a second insertion hole through which the second fastening member passes, and the second fastening member is exposed to the space in a state in which the second fastening element is removed from the second fastening member.

8. The power conversion device according to claim 5, further comprising a guide member disposed inside the element unit, the guide member including a guide surface that extends in the first direction, the guide member being capable of guiding at least one of the first fastening element and a tool that holds the first fastening element toward the capacitor unit.

9. The power conversion device according to claim 5, further comprising:

a third fastening element; and a fourth fastening element, wherein the plurality of switching elements are switching elements of a first leg, the second module set includes a plurality of switching elements of a second leg, a plurality of diodes, a third positive electrode bus, and a third negative electrode bus, the plurality of diodes being electrically connected in inverse parallel to the plurality of switching elements of the second leg, respectively, the third positive electrode bus being electrically connected to a switching element located at a first end in an electrical connection relationship among the plurality of switching elements of the second leg, the third negative electrode bus being electrically connected to a switching element located at a second end on a side opposite to the first end in the electrical connection relationship among the plurality of switching elements of the second leg, the capacitor unit includes a fourth positive electrode bus and a fourth negative electrode bus, the fourth positive electrode bus being electrically connected to at least one capacitor included in the plurality of capacitors, the fourth negative electrode bus being electrically connected to at least one capacitor included in the plurality of capacitors, the third positive electrode bus includes a third positive electrode main body portion extending in the first direction, and a third positive electrode connection portion bent in a third direction opposite to the second direction, the fourth positive electrode bus includes a fourth positive electrode main body portion extending in the first direction, and a fourth positive electrode connection portion bent from the fourth positive electrode main body portion, the fourth positive electrode connection portion being substantially parallel to the third positive electrode connection portion, and the third positive electrode connection portion and the fourth positive electrode connection portion are removably connected using the third fastening element, the third negative electrode bus includes a third negative electrode main body portion extending in the first direction, and a third negative electrode connection portion bent from the third negative electrode main body portion in the third direction, the fourth negative electrode bus includes a fourth negative electrode main body portion extending in the first direction, and a fourth negative electrode connection portion bent from the fourth negative electrode main body portion, the fourth negative electrode connection portion being substantially parallel to the third negative electrode connection portion, and the third negative electrode connection portion and the fourth negative electrode connection portion are removably connected using the fourth fastening element, and the third positive electrode connection portion and the third negative electrode connection portion are exposed in the space between the first heat sink and the second heat sink.

10. The power conversion device according to claim 5, wherein the first module set includes a first power conversion module, and a second power conversion module which converts DC power converted by the first power conversion module into AC power in a case in which the first power conversion module converts AC power into the DC power, the first power conversion module includes the plurality of switching elements and the plurality of diodes, and the plurality of switching elements are switching elements of a first leg, the second power conversion module includes a plurality of switching elements of a third leg, and a plurality of diodes electrically connected in inverse parallel to the plurality of switching elements of the third leg, respectively, the first positive electrode bus is electrically connected to a switching element located at a first end in an electrical connection relationship among the plurality of switching elements of the third leg in addition to the switching element located at the first end among the plurality of switching elements of the first leg, and the first negative electrode bus is electrically connected to a switching element located at a second end on a side opposite to the first end in the electrical connection relationship among the plurality of switching elements of the third leg in addition to the switching element located at the second end among the plurality of switching elements of the first leg.

11. The power conversion device according to claim 5, wherein the first module set includes a connection bus which electrically connects two switching elements included in the plurality of switching elements, and a support body which is attached to the connection bus and supports a gate wiring in the space between the first heat sink and the second heat sink.

12. The power conversion device according to claim 5, further comprising an air blower configured to generate a flow of air in a gap between the plurality of fins of the first heat sink and a gap between the plurality of fins of the second heat sink, wherein the element unit includes a cover removably attached to the first outer frame member, the cover including a first opening which faces the plurality of fins of the first heat sink, a second opening which faces the plurality of fins of the second heat sink, and a wind shielding portion which covers at least a part of the space between the first heat sink and the second heat sink.

13. The power conversion device according to claim 12, wherein the element unit includes a connection bus attached to an outer surface of the cover, and at least one of a fuse attached to the connection bus and a current detector through which the connection bus passes, and at least one of the current detector and the fuse is disposed outside the first outer frame member in a state in which the cover is attached to the first outer frame member.

14. The power conversion device according to claim 1, wherein the element unit further includes a shielding plate which is disposed between the plurality of switching elements and the capacitor unit and covers the plurality of switching elements.

15. The power conversion device according to claim 1, further comprising:

a housing including a shelf plate on which the element unit and the capacitor unit are placed, and a fixing member including a first portion and a second portion, the first portion being between the element unit and the capacitor unit and fixed to the capacitor unit, the second portion being fixed to the shelf plate, wherein at least a part of the second portion of the fixing member is disposed below the element unit.

16. The power conversion device according to claim 1, wherein the element unit further includes a package, a bus, and a conductive spacer, the package including at least one switching element among the plurality of switching elements and including a terminal provided on a surface of the package, the bus being disposed at an interval from the package, the conductive spacer being between the terminal of the package and the bus to electrically connect the terminal of the package to the bus.

17. The power conversion device according to claim 1, wherein
the element unit includes a neutral point clamp type power conversion module including the plurality of switching elements and the plurality of diodes,
the plurality of switching elements include a first switching element, a second switching element, a third switching element, and a fourth switching element electrically connected in series in this order,
the element unit includes further includes:
a first package which accommodates the first switching element,
a second package which accommodates the second switching element,
a third package which accommodates the third switching element,
a fourth package which accommodates the fourth switching element, and
a heat sink including a support surface on which the first package, the second package, the third package and the fourth package are mounted, and a plurality of fins on a side opposite to the support surface,
the heat sink includes a first end portion located on a windward side and a second end portion located on a leeward side,
the second package and the third package are disposed closer to the first end portion than the first package and the fourth package are, and
the first switching element and the fourth switching element are disposed at positions shifted in a direction substantially orthogonal to a direction from the first end portion toward the second end portion with respect to the second switching element and the third switching element, respectively.

18. The power conversion device according to claim 1, further comprising:
a fastening element used to connect the element unit to the capacitor unit, and
a guide member disposed inside the element unit, the guide member including a guide surface that extends in a direction from the element unit toward the capacitor unit, the guide member being capable of guiding at least one of the fastening element and a tool that holds the fastening element toward the capacitor unit inside the element unit.

* * * * *